US008859192B2

(12) United States Patent
Kato et al.

(10) Patent No.: US 8,859,192 B2
(45) Date of Patent: Oct. 14, 2014

(54) NEGATIVE PATTERN FORMING METHOD AND RESIST PATTERN

(71) Applicant: FUJIFILM Corporation, Tokyo (JP)

(72) Inventors: Keita Kato, Shizuoka (JP); Kana Fujii, Shizuoka (JP); Sou Kamimura, Shizuoka (JP); Kaoru Iwato, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/904,236

(22) Filed: May 29, 2013

(65) Prior Publication Data

US 2013/0266777 A1    Oct. 10, 2013

Related U.S. Application Data

(63) Continuation of application No. PCT/JP2011/078004, filed on Nov. 29, 2011.

(30) Foreign Application Priority Data

Nov. 30, 2010 (JP) ................................. 2010-267888
Nov. 7, 2011 (JP) ................................. 2011-243961

(51) Int. Cl.
*G03F 7/20* (2006.01)
*G03F 7/039* (2006.01)
*G03F 7/32* (2006.01)
*G03F 7/40* (2006.01)

(52) U.S. Cl.
CPC ... *G03F 7/20* (2013.01); *G03F 7/40* (2013.01); *G03F 7/0397* (2013.01); *G03F 7/325* (2013.01)
USPC ......................................................... 430/325

(58) Field of Classification Search
CPC ......... G03F 7/0392; G03F 7/325; G03F 7/40; G03F 7/0045; G03F 7/20
USPC ........................................... 430/311, 322, 325
See application file for complete search history.

(56) References Cited

U.S. PATENT DOCUMENTS

| 4,491,628 | A | 1/1985 | Ito et al. |
| 2001/0049073 | A1 | 12/2001 | Hada et al. |
| 2003/0008233 | A1 | 1/2003 | Hada et al. |
| 2004/0202966 | A1 | 10/2004 | Hada et al. |
| 2005/0065312 | A1 | 3/2005 | Hada et al. |
| 2008/0131820 | A1 | 6/2008 | Van Steenwinckel et al. |
| 2008/0187860 | A1* | 8/2008 | Tsubaki et al. ............ 430/270.1 |
| 2008/0261150 | A1 | 10/2008 | Tsubaki et al. |
| 2009/0142693 | A1 | 6/2009 | Iwashita |
| 2010/0239984 | A1 | 9/2010 | Tsubaki |
| 2010/0323305 | A1 | 12/2010 | Tsubaki et al. |
| 2011/0008545 | A1* | 1/2011 | Ito et al. ........................ 427/424 |

FOREIGN PATENT DOCUMENTS

| JP | 59-45439 A | 3/1984 |
| JP | 2000-206694 A | 7/2000 |
| JP | 2005-165096 A | 6/2005 |
| JP | 2008-522206 A | 6/2006 |
| JP | 2006-195050 A | 7/2006 |
| JP | 2006-259582 A | 9/2006 |
| JP | 2006-317803 A | 11/2006 |
| JP | 2008-197606 A | 8/2008 |
| JP | 2008-292975 A | 12/2008 |
| JP | 2008-310314 A | 12/2008 |

OTHER PUBLICATIONS

International Search Report (PCT/ISA/210), dated Jan. 10, 2012, issued by the International Searching Authority in counterpart International Patent Application No. PCT/JP2011/078004.
Written Opinion (PCT/ISA/237), dated Jan. 10, 2012, issued by the International Searching Authority in counterpart International Patent Application No. PCT/JP2011/078004.
Office Action issued by the Japanese Patent Office on Aug. 5, 2014; in corresponding Japanese Application No. 2011-243961.

* cited by examiner

*Primary Examiner* — Brittany Raymond
(74) *Attorney, Agent, or Firm* — Sughrue Mion, PLLC

(57) ABSTRACT

A negative pattern forming method, includes: (i) forming a film having a film thickness of 200 nm or more from a chemical amplification resist composition containing (A) a resin capable of increasing a polarity of the resin (A) by an action of an acid to decrease a solubility of the resin (A) for a developer containing one or more organic solvents, (B) a compound capable of generating an acid upon irradiation with an actinic ray or radiation, and (C) a solvent; (ii) exposing the film, so as to form an exposed film; and (iii) developing the exposed film with a developer containing one or more organic solvents.

9 Claims, No Drawings

NEGATIVE PATTERN FORMING METHOD AND RESIST PATTERN

CROSS REFERENCE TO RELATED APPLICATION

This is a continuation of International Application No. PCT/JP2011/078004 filed on Nov. 29, 2011, and claims priority from Japanese Patent Application No. 2010-267888, filed on Nov. 30, 2010, and Japanese Patent Application No. 2011-243961, filed on Nov. 7, 2011, the entire disclosures of which are incorporated therein by reference.

TECHNICAL FIELD

The present invention relates to a negative pattern forming method which is applicable to the process of producing a semiconductor such as IC or the production of a liquid crystal device or a circuit board such as thermal head and further to the lithography in other photo-fabrication processes, and a resist pattern formed by the negative pattern forming method. More specifically, the present invention relates to a negative pattern forming method suitable for exposure by an ArF exposure apparatus using a light source that emits far ultraviolet light at a wavelength of 300 nm or less, and a resist pattern formed by the negative pattern forming method.

BACKGROUND ART

Since the advent of a resist for KrF excimer laser (248 nm), an image forming method called chemical amplification is used as an image forming method for resists so as to compensate for sensitivity reduction due to light absorption. For example, the image forming method by positive chemical amplification is an image forming method of causing an acid generator to decompose in the exposed area upon exposure to an excimer laser, an electron beam, extreme-ultraviolet light or the like and produce an acid, converting an alkali-insoluble group into an alkali-soluble group by using the generated acid as a reaction catalyst in the baking after exposure (PES: Post-Exposure Baking), and removing the exposed area with an alkali developer.

As for the alkali developer used in the method above, various alkali developers have been proposed, but an aqueous alkali developer of 2.38 mass % TMAH (an aqueous tetramethylammonium hydroxide solution) is being used for general purposes.

On the other hand, as well as the currently predominant positive resist, a negative chemical amplification resist composition for use in the pattern formation by alkali development is also being developed (see, for example, JP-A-2006-317803 (the term "JP-A" as used herein means an "unexamined published Japanese patent application"), JP-A-2006-259582, JP-A-2006-195050 and JP-A-2000-206694). Because, in the manufacture of a semiconductor device or the like, patterns having various profiles such as line, trench and hole need to be formed, but some patterns are difficult to form by the current positive resist.

Also, a double developing technique as a double patterning technology for further raising the resolution is described in JP-A-2008-292975. When a resist film is exposed, the polarity of a resin in the resist composition becomes high in the high light intensity region and is kept low in the low light intensity region, and by making use of this property, the high exposure region of a specific resist film is dissolved with a high-polarity developer, whereas the low exposure region is dissolved with an organic solvent-containing developer, as a result, the medium exposure dose region remains without being dissolved/removed by the development and a line-and-space pattern having a pitch half the pitch of the exposure mask is formed.

Such a resist composition is often used by applying it on a bottom anti-reflection coating formed on a substrate. The bottom anti-reflection coating is used to prevent diffused reflection of an actinic ray on the substrate or reduce the effect of a standing wave generated due to incident light and reflected light, but in the microfabrication such as ion implantation, a bottom anti-reflection coating cannot be formed in some cases.

The technology of using a resist composition to block ion when implanting ion (charge injection), which is one step of the logic device fabrication or the like, plays an important role. For example, JP-A-2008-197606 discloses a technique where a resist film is formed using a radiation-sensitive composition for ion implantation, the composition containing a resin having two kinds of specific repeating units and containing an acid-dissociative group, and the resist film is exposed by an ArF excimer laser exposure apparatus and then developed with an aqueous alkali developer of 2.38 mass % TMAH, whereby excellent ion blocking property and excellent resistance to fracture of a resist are obtained, and even when a bottom anti-reflection coating is not formed on a substrate, a resist film having good sensitivity and resolution and ensuring a good pattern profile and a small pattern fluctuation range is formed.

In the case of using a resist composition for ion implantation, the resist composition is sometimes applied, exposed and developed on a substrate having previously formed thereon a pattern (hereinafter, referred to as a stepped substrate), and microfabrication on a stepped substrate is required. In the patterning used for ion implantation, one of tasks difficult to solve is the problem of scum on the substrate, which is generated after development due to bad removability of the film formed from the resist composition. In the case of developing the resist film with an aqueous alkali developer, the exposed area of the resist film is dissolved with the developer and therefore, for allowing no remaining of a resist film residue, sufficient light must be applied to the bottom of the resist film, but when such light is applied, the effect of reflection by the substrate becomes strong, and the resist film in the unexposed area, which should remain as a pattern, is exposed to the reflected light, causing a problem that the bottom of the pattern falls off. Accordingly, when the resist film is developed with an aqueous alkali developer, it is difficult to solve the problem of scum on the substrate while keeping a good pattern profile. Particularly, in the patterning on the stepped substrate above or the patterning without forming a bottom anti-reflection coating on a substrate, the effect of light reflection by the substrate becomes strong, and the problem of scum generated on the substrate after development is serious.

SUMMARY OF INVENTION

An object of the present invention is to solve the above-described problems and, for stably forming a highly precise fine pattern and thereby producing a high-integration and high-precision electronic device, provide a negative pattern forming method comprising forming a film with a film thickness of 200 nm or more from a chemical amplification resist composition, and exposing and developing the film, wherein the removability of the film is improved to reduce scum generated on the substrate after development and at the same time, an excellent performance is exhibited in terms of scum defect reduction and resolution; and a resist pattern formed by the negative pattern forming method.

The present invention includes the following configurations, and the above-described object of the present invention is attained by these configurations.

[1] A negative pattern forming method, comprising:

(i) forming a film having a film thickness of 200 nm or more from a chemical amplification resist composition containing (A) a resin capable of increasing a polarity of the resin (A) by an action of an acid to decrease a solubility of the resin (A) for a developer containing one or more organic solvents, (B) a compound capable of generating an acid upon irradiation with an actinic ray or radiation, and (C) a solvent;

(ii) exposing the film, so as to form an exposed film; and (iii) developing the exposed film with a developer containing one or more organic solvents.

[2] The negative pattern forming method as described in [1] above, wherein the film formed from the chemical amplification resist composition is formed on a substrate not coated with a bottom anti-reflection coating.

[3] The negative pattern forming method as described in [2] above, wherein the substrate not coated with a bottom anti-reflection coating is a stepped substrate having a step of 10 nm or more in height.

[4] The negative pattern forming method as described in any one of [1] to [3] above, wherein the resin (A) contains a repeating unit having a group capable of decomposing by an action of an acid to produce a polar group, in an amount of 40 mol % or more based on all repeating units in the resin (A).

[5] The negative pattern forming method as described in any one of [1] to [4] above, wherein the resin (A) has a weight average molecular weight of 5,000 or more.

[6] The negative pattern forming method as described in any one of [1] to [5] above, wherein the developer containing one or more organic solvents contains at least one kind of an organic solvent selected from the group consisting of a ketone-based solvent, an ester-based solvent, an alcohol-based solvent, an amide-based solvent and an ether-based solvent.

[7] The negative pattern forming method as described in any one of [1] to [6] above, further comprising:

(iv) performing rinsing by using a rinsing solution containing one or more organic solvents.

[8] The negative pattern forming method as described in any one of [1] to [7] above, wherein the exposing of the film in the step (ii) is exposure to an ArF excimer laser.

[9] The negative pattern forming method as described in any one of [1] to [8] above, wherein the film thickness of the film formed from the chemical amplification resist composition is 600 nm or less.

[10] A resist pattern formed by the negative pattern forming method described in any one of [1] to [9] above.

[11] A manufacturing method of an electronic device, comprising:

the negative pattern forming method described in any one of [1] to [9] above.

[12] An electronic device manufactured by the manufacturing method of an electronic device described in [11] above.

The present invention preferably further includes the following configurations.

[13] A chemical amplification resist composition used for the negative pattern forming method described in any one of [1] to [9] above.

[14] The chemical amplification resist composition as described in [13] above, which is used for ion implantation.

[15] A resist film formed from the chemical amplification resist composition described in [13] or [14] above.

[16] The negative pattern forming method as described in any one of [1] to [9] above, wherein a water content ratio as the entire developer in the developer containing one or more organic solvents is less than 10 mass %.

[17] The negative pattern forming method as described in any one of [1] to [9] and [16] above, wherein the developer containing one or more organic solvents contains substantially no water.

DESCRIPTION OF EMBODIMENTS

The mode for carrying out the present invention is described below.

In the description of the present invention, when a group (atomic group) is denoted without specifying whether substituted or unsubstituted, the group includes both a group having no substituent and a group having a substituent. For example, "an alkyl group" includes not only an alkyl group having no substituent (unsubstituted alkyl group) but also an alkyl group having a substituent (substituted alkyl group).

In the description of the present invention, the term "actinic ray" or "radiation" indicates, for example, a bright line spectrum of mercury lamp, a far ultraviolet ray typified by excimer laser, an extreme-ultraviolet ray (EUV light), an X-ray or an electron beam. Also, in the present invention, the "light" means an actinic ray or radiation.

Furthermore, in the description of the present invention, unless otherwise indicated, the "exposure" includes not only exposure to a mercury lamp, a far ultraviolet ray typified by excimer laser, an extreme-ultraviolet ray, an X-ray, EUV light or the like but also lithography with a particle beam such as electron beam and ion beam.

The negative pattern forming method of the present invention comprises:

(i) a step of forming a film having a film thickness of 200 nm or more from a chemical amplification resist composition containing (A) a resin capable of increasing the polarity by the action of an acid to decrease the solubility for a developer containing one or more organic solvents (hereafter also referred to as "an organic solvent-containing developer"), (B) a compound capable of generating an acid upon irradiation with an actinic ray or radiation, and (C) a solvent, (ii) a step of exposing the film, and (iii) a step of developing the exposed film with a developer containing one or more organic solvents.

According to the negative pattern forming method of the present invention, the polarity of the resin in the chemical amplification resist composition becomes high in the high light intensity region (that is, the exposed area) and is kept low in the low light intensity region (that is, the unexposed area), as a result, the exposed area of the resist film becomes insoluble or sparingly soluble for an organic solvent-containing developer and the unexposed area of the resist film can be dissolved with an organic solvent-containing developer. Accordingly, a negative pattern is formed by development using an organic solvent-containing developer.

The negative pattern forming method of the present invention is preferably a pattern forming method for ion implantation.

In the pattern forming method of forming a film having a film thickness of 200 nm or more from a chemical amplification resist composition and exposing and developing the film, the reason why the removability of the film is enhanced and not only the scum generated on the substrate after development is reduced but also the scum defect is successfully reduced by developing the film with an organic solvent-containing developer is not clearly known but is presumed as follows.

As described above, the development using an aqueous alkali developer is performed to dissolve the exposed area of the resist film with the developer and therefore, sufficient light must be applied even to the bottom of the resist film so as to allow for no remaining of the resist film residue. On the other hand, the development using an organic solvent-containing developer is performed to dissolve the unexposed area of the resist film with the developer and in this system, unlike the development using an aqueous alkali developer, even when sufficient light is not applied to the bottom of the resist film, the resist film in the unexposed area is dissolved with the developer and does not leave its residue. Furthermore, in the case of developing the resist film with an organic solvent-containing developer, for the reason above, sufficient light need not be applied even to the bottom of the resist film and therefore, the effect of light reflection by the substrate is small, making it possible to form a pattern with a good profile. Particularly, in the film thickness level where the film thickness is 200 nm or more, the effect above is outstanding. It is presumed that by developing the resist film with an organic solvent-containing developer, the scum on the substrate and the scum defect can be reduced.

The resist pattern formed by the pattern forming method of the present invention is excellent also in the resolution. The detailed reason therefor is not elucidated, but in the pattern forming method of exposing and developing a thick film with a film thickness as large as 200 nm or more, development with an organic solvent-containing developer is considered to contribute to enhancing the resolution.

In the negative pattern forming method of the present invention, the film thickness of the film formed from the chemical amplification resist composition is 200 nm or more, and this is specified so as to obtain sufficient ion blocking effect when applying the obtained pattern to ion implantation. In view of ion blocking effect, the film thickness of the film formed from the chemical amplification resist composition is preferably 250 nm or more, more preferably 300 nm or more. From the standpoint that a good performance is obtained in terms of removability, scum defect and resolution of the film, the film thickness of the film formed from the chemical amplification resist composition is preferably 600 nm or less, more preferably 500 nm or less.

In the application to ion implantation, a stepped substrate is sometimes used. In the negative pattern forming method of the present invention, for markedly bringing out the effects of the present invention, it is preferred to form a film with a film thickness of 200 nm or more by applying the chemical amplification resist composition on a stepped substrate. In the case of using a stepped substrate, the effect of reflection of light becomes stronger but in the system of developing the resist film with an organic solvent-containing developer, the unexposed area is dissolved with the developer as described above and therefore, the system is presumed to be less influenced by the reflection of light on the stepped substrate, compared with the system of developing the film with an aqueous alkali developer.

The stepped substrate is a substrate where at least one stepped shape is formed on a substrate.

In the case of applying the chemical amplification resist composition on the stepped substrate, the film thickness of the film formed from the chemical amplification resist composition means the height from the bottom on the stepped substrate to the top of the film formed. Accordingly, the coating on the stepped substrate may be sufficient if the height above is 200 nm or more.

The height from the bottom of the stepped substrate to the top of the stepped shape is generally smaller than the film thickness of the film formed from the chemical amplification resist composition and is preferably less than 200 nm. The height from the bottom of the stepped substrate to the top of the stepped shape is preferably 10 nm or more (that is, a stepped substrate having a step of 10 nm or more in height is preferred).

For example, in the case of application to ion implantation, a substrate obtained by patterning fins or gates on a flat substrate can be used as the stepped substrate. The film thickness of the film formed by applying the chemical amplification resist composition on a stepped substrate having formed thereon fins or gates means not the height from the top of the fin or gate to the top of the film formed but the height from the bottom on the stepped substrate to the top of the film formed.

As for the size (e.g., width, length, height), interval, structure, configuration and the like of fins and gates, those described, for example, in "Saisentan FinFET Process/Shuseki-ka Gijutsu (Advanced FinFET Process/Integration Technology" of Journal of IEICE, Vol. 91, No. 1, pp. 25-29 (2008), and "Fin-type Double-Gate Metal-Oxide-Semiconductor Field-Effect Transistors Fabricated by Orientation-Dependent Etching and Electron Beam Lithography" of Jpn. J. Appl. Phys., Vol. 42 (2003), pp. 4142-4146, Part 1, No. 6B, June 2003, may be applied.

The stepped substrate includes, for example, a stepped substrate where steps with a space of 20 to 200 nm, a pitch of 40 to 700 nm and a height of 10 to 200 nm are repeated at regular intervals.

In the negative pattern forming method of the present invention, the chemical amplification resist composition may be applied on a substrate not coated with a bottom anti-reflection coating (hereinafter, sometimes referred to as "BARC"). That is, the film formed from the chemical amplification resist composition may be formed on a substrate not coated with a bottom anti-reflection coating. Particularly, in the application to ion implantation, a bottom anti-reflection coating cannot be sometimes formed on the substrate such as stepped substrate, but according to the negative pattern forming method of the present invention, even in the case of forming the film on a substrate not coated with a bottom anti-reflection coating, good pattern formation can be achieved and thanks to no formation of BARC, the pattern forming process can be simplified. This is presumed to be possible because in the case of not using a bottom anti-reflection coating, the effect of diffused reflection of light by a substrate becomes stronger, however, in the system of developing the film with an organic solvent-containing developer, the unexposed area is dissolved with the developer as described above and the system less suffers the effect of diffused reflection of light resulting from no use of a bottom anti-reflection coating, compared with the system of developing the film with an aqueous alkali developer.

That is, in the negative pattern forming method of the present invention, the stepped substrate is preferably a substrate not coated with the bottom anti-reflection coating, more preferably a stepped substrate having a step of 10 nm or more in height.

In the negative pattern forming method of the present invention, the developer is preferably a developer containing at least one kind of an organic solvent selected from the group consisting of a ketone-based solvent, an ester-based solvent, an alcohol-based solvent, an amide-based solvent and an ether-based solvent.

The negative pattern forming method of the present invention preferably further comprises (iv) a step of performing rinsing by using a rinsing solution containing one or more organic solvents (hereafter also referred to as "an organic solvent-containing rinsing solution").

The rinsing solution is preferably a rinsing solution containing at least one kind of an organic solvent selected from the group consisting of a hydrocarbon-based solvent, a ketone-based solvent, an ester-based solvent, an alcohol-based solvent, an amide-based solvent and an ether-based solvent.

The negative pattern forming method of the present invention preferably comprises (v) a heating step after the exposure step (ii).

In the negative pattern forming method of the present invention, the exposure step (ii) may be performed a plurality of times.

In the negative pattern forming method of the present invention, the heating step (v) may be performed a plurality of times.

In the negative pattern forming method of the present invention, in view of resolution and wafer alignment, the exposure in the step (ii) is preferably exposure to an ArF excimer laser.

The resist film of the present invention is a film formed from the above-described chemical amplification resist composition, and this is a film formed, for example, by applying the resist composition on a base material.

The resist composition which can be used in the present invention is described below.

[1] (A) Resin

The resist composition of the present invention contains a resin capable of increasing the polarity by the action of an acid to decrease the solubility for an organic solvent-containing developer (hereinafter, sometimes referred to as a "resin (A)"). The resin (A) is preferably a resin having a property that the dissolution rate of the film formed of the resin (A) for butyl acetate at 25° C. is 18 nm/sec or more. At the time of developing a thick resist film as in the application to ion implantation, when the resist film does not have sufficient solubility for the developer, there arises a problem that the resist film exhibits bad removability and generates its residue to produce a scum defect and reduce the resolution. Thanks to the property that the dissolution rate of the film formed of the resin (A) for butyl acetate at 25° C. is 18 nm/sec or more, even in the case of exposing and developing a thick resist film having a film thickness of 200 nm or more, the resist film exhibits sufficient solubility for a developer containing an organic solvent typified by butyl acetate, so that the film can swiftly dissolve in the developer, the removability of the film can be enhanced, the scum defect can be reduced, and the resolution can be improved.

The above-described dissolution rate (18 nm/sec or more) can be achieved by appropriately controlling the conditions of the resin (A), for example, adjusting the content, in the resin (A), of the later-described repeating unit having a group capable of decomposing by the action of an acid to produce a polar group, or the weight average molecular weight (Mw) or glass transition temperature (Tg) of the resin (A). More specifically, the dissolution rate above (18 nm/sec or more) can be achieved by controlling the conditions of the resin (A), for example, increasing the content, in the resin (A) (sometimes referred to as the protection ratio of the resin (A)), of the later-described repeating unit having a group capable of decomposing by the action of an acid to produce a polar group, decreasing the weight average molecular weight (Mw) of the resin (A), or decreasing the content of a hydrophilic repeating unit in the resin (A). The numerical range of the protection ratio of the resin (A), the weight average molecular weight (Mw) of the resin (A), or the content of a hydrophilic repeating unit in the resin (A), where the dissolution rate above (18 nm/sec or more) can be achieved, include the range specified later for each of them.

The dissolution rate of the film formed of the resin (A) for butyl acetate at 25° C. is preferably adjusted in the range of 18 nm/sec or more according to the film thickness of the resist film formed. In general, as the film thickness of the resist film becomes larger, the dissolution rate is preferably increased, because the resist film swiftly dissolves in the developer, the removability of the film is enhanced, the scum defect is decreased, and the resolution is improved. Specifically, when the film thickness of the resist film is 200 nm or more, the dissolution rate is preferably 18 nm/sec or more; when the film thickness of the resist film is 250 nm or more, the dissolution rate is preferably 25 nm/sec or more; and when the film thickness of the resist film is 300 nm or more, the dissolution rate is preferably 20 nm/sec or more, more preferably 30 nm/sec or more, still more preferably 40 nm/sec or more, yet still more preferably 70 nm/sec or more.

The dissolution rate is generally 1,000 nm/sec or less, preferably 800 nm/sec or less, more preferably 500 nm/sec or less.

When the dissolution rate is in the range above, the resist film in the unexposed area exhibits sufficient solubility for the developer and at the same time, the solubility of the resist film in the exposed area for the developer is sufficiently lower than that of the resist film in the unexposed area.

The effect by virtue of the dissolution rate being in the range above is outstanding particularly when resist pattern formation (patterning) is performed on a stepped substrate.

The dissolution rate of the film formed of the resin (A) for butyl acetate at 25° C. can be determined by dissolving only the resin (A) in a solvent such as butyl acetate to make a composition having a solid content concentration of 3.5 mass %, applying the composition on a silicon wafer, a quartz substrate or the like to form a coating film (film thickness: 300 nm), dipping the obtained film in butyl acetate at room temperature (25° C.) for 100 seconds, and measuring the average dissolution rate (the rate of decrease in the film thickness) with use of a QCM (quartz crystal oscillator microbalance) sensor or the like. (In this specification, mass ratio is equal to weight ratio.)

In the present invention, the dissolution rate of the film formed of only the resin (A) for butyl acetate at 25° C. is used as an indication of solubility of the resist film for an organic solvent-containing developer. The reason therefor is because butyl acetate is a typical example of the organic solvent-containing developer and observation of the dissolution behavior for butyl acetate is effective in learning the dissolution behavior for the organic solvent-containing developer in general. Also, because, the resin (A) is the main component of the resist film and the solubility of the resin (A) exerts a dominating effect on the solubility of the resist film.

The resin (A) includes, for example, a resin having a group capable of decomposing by the action of an acid to produce a polar group (hereinafter, sometimes referred to as an "acid-decomposable group"), on either one or both of the main chain and the side chain of the resin (hereinafter, sometimes referred to as an "acid-decomposable resin"). Incidentally, this resin is also a resin capable of increasing the polarity by the action of an acid to increase the solubility for an alkali developer.

The acid-decomposable group preferably has a structure where a polar group is protected with a group capable of decomposing and leaving by the action of an acid.

The polar group is not particularly limited as long as it is a group capable of being sparingly solubilized or insolubilized in an organic solvent-containing developer, but examples thereof include a carboxyl group, a fluorinated alcohol group (preferably hexafluoroisopropanol group), an acidic group (a group capable of dissociating in an aqueous 2.38 mass % tetramethylammonium hydroxide solution which has been conventionally used as the developer for a resist) such as sulfonic acid group, and an alcoholic hydroxyl group.

The alcoholic hydroxyl group as used herein indicates a hydroxyl group bonded to a hydrocarbon group and is not particularly limited as long as it is except for a hydroxyl group directly bonded on an aromatic ring (phenolic hydroxyl group), but, more specifically, a hydroxyl group having a pKa of 12 to 20 is preferred.

The group preferred as the acid-decomposable group is a group where a hydrogen atom of the group above is replaced by a group capable of leaving by the action of an acid.

Examples of the group capable of leaving by the action of an acid include —C($R_{36}$)($R_{37}$)($R_{38}$), —C($R_{36}$)($R_{37}$)(O$R_{39}$) and —C($R_{01}$)($R_{02}$)(O$R_{39}$).

In the formulae, each of $R_{36}$ to $R_{39}$ independently represents an alkyl group, a cycloalkyl group, an aryl group, an aralkyl group or an alkenyl group. $R_{36}$ and $R_{37}$ may combine with each other to form a ring.

Each of $R_{01}$ and $R_{02}$ independently represents a hydrogen atom, an alkyl group, a cycloalkyl group, an aryl group, an aralkyl group or an alkenyl group.

The alkyl group of $R_{36}$ to $R_{39}$, $R_{01}$ and $R_{02}$ is preferably an alkyl group having a carbon number of 1 to 8, and examples thereof include a methyl group, an ethyl group, a propyl group, an n-butyl group, a sec-butyl group, a hexyl group and an octyl group.

The cycloalkyl group of $R_{36}$ to $R_{39}$, $R_{01}$ and $R_{02}$ may be monocyclic or polycyclic. The monocyclic cycloalkyl group is preferably a cycloalkyl group having a carbon number of 3 to 8, and examples thereof include a cyclopropyl group, a cyclobutyl group, a cyclopentyl group, a cyclohexyl group, and a cyclooctyl group. The polycyclic cycloalkyl group is preferably a cycloalkyl group having a carbon number of 6 to 20, and examples thereof include an adamantyl group, a norbornyl group, an isoboronyl group, a camphanyl group, a dicyclopentyl group, an α-pinel group, a tricyclodecanyl group, a tetracyclododecyl group, and an androstanyl group. Incidentally, a part of carbon atoms in the cycloalkyl group may be replaced by a heteroatom such as oxygen atom.

The aryl group of $R_{36}$ to $R_{39}$, $R_{01}$ and $R_{02}$ is preferably an aryl group having a carbon number of 6 to 10, and examples thereof include a phenyl group, a naphthyl group, and an anthryl group.

The aralkyl group of $R_{36}$ to $R_{39}$, $R_{01}$ and $R_{02}$ is preferably an aralkyl group having a carbon number of 7 to 12, and examples thereof include a benzyl group, a phenethyl group, and a naphthylmethyl group.

The alkenyl group of $R_{36}$ to $R_{39}$, $R_{01}$ and $R_{02}$ is preferably an alkenyl group having a carbon number of 2 to 8, and examples thereof include a vinyl group, an allyl group, a butenyl group and a cyclohexenyl group.

The ring formed by combining $R_{36}$ and $R_{37}$ is preferably a cycloalkyl group (monocyclic or polycyclic). The cycloalkyl group is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group. A monocyclic cycloalkyl group having a carbon number of 5 to 6 is more preferred, and a monocyclic cycloalkyl group having a carbon number of 5 is still more preferred.

The acid-decomposable group-containing repeating unit which can be contained in the resin (A) is preferably a repeating unit represented by the following formula (AI):

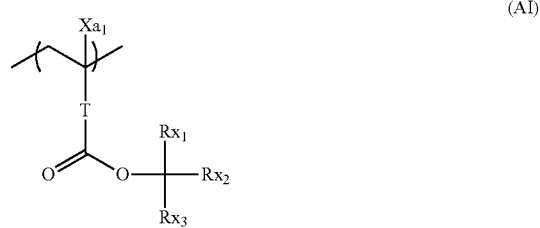

In formula (AI), $Xa_1$ represents a hydrogen atom, a methyl group which may have a substituent, or a group represented by —$CH_2$—$R_9$. $R_9$ represents a hydroxyl group or a monovalent organic group. Examples of the monovalent organic group include an alkyl group having a carbon number of 5 or less, and an acyl group having a carbon number of 5 or less. Of these, an alkyl group having a carbon number of 3 or less is preferred, and a methyl group is more preferred. $Xa_1$ is preferably a hydrogen atom, a methyl group, a trifluoromethyl group or a hydroxymethyl group.

T represents a single bond or a divalent linking group.

Each of $Rx_1$ to $Rx_3$ independently represents an alkyl group (linear or branched) or a cycloalkyl group (monocyclic or polycyclic).

Two members out of $Rx_1$ to $Rx_3$ may combine to form a cycloalkyl group (monocyclic or polycyclic).

Examples of the divalent linking group of T include an alkylene group, a —COO-Rt- group, a —O-Rt- group. In the formulae, Rt represents an alkylene group or a cycloalkylene group.

T is preferably a single bond or a —COO-Rt- group. Rt is preferably an alkylene group having a carbon number of 1 to 5, more preferably a —$CH_2$— group, —$(CH_2)_2$— group or a —$(CH_2)_3$— group.

The alkyl group of $Rx_1$ to $Rx_3$ is preferably an alkyl group having a carbon number of 1 to 4, such as methyl group, ethyl group, n-propyl group, isopropyl group, n-butyl group, isobutyl group and tert-butyl group.

The cycloalkyl group of $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The cycloalkyl group formed by combining two members out of $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group. Above all, a monocyclic cycloalkyl group having a carbon number of 5 to 6 is preferred.

An embodiment where $Rx_1$ is a methyl group or an ethyl group and $Rx_2$ and $Rx_3$ are combined to form the above-described cycloalkyl group is preferred.

Each of the groups above may have a substituent, and examples of the substituent include an alkyl group (having a carbon number of 1 to 4), a halogen atom, a hydroxyl group, an alkoxy group (having a carbon number of 1 to 4), a carboxyl group and an alkoxycarbonyl group (having a carbon number of 2 to 6). The carbon number is preferably 8 or less.

The resin (A) preferably contains an acid-decomposable group-containing repeating unit in an amount (in the case of containing a plurality of kinds of acid-decomposable group-containing repeating units, in a total amount) of 40 mol % or more, more preferably from 40 to 95 mol %, still more preferably from 40 to 90 mol %, based on all repeating units in the resin (A). By virtue of the resin (A) containing an acid-decomposable group-containing repeating unit in the range above, the solubility of the resist for an organic solvent-containing developer is improved.

As described above, the dissolution rate of 18 nm/sec or more can be suitably achieved by setting the content of the acid-decomposable group-containing repeating unit (in the case of containing a plurality of kinds of acid-decomposable group-containing repeating units, the total content thereof) in the resin (A) (protection ratio of the resin (A)) to be larger than the content of the acid-decomposable group-containing repeating unit in an acid-decomposable resin used for a normal resist composition. Specifically, the total content of the acid-decomposable group-containing repeating units in the resin (A) is preferably 45 mol % or more, more preferably 50 mol % or more, still more preferably 55 mol % or more, yet still more preferably 60 mol % or more, based on all repeating units in the resin (A).

Specific preferred examples of the repeating unit having an acid-decomposable group are illustrated below, but the present invention is not limited thereto.

In specific examples, each of Rx and $Xa_1$ represents a hydrogen atom, $CH_3$, $CF_3$ or $CH_2OH$, and each of Rxa and Rxb represents an alkyl group having a carbon number of 1 to 4. Z represents a substituent containing a polar group, and when a plurality of Zs are present, each Z may be the same as or different from every other Z. p represents 0 or a positive integer. Specific examples and preferred examples of Z are the same as specific examples and preferred examples of $R_{10}$ in formula (2-1) described later.

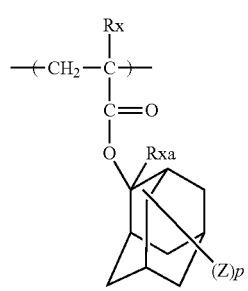

1

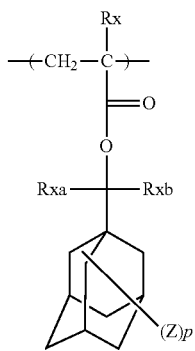

2

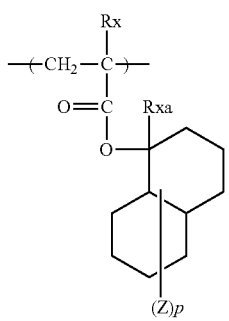

3

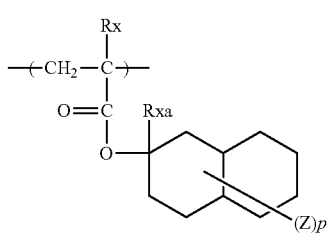

4

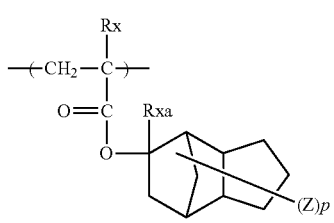

5

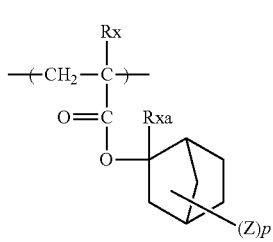

6

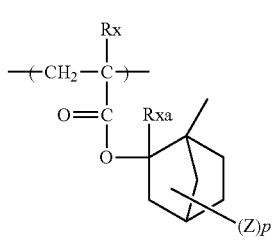

7

8
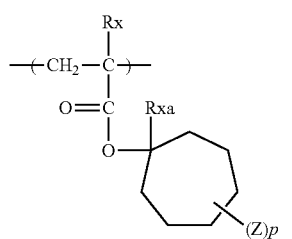
9
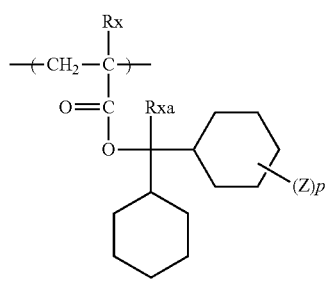
10
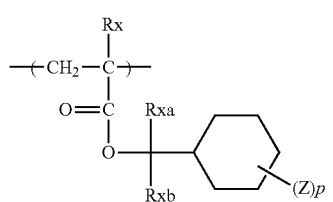
11
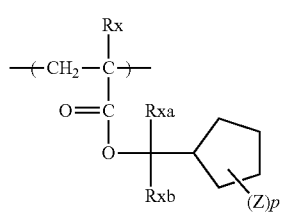
12
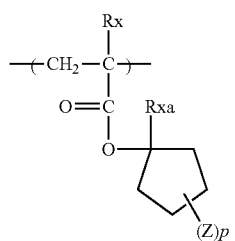
13
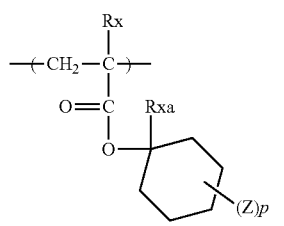
14
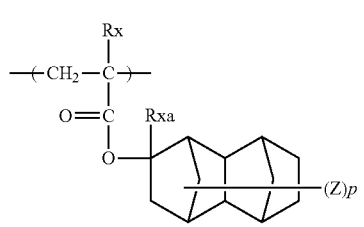
15
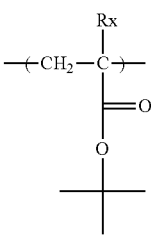
16
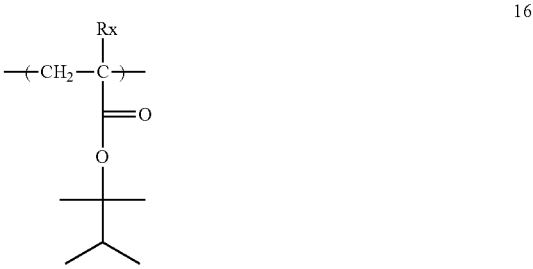
17
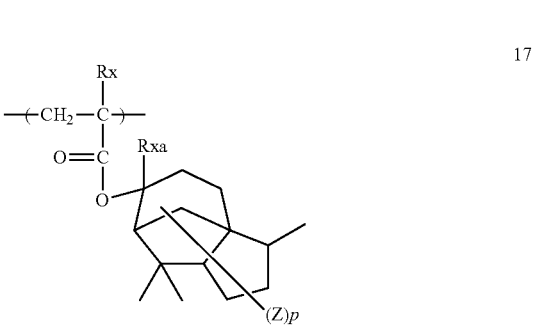
18
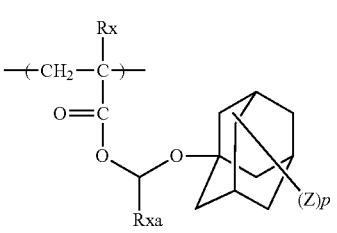
19
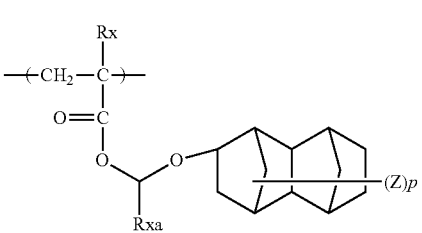
20
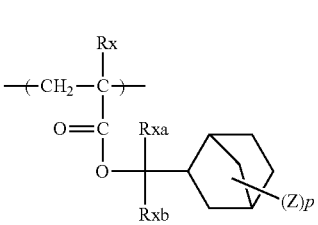

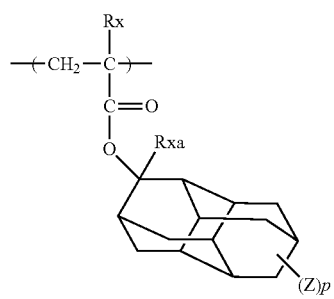
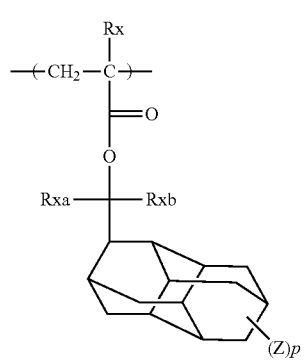
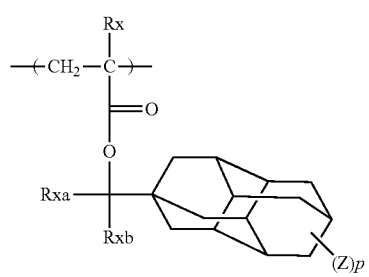
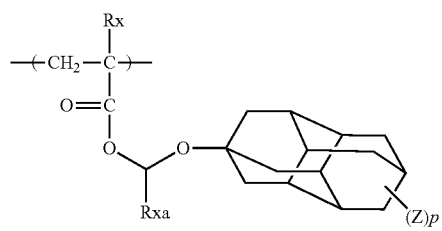
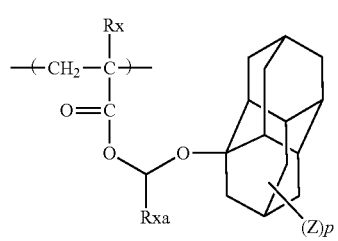
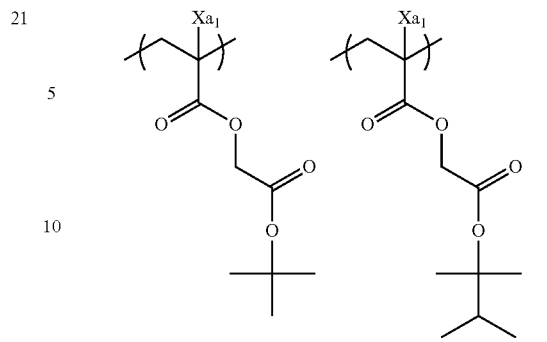
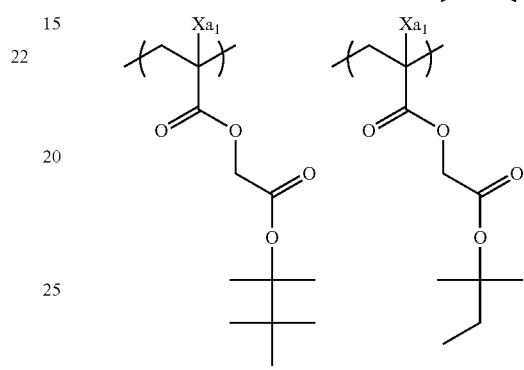
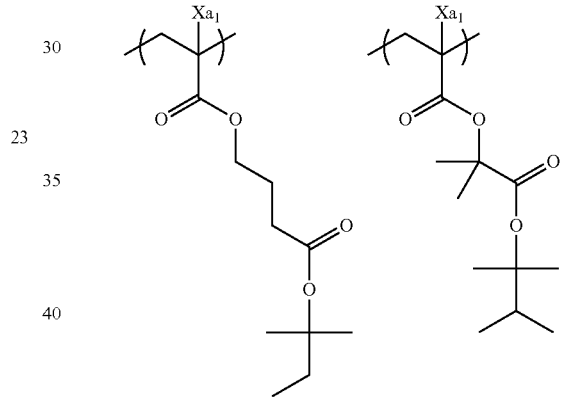
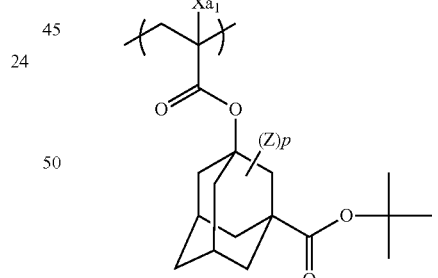
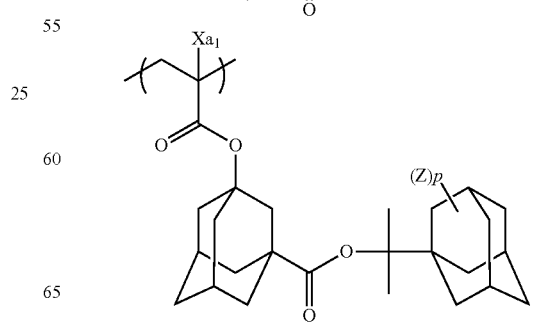

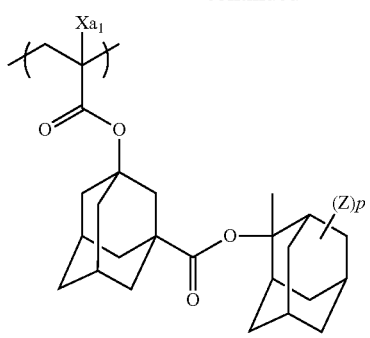
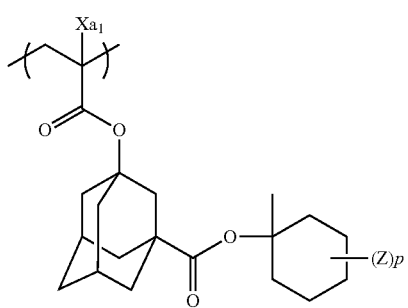
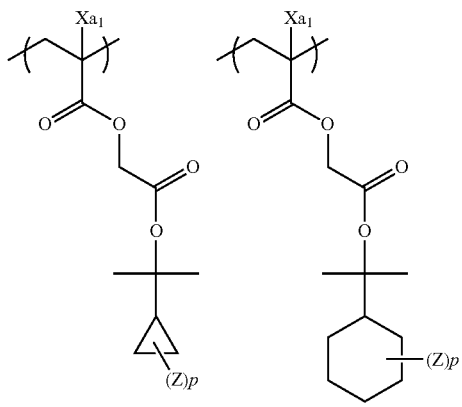
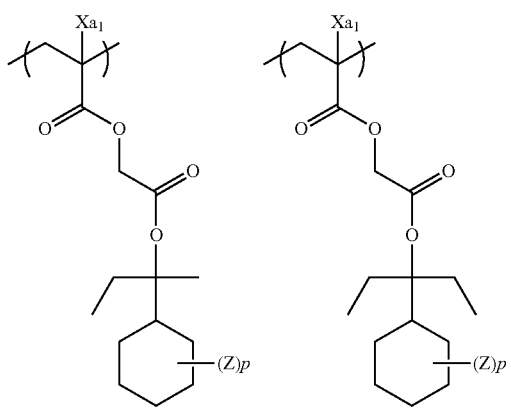
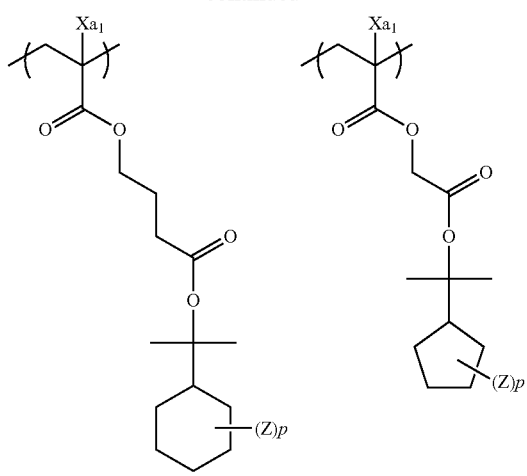
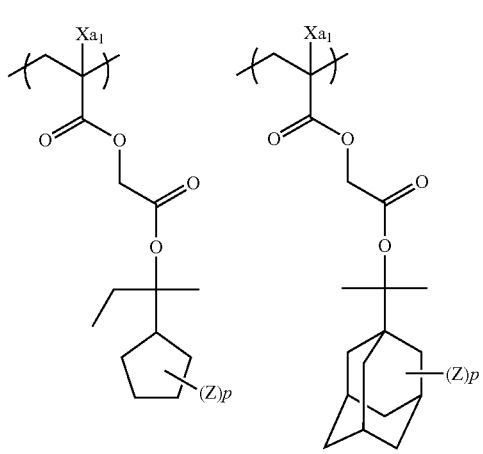
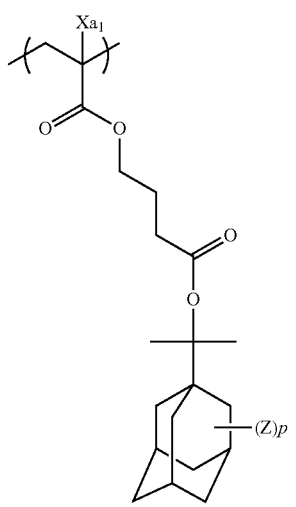

-continued
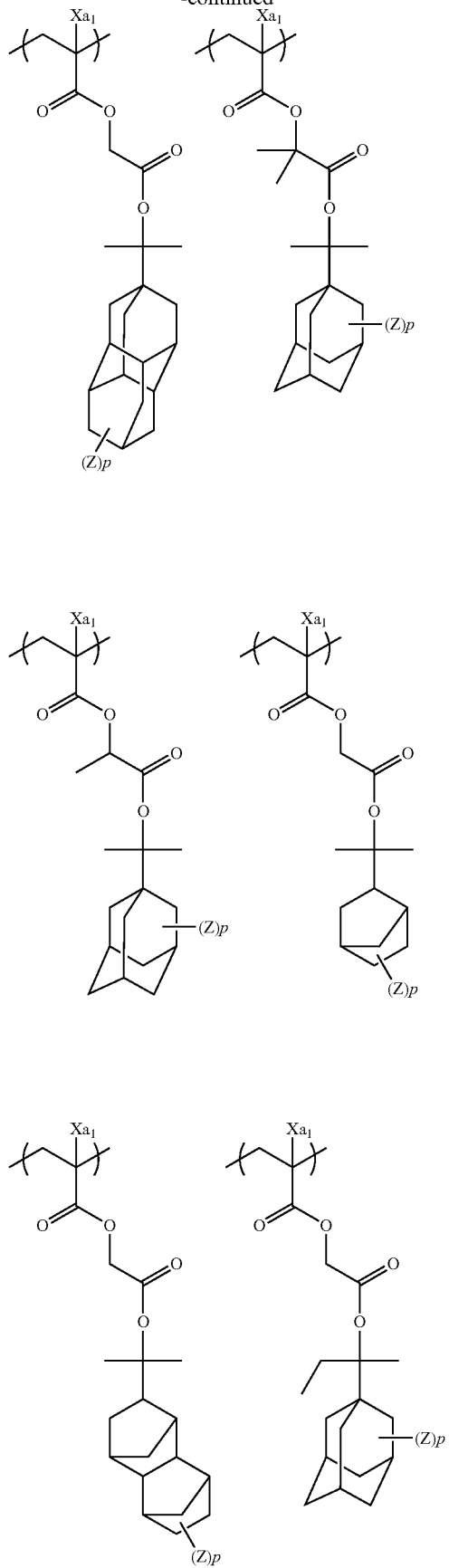
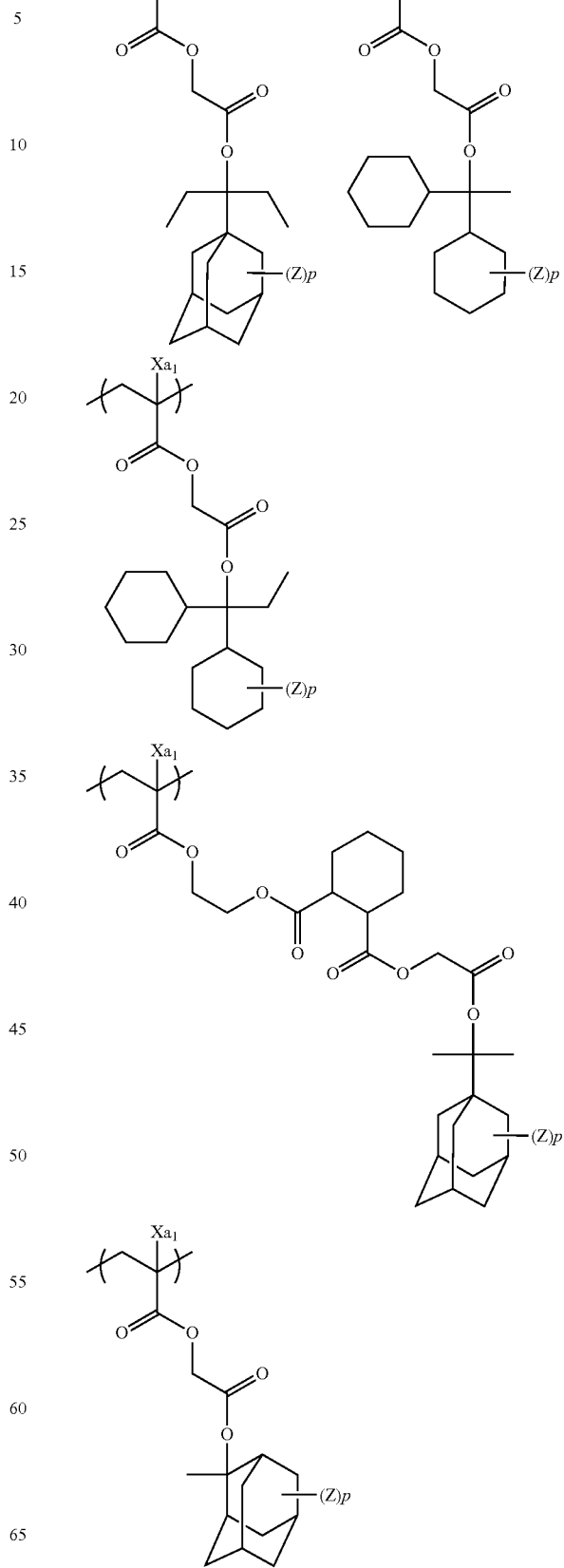

-continued
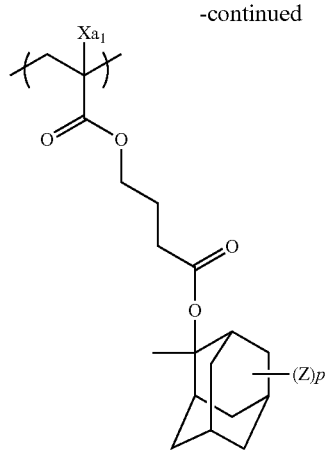
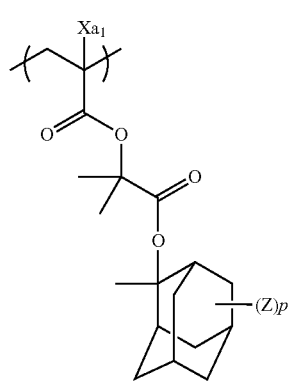
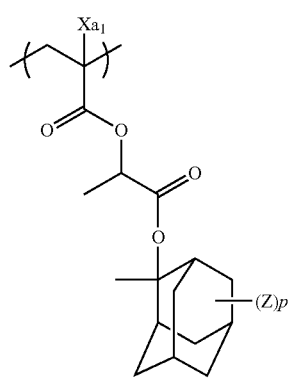
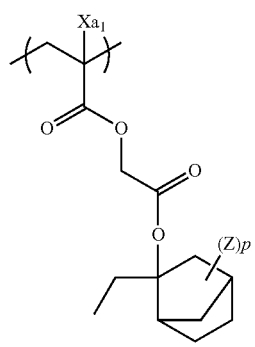
-continued
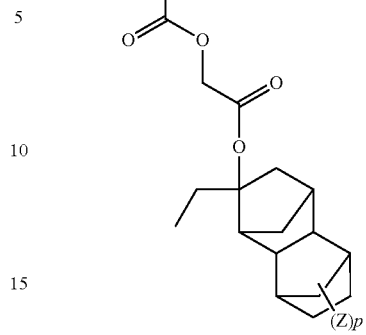
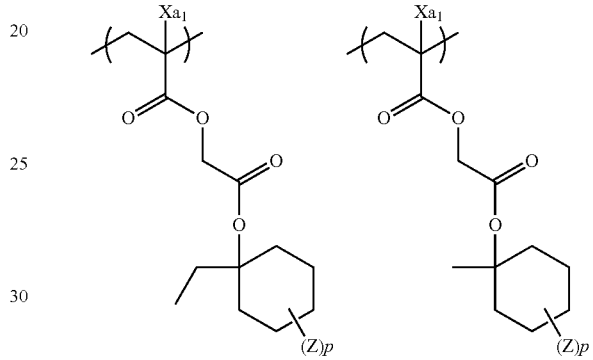
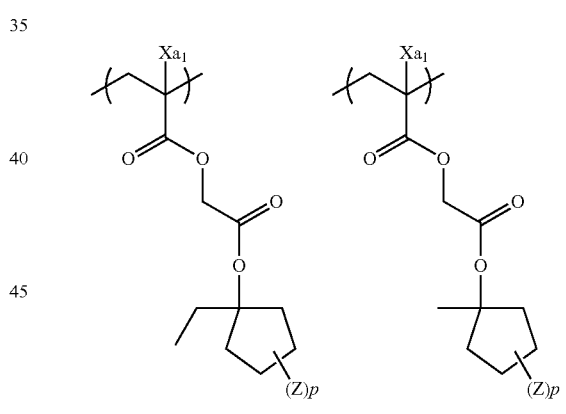
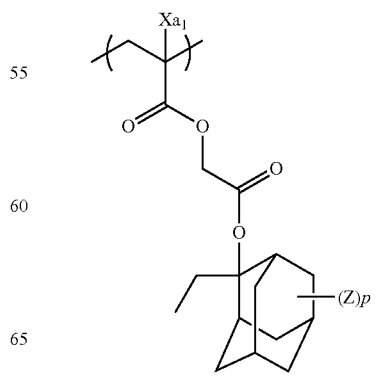

-continued

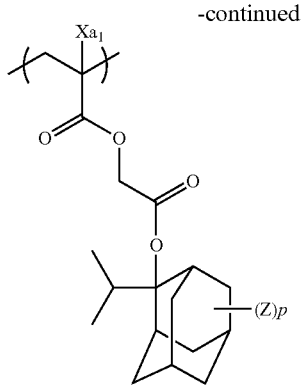

The resin (A) is more preferably a resin containing, as the repeating unit represented by formula (AI), at least either a repeating unit represented by formula (1) or a repeating unit represented by formula (2):

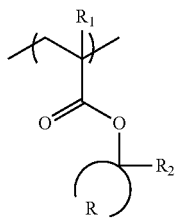
(1)

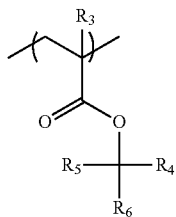
(2)

In formulae (1) and (2), each of $R_1$ and $R_3$ independently represents a hydrogen atom, a methyl group which may have a substituent, or a group represented by —$CH_2$—$R_9$. $R_9$ represents a hydroxyl group or a monovalent organic group.

Each of $R_2$, $R_4$, $R_5$ and $R_6$ independently represents an alkyl group or a cycloalkyl group.

R represents an atomic group necessary for forming an alicyclic structure together with the carbon atom.

Each of $R_1$ and $R_3$ is preferably a hydrogen atom, a methyl group, a trifluoromethyl group or a hydroxymethyl group. Specific examples and preferred examples of the monovalent organic group in $R_9$ are the same as those described for $R_9$ in formula (AI).

The alkyl group in $R_2$ may be linear or branched and may have a substituent.

The cycloalkyl group in $R_2$ may be monocyclic or polycyclic and may have a substituent.

$R_2$ is preferably an alkyl group, more preferably an alkyl group having a carbon number of 1 to 10, still more preferably an alkyl group having a carbon number of 1 to 5, and examples thereof include a methyl group and an ethyl group.

R represents an atomic group necessary for forming an alicyclic structure together with the carbon atom. The alicyclic structure formed by R together with the carbon atom is preferably a monocyclic alicyclic structure, and the carbon number thereof is preferably from 3 to 7, more preferably 5 or 6.

The alkyl group in $R_4$, $R_5$ and $R_6$ may be linear or branched and may have a substituent. The alkyl group is preferably an alkyl group having a carbon number of 1 to 4, such as methyl group, ethyl group, n-propyl group, isopropyl group, n-butyl group, isobutyl group and tert-butyl group.

The cycloalkyl group in $R_4$, $R_5$ and $R_6$ may be monocyclic or polycyclic and may have a substituent. The cycloalkyl group is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The repeating unit represented by formula (1) includes, for example, a repeating unit represented by the following formula (1-a):

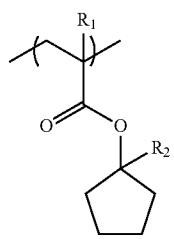
(1-a)

In the formula, $R_1$ and $R_2$ have the same meanings as those in formula (1).

The repeating unit represented by formula (2) is preferably a repeating unit represented by the following formula (2-1):

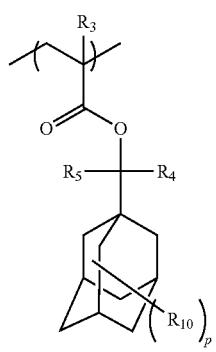
(2-1)

In formula (2-1), $R_3$ to $R_5$ have the same meanings as those in formula (2).

$R_{10}$ represents a polar group-containing substituent. In the case where a plurality of $R_{10}$s are present, each $R_{10}$ may be the same as or different from every other $R_{10}$. Examples of the polar group-containing substituent include a hydroxyl group, a cyano group, an amino group, an alkylamide group, a sulfonamide group itself, and a linear or branched alkyl group or cycloalkyl group having at least one of the groups above. An alkyl group having a hydroxyl group is preferred, and a branched alkyl group having a hydroxyl group is more preferred. The branched alkyl group is preferably an isopropyl group.

p represents an integer of 0 to 15. p is preferably an integer of 0 to 2, more preferably 0 or 1.

The resin (A) is more preferably a resin containing, as the repeating unit represented by formula (AI), at least either one of a repeating unit represented by formula (1) and a repeating unit represented by formula (2). In another embodiment, the resin is more preferably a resin containing, as the repeating unit represented by formula (AI), at least two kinds of repeating units represented by formula (1).

As for the repeating unit having an acid-decomposable group of the resin (A), one kind of a repeating unit may be used, or two or more kinds of repeating units may be used in combination. In the case of using the repeating units in combination, preferred examples of the combination are illustrated below. In the formulae below, each R independently represents a hydrogen atom or a methyl group.

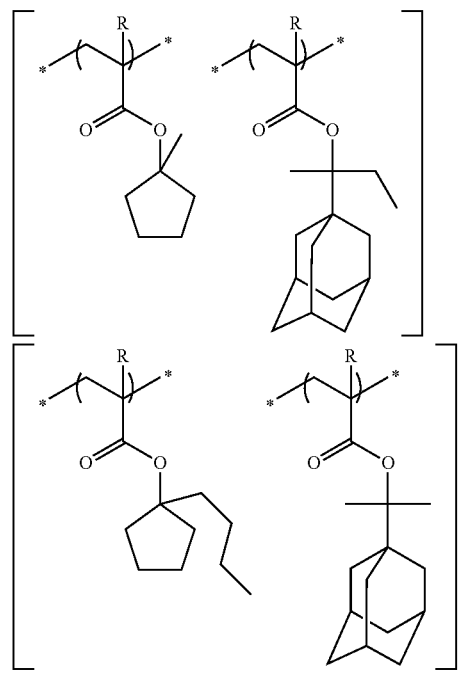

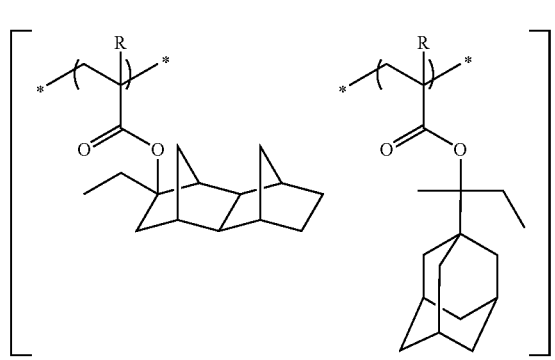

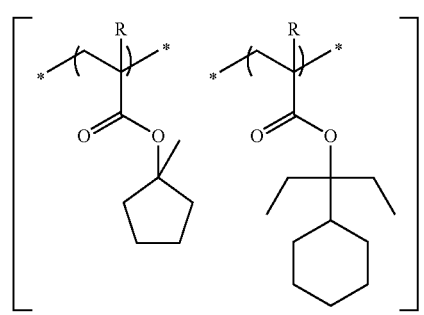

-continued

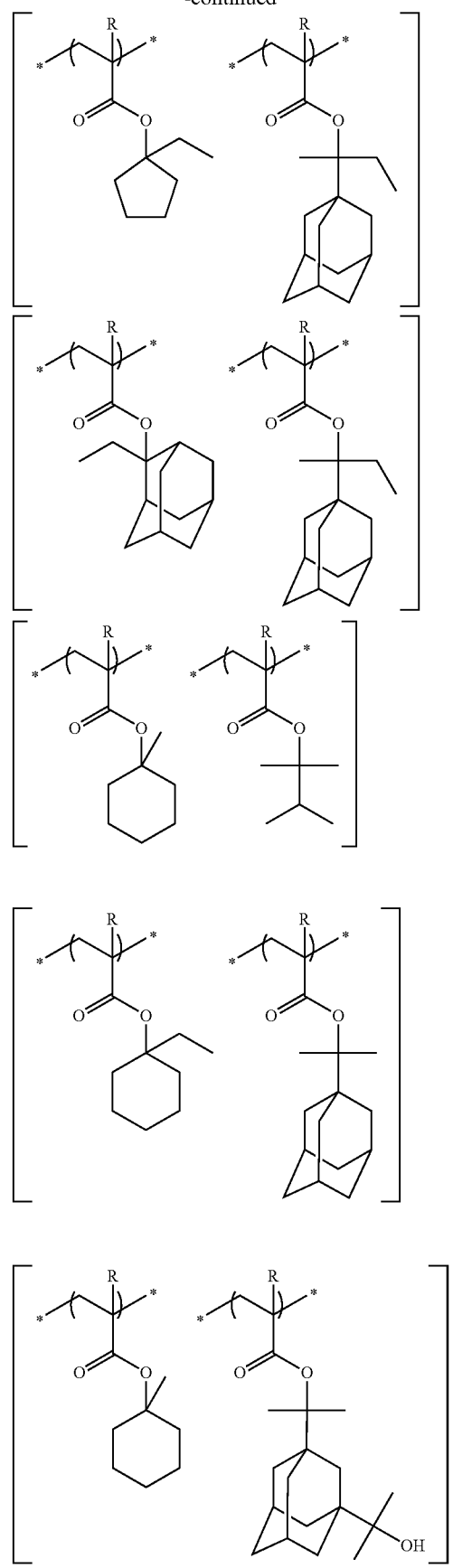

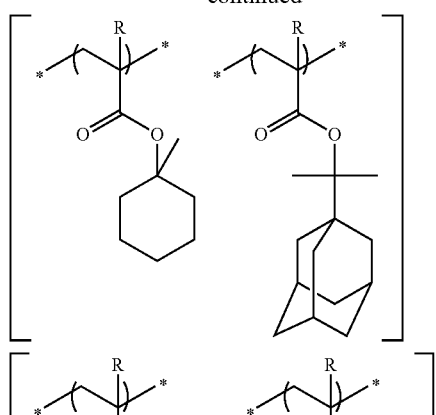
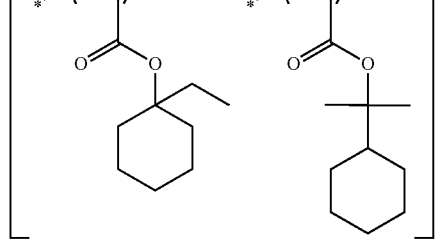
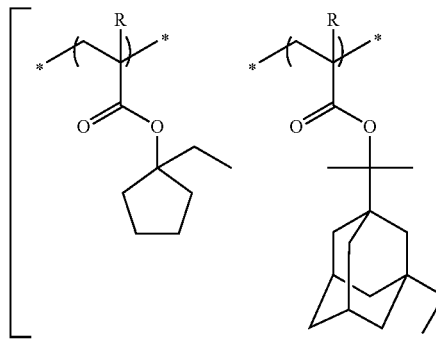
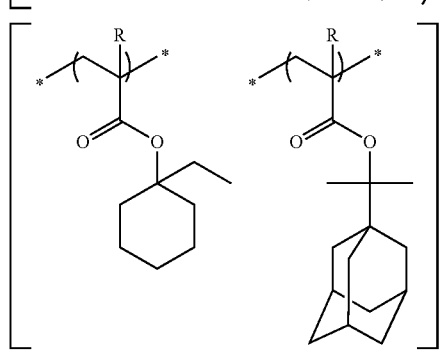
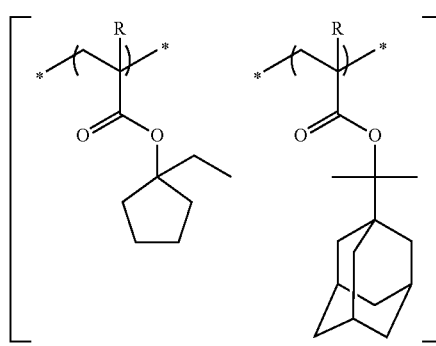
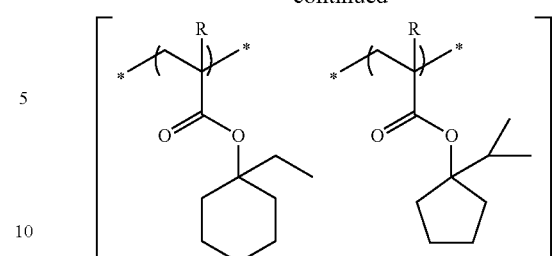
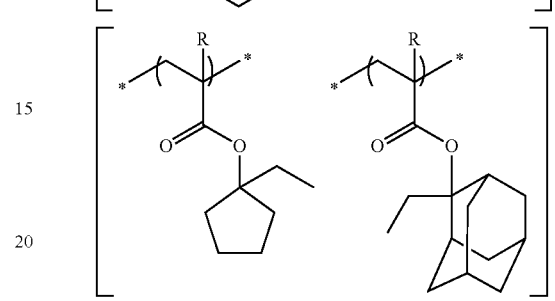
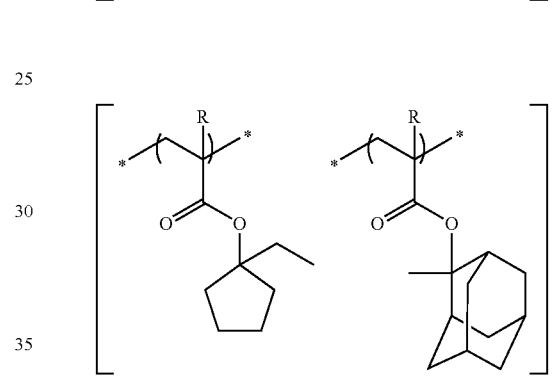
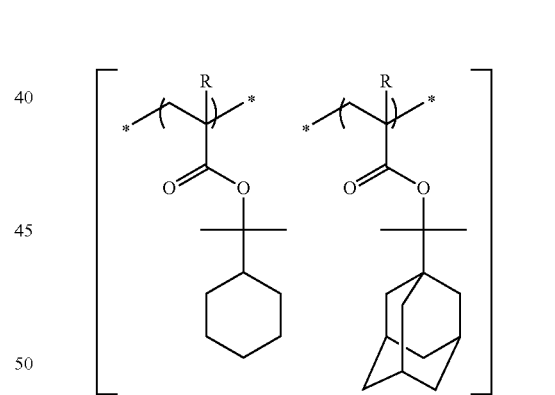
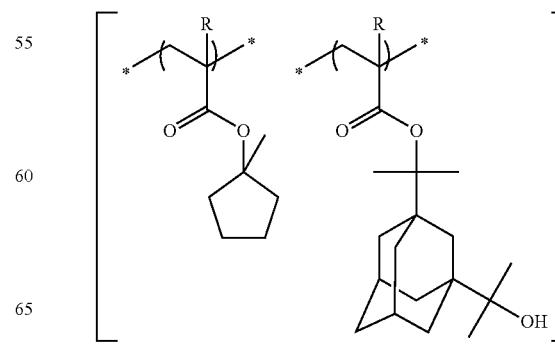

-continued

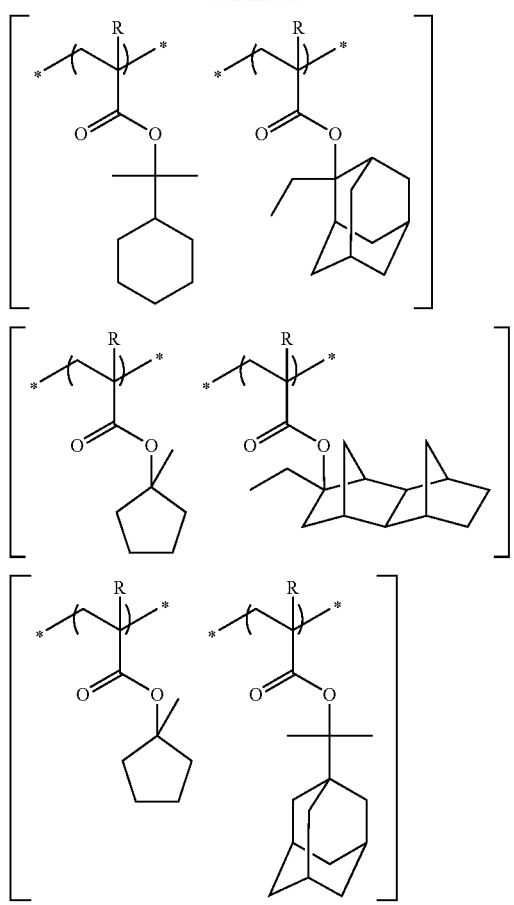

The structure where the polar group is the above-described alcoholic hydroxyl group and the alcoholic hydroxyl group is protected with a leaving group capable of decomposing and leaving by the action of an acid is preferably:

(i) a structure represented by the following formula (b), which decomposes by the action of an acid to generate one alcoholic hydroxyl group, or (ii) a structure represented by the following formula (c), which decomposes by the action of an acid to generate two or three alcoholic hydroxyl groups:

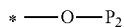  (b)

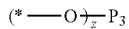  (c)

wherein $P_2$ represents a monovalent group capable of decomposing and leaving by the action of an acid, $P_3$ represents a z-valent group capable of decomposing and leaving by the action of an acid, z represents 2 or 3, and

* represents a bond to the main chain or side chain of the resin.

The structure (i) is preferably a group represented by the following formula (b-1), (b-2), (b-3) or (b-4), more preferably a group represented by the following formula (b-1):

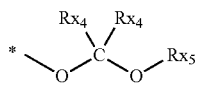  (b-1)

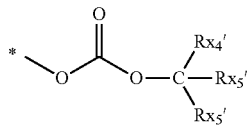  (b-2)

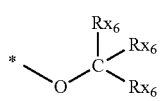  (b-3)

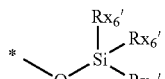  (b-4)

In formula (b-1), each $Rx_4$ independently represents a hydrogen atom or a monovalent organic group, and $Rx_4$s may combine with each other to form a ring.

$Rx_5$ represents a monovalent organic group, and one $Rx_4$ and $Rx_5$ may combine with each other to form a ring.

In formula (b-2), $Rx_4'$ represents a hydrogen atom or a monovalent organic group.

Each $Rx_5'$ independently represents a monovalent organic group, and $Rx_5'$'s may combine with each other to form a ring, or one $Rx_5'$ and $Rx_4'$ may combine with each other to form a ring.

In formula (b-3), each $Rx_6$ independently represents a hydrogen atom, an alkyl group, a cycloalkyl group, an aryl group, an alkenyl group or an alkynyl group, and two $Rx_6$s may combine with each other to form a ring, provided that when one or two members out of three $Rx_6$s are a hydrogen atom, at least one of the remaining $Rx_6$s represents an aryl group, an alkenyl group or an alkynyl group.

In formula (b-4), each $Rx_6'$ independently represents a monovalent organic group, and two $Rx_6$'s may combine with each other to form a ring.

In formulae (b-1) to (b-4), * represents a bond to the main chain or side chain of the resin.

As described above, each of $Rx_4$ and $Rx_4'$ independently represents a hydrogen atom or a monovalent organic group. Each of $Rx_4$ and $Rx_4'$ is independently preferably a hydrogen atom, an alkyl group or a cycloalkyl group, more preferably a hydrogen atom or an alkyl group.

The alkyl group of $Rx_4$ and $Rx_4'$ may be linear or branched. The carbon number of the alkyl group is preferably from 1 to 10, more preferably from 1 to 3. Examples of the alkyl group of $Rx_4$ and $Rx_4'$ include a methyl group, an ethyl group, an n-propyl group, an isopropyl group and an n-butyl group.

The cycloalkyl group of $Rx_4$ and $Rx_4'$ may be monocyclic or polycyclic. The carbon number of the cycloalkyl group is preferably 3 to 10, more preferably 4 to 8. Examples of the cycloalkyl group of $Rx_4$ and $Rx_4'$ include a cyclopropyl group, a cyclobutyl group, a cyclopentyl group, a cyclohexyl group, a norbornyl group, and an adamantyl group.

In formula (b-1), at least one $Rx_4$ is preferably a monovalent organic group. When such a configuration is employed, high sensitivity can be achieved in particular.

The alkyl group and cycloalkyl group as $Rx_4$ and $Rx_4'$ may further have a substituent, and examples of the substituent include an alkyl group (having a carbon number of 1 to 4), a halogen atom, a hydroxyl group, an alkoxy group (having a carbon number of 1 to 4), a carboxyl group, an alkoxycarbonyl group (having a carbon number of 2 to 6), and an aryl group (having a carbon number of 6 to 10). The carbon number is preferably 8 or less.

As described above, each of $Rx_5$ and $Rx_5'$ independently represents a monovalent organic group. Each of $Rx_5$ and $Rx_5'$ is independently preferably an alkyl group or a cycloalkyl group, more preferably an alkyl group. The alkyl group and cycloalkyl group may further have a substituent, and examples of the substituent include the same groups as those described for the substituent which may be substituted on $Rx_4$ and $Rx_4'$.

The alkyl group of $Rx_5$ and $Rx_5'$ preferably has no substituent or has one or more aryl groups and/or one or more silyl groups as the substituent. The carbon number of the unsubstituted alkyl group is preferably from 1 to 20, more preferably 1 to 10. The carbon number of the alkyl group moiety in the alkyl group substituted with one or more aryl groups is preferably from 1 to 25.

Specific examples of the alkyl group of $Rx_5$ and $Rx_5'$ are the same as specific examples described for the alkyl group of $Rx_4$ and $Rx_4'$. The aryl group in the alkyl group substituted with one or more aryl groups is preferably an aryl group having a carbon number of 6 to 10 and specifically includes a phenyl group and a naphthyl group.

The carbon number of the alkyl group moiety in the alkyl group substituted with one or more silyl groups is preferably from 1 to 30. Also, in the case where the cycloalkyl group of $Rx_5$ and $Rx_5'$ does not have a substituent, the carbon number thereof is preferably from 3 to 20, more preferably from 3 to 15.

Specific examples of the cycloalkyl group of $Rx_5$ and $Rx_5'$ are the same as specific examples described for the cycloalkyl group of $Rx_4$ and $Rx_4'$.

$Rx_6$ represents a hydrogen atom, an alkyl group, a cycloalkyl group, an aryl group, an alkenyl group or an alkynyl group. However, when one or two members out of three $Rx_6$s are a hydrogen atom, at least one of the remaining $Rx_6$s represents an aryl group, an alkenyl group or an alkynyl group. $Rx_6$ is preferably a hydrogen atom or an alkyl group.

The alkyl group, cycloalkyl group, aryl group, alkenyl group and alkynyl group as $Rx_6$ may further have a substituent, and examples of the substituent include the same groups as those described for the substituent which may be substituted on $Rx_4$ and $Rx_4'$.

Examples of the alkyl group and cycloalkyl group as $Rx_6$ are the same as those described for the alkyl group and cycloalkyl group of $Rx_4$ and $Rx_4'$. In particular, when the alkyl group has no substituent, the carbon number thereof is preferably from 1 to 6, more preferably from 1 to 3.

The aryl group of $Rx_6$ includes, for example, an aryl group having a carbon number of 6 to 10, such as phenyl group and naphthyl group.

The alkenyl group of $Rx_6$ includes, for example, an alkenyl group having a carbon number of 2 to 5, such as vinyl group, propenyl group and allyl group.

The alkynyl group of $Rx_6$ includes, for example, an alkynyl group having a carbon number of 2 to 5, such as ethynyl group, propynyl group and butynyl group.

Each $Rx_6'$ is independently preferably an alkyl group, a cycloalkyl group or an aryl group, more preferably an alkyl group or a cycloalkyl group, still more preferably an alkyl group.

Specific examples and preferred examples of the alkyl group, cycloalkyl group and aryl group of $Rx_6'$ are the same as those described above for the alkyl group and cycloalkyl group of $Rx_4$ and $Rx_4'$ and the aryl group of $Rx_6$.

These alkyl group, cycloalkyl group and aryl group may further have a substituent, and examples of the substituent include the same groups as those described for the substituent which may be substituted on $Rx_4$ and $Rx_4'$.

The structure (ii) is preferably a group represented by the following formula (c-1), (c-2) or (c-3):

In formula (c-1), each $Rx_7$ independently represents a hydrogen atom or a monovalent organic group.

$Rx_7$s may combine with each other to form a ring.

In formula (c-2), each $Rx_8$ independently represents a monovalent organic group.

$Rx_8$s may combine with each other to form a ring.

In formula (c-3), $Rx_8'$ represents a monovalent organic group.

In formulae (c-1) to (c-3), * represents a bond to the main chain or side chain of the resin above.

As described above, $Rx_7$ represents a hydrogen atom or a monovalent organic group. $Rx_7$ is preferably a hydrogen atom, an alkyl group or a cycloalkyl group, more preferably a hydrogen atom or an alkyl group, still more preferably a hydrogen atom or an alkyl group having no substituent.

$Rx_7$ is preferably a hydrogen atom or an alkyl group having a carbon number of 1 to 10, more preferably a hydrogen atom or an alkyl group having a carbon number of 1 to 10 and having no substituent.

The alkyl group and cycloalkyl group as $Rx_7$ may further have a substituent, and examples of the substituent include the same groups as those described for the substituent which may be substituted on $Rx_5$ and $Rx_5'$.

Specific examples of the alkyl group and cycloalkyl group of $Rx_7$ are the same as specific examples described for the alkyl group and cycloalkyl group of $Rx_4$ and $Rx_4'$.

As described above, each of $Rx_8$ and $Rx_8'$ represents a monovalent organic group. Each of $Rx_8$ and $Rx_8'$ is independently preferably an alkyl group or a cycloalkyl group, more preferably an alkyl group.

Examples of the alkyl group and cycloalkyl group of $Rx_8$ and $Rx_8'$ are the same as those described for the alkyl group and cycloalkyl group of $Rx_4$ and $Rx_4'$.

The resin (A) preferably contains a repeating unit having a structure in which a polar group is protected with the above-described leaving group capable of decomposing and leaving by the action of an acid (hereinafter, sometimes referred to as an "acid-decomposable repeating unit (b)"), more preferably a repeating unit having the structure (i) or (ii).

The repeating unit having the structure (i) or (ii) includes a repeating unit represented by the following formula (I-1) or (I-2):

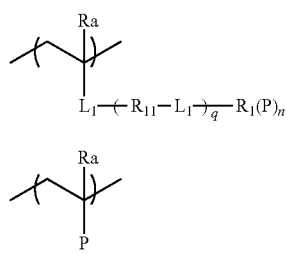

In the formulae, each Ra independently represents a hydrogen atom, an alkyl group or a group represented by —$CH_2$—O—$Ra_2$, wherein $Ra_2$ represents a hydrogen atom, an alkyl group or an acyl group.

P represents the structure (i); when a plurality of Ps are present, each P may be the same as or different from every other P or they may combine with each other to form a ring; in the case where a plurality of Ps combine with each other to form a ring, the combined Ps may represent the structure (ii) and in this case, * of formula (c) in the structure (ii) represents a bond to $R_1$.

$R_1$ represents an (n+1)-valent organic group, $R_{11}$ represents a divalent organic group, and when a plurality of $R_{11}$s are present, each $R_{11}$ may be the same as or different from every other $R_{11}$.

n represents an integer of 1 or more.

$L_1$ represents a linking group represented by —COO—, —OCO—, —CONH—, —O—, —Ar—, —$SO_3$— or —$SO_2$NH—, wherein Ar represents a divalent aromatic ring group, and when a plurality of $L_1$s are present, each $L_1$ may be the same as or different from every other $L_1$.

q is the repetition number of the group represented by —$R_{11}$-$L_1$- and represents an integer of 0 to 3.

Ra represents a hydrogen atom, an alkyl group or a group represented by —$CH_2$—O—$Ra_2$.

The carbon number of the alkyl group of Ra is preferably 6 or less, and the carbon number of the alkyl group and acyl group of $Ra_2$ is preferably 5 or less. The alkyl group of Ra and the alkyl group and acyl group of $Ra_2$ may have a substituent.

Ra is preferably a hydrogen atom, an alkyl group having a carbon number of 1 to 10, or an alkoxyalkyl group having a carbon number of 1 to 10 and specifically, is preferably a hydrogen, a methyl group, a trifluoromethyl group or a hydroxymethyl group, more preferably a hydrogen atom or a methyl group.

$R_1$ represents an (n+1)-valent organic group. $R_1$ is preferably a non-aromatic hydrocarbon group. In this case, $R_1$ may be a chain hydrocarbon group or an alicyclic hydrocarbon group. $R_1$ is more preferably an alicyclic hydrocarbon group.

The chain hydrocarbon group as $R_1$ may be linear or branched. The carbon number of the chain hydrocarbon group is preferably from 1 to 8. For example, when the chain hydrocarbon group is an alkylene group, the alkylene group is preferably a methylene group, an ethylene group, an n-propylene group, an isopropylene group, an n-butylene group, an isobutylene group or a sec-butylene group.

The alicyclic hydrocarbon group as $R_1$ may be monocyclic or polycyclic. The alicylcic hydrocarbon group has, for example, a monocyclo, bicyclo, tricyclo or tetracyclo structure. The carbon number of the alicyclic hydrocarbon group is usually 5 or more, preferably from 6 to 30, more preferably from 7 to 25.

The alicyclic hydrocarbon group includes, for example, those having a partial structure illustrated below. Each of these partial structures may have a substituent. Also, in each of these partial structures, the methylene group (—$CH_2$—) may be substituted with an oxygen atom (—O—), a sulfur atom (—S—), a carbonyl group [—C(=O)—], a sulfonyl group [—S(=O)$_2$—], a sulfinyl group [—S(=O)—] or an imino group [—N(R)—] (wherein R is a hydrogen atom or an alkyl group).

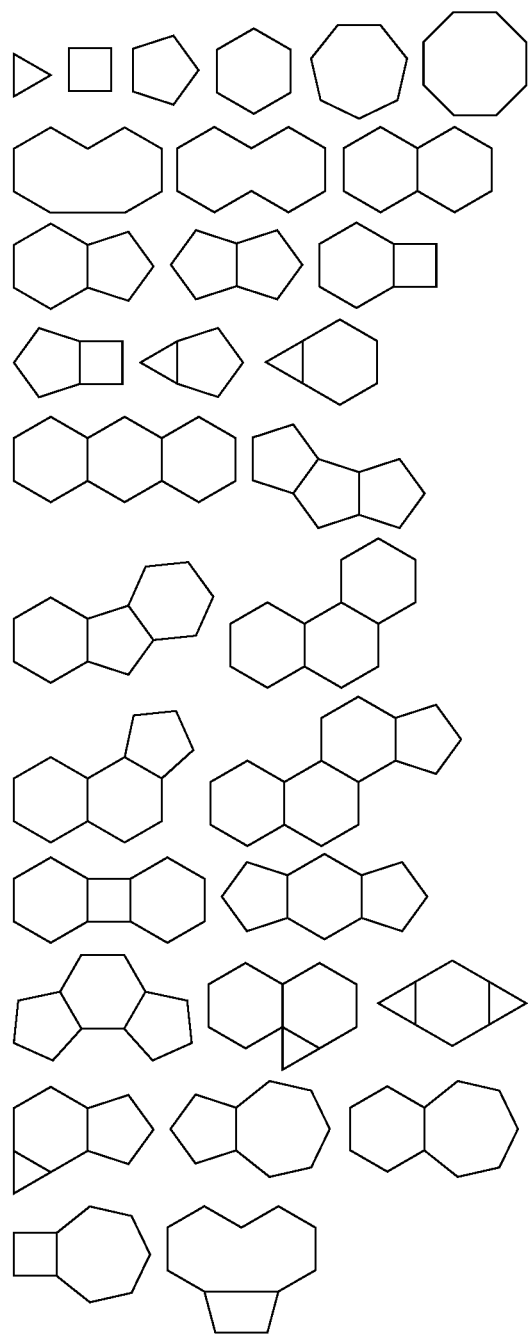

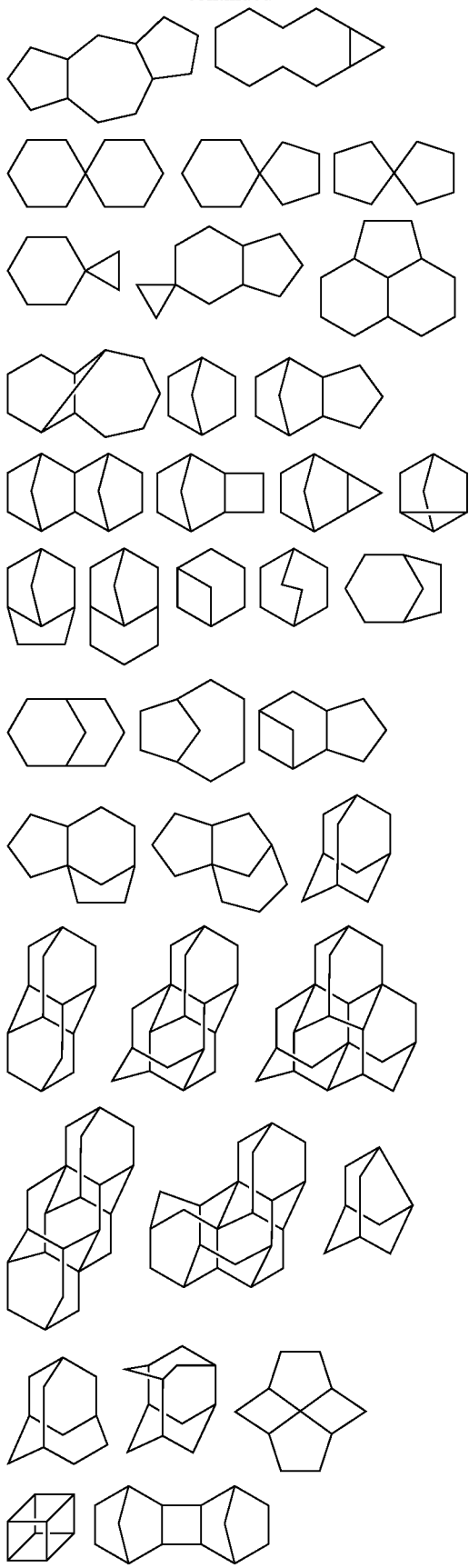

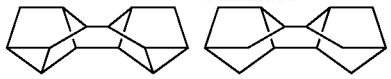

For example, when $R_1$ is a cycloalkylene group, $R_1$ is preferably an adamantylene group, a noradamantylene group, a decahydronaphthylene group, a tricyclodecanylene group, a tetracyclododecanylene group, a norbornylene group, a cyclopentylene group, a cyclohexylene group, a cycloheptylene group, a cyclooctylene group, a cyclodecanylene group or a cyclododecanylene group, more preferably an adamantylene group, a norbornylene group, a cyclohexylene group, a cyclopentylene group, a tetracyclododecanylene group or a tricyclodecanylene group.

The non-aromatic hydrocarbon group of $R_1$ may have a substituent. Examples of this substituent include an alkyl group having a carbon number of 1 to 4, a halogen atom, a hydroxy group, an alkoxy group having a carbon number of 1 to 4, a carboxy group, and an alkoxycarbonyl group having a carbon number of 2 to 6. These alkyl group, alkoxy group and alkoxycarbonyl group may further have a substituent, and examples of the substituent include a hydroxy group, a halogen atom and an alkoxy group.

Details of the divalent organic group of $R_{11}$ are the same as those of the (n+1)-valent organic group where n=1, that is, the divalent organic group, of $R_1$ and specific examples thereof are also the same.

$L_1$ represents a linking group represented by —COO—, —OCO—, —CONH—, —O—, —Ar—, —SO$_3$— or —SO$_2$NH— (in these linking groups, "—" on the left side is connected to the main chain of the resin), wherein Ar represents a divalent aromatic ring group and is preferably, for example, a divalent aromatic ring group having a carbon number of 6 to 10, such as phenylene group and naphthylene group. $L_1$ is preferably a linking group represented by —COO—, —CONH— or —Ar—, more preferably a linking group represented by —COO— or —CONH—.

n is an integer of 1 or more. n is preferably an integer of 1 to 3, more preferably 1 or 2. Also, when n is 2 or more, the dissolution contrast for an organic solvent-containing developer can be more increased and in turn, not only the resolution can be more enhanced but also LWR can be more reduced.

q is the repetition number of the group represented by —$R_{11}$-$L_1$- and represents an integer of 0 to 3. q is preferably an integer of 0 to 2, more preferably 0 or 1.

Specific examples of the acid-decomposable repeating unit (b) are illustrated below. In specific examples, Ra and P have the same meanings as Ra and P in formulae (I-1) or (I-2). $P_3$ has the same meaning as $P_3$ in formula (c) where z is 2.

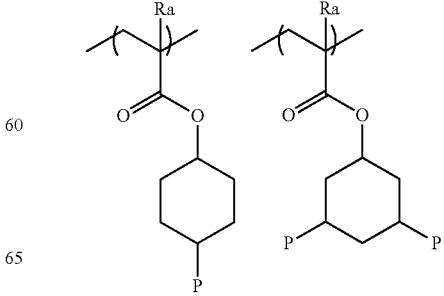

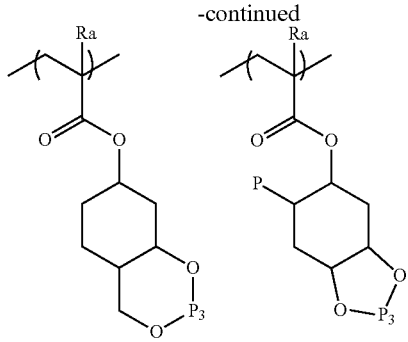
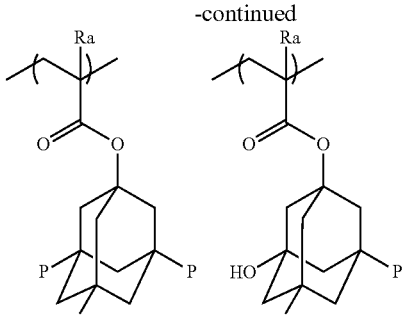
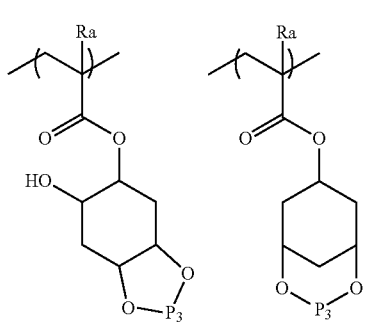
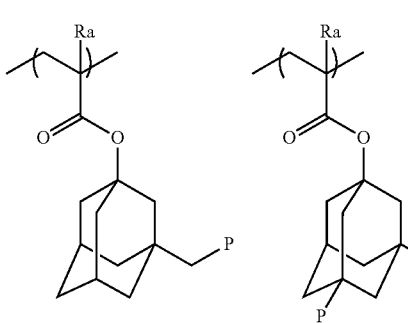
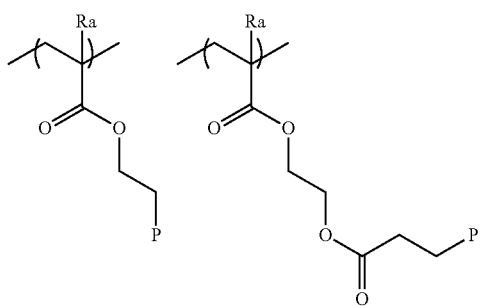
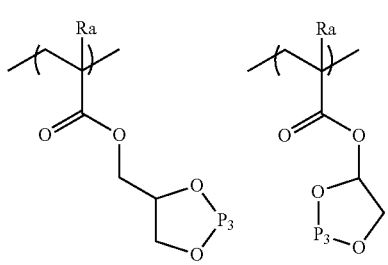
More specifically, the repeating units illustrated below are preferred as the acid-decomposable repeating unit (b). In specific examples, $Xa_1$ represents a hydrogen atom, $CH_3$, $CF_3$ or $CH_2OH$.
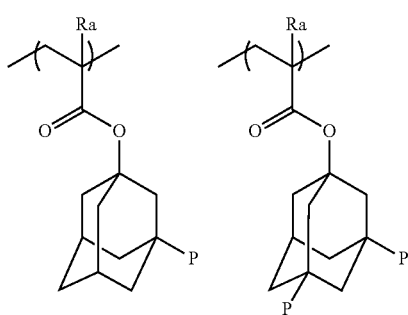
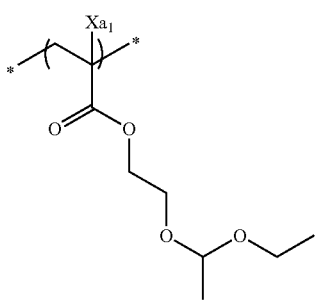

39
-continued
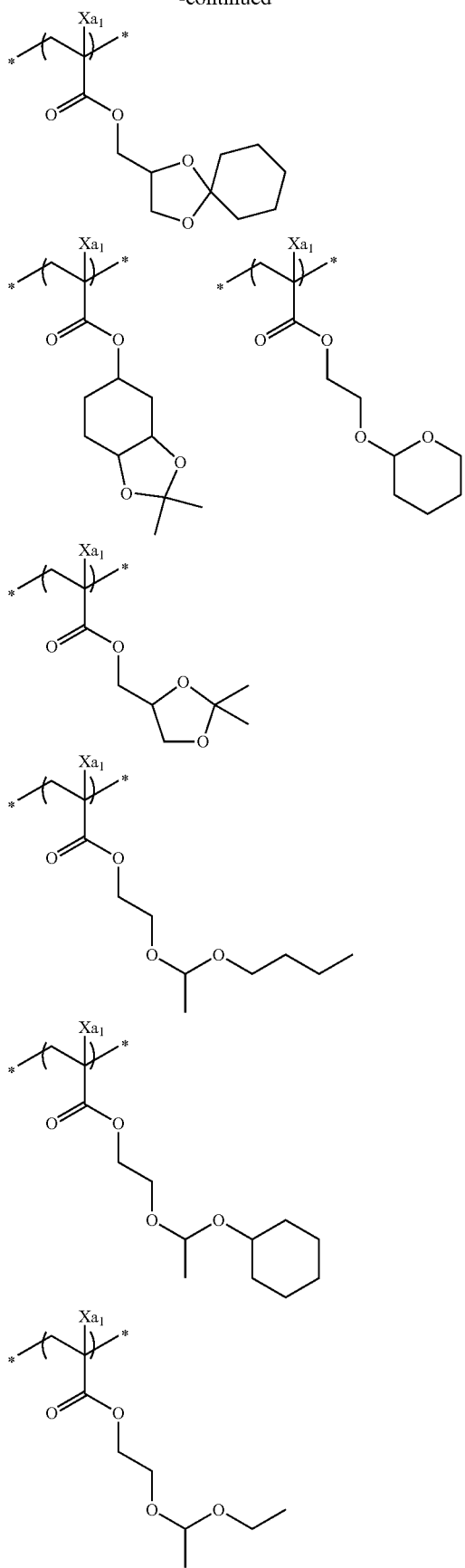
40
-continued
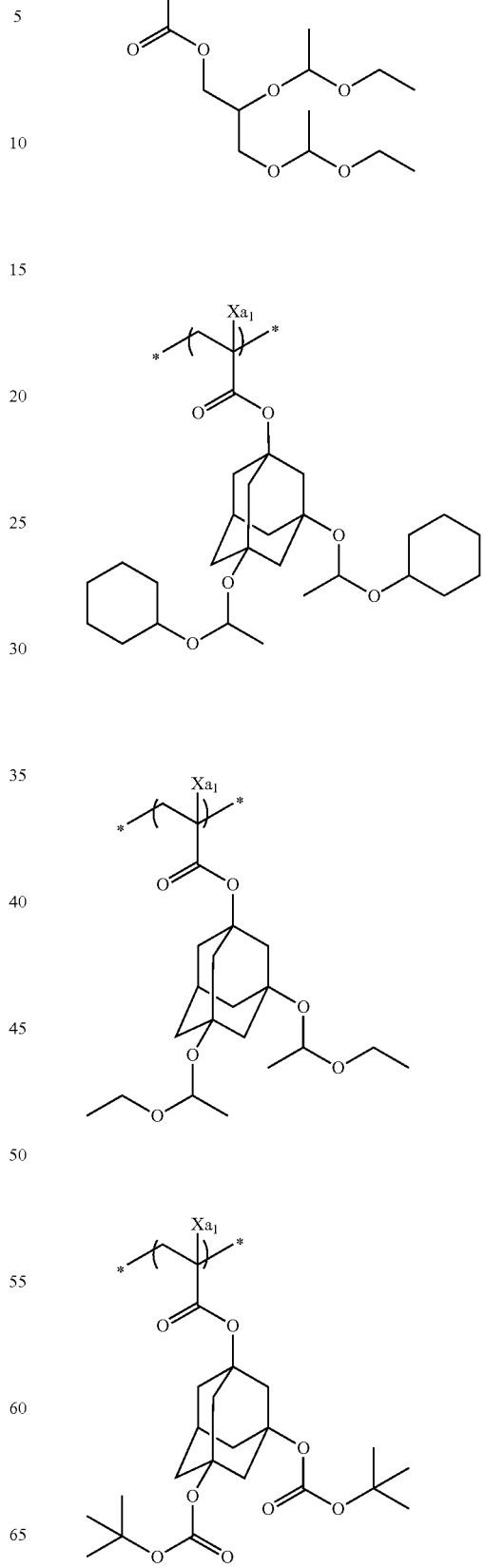

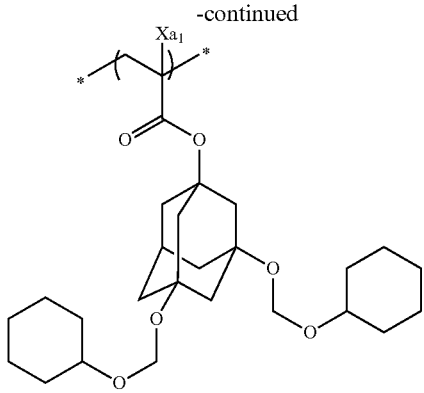

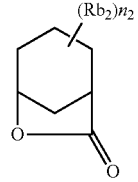 LC1-3

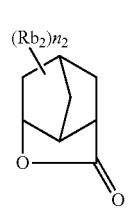 LC1-4

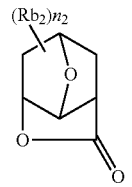 LC1-5

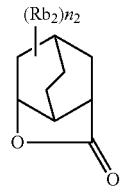 LC1-6

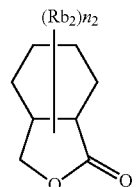 LC1-7

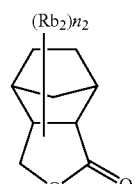 LC1-8

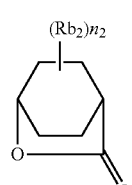 LC1-9

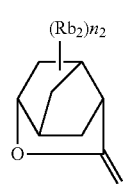 LC1-10

The resin (A) preferably contains a repeating unit having a lactone structure.

Any lactone structure may be used as long as it has a lactone structure, but a 5- to 7-membered ring lactone structure is preferred, and a 5- to 7-membered ring lactone structure to which another ring structure is fused to form a bicyclo or spiro structure is preferred. It is more preferred to contain a repeating unit having a lactone structure represented by any one of the following formulae (LC1-1) to (LC1-17). The lactone structure may be bonded directly to the main chain. Among these lactone structures, (LC1-1), (LC1-4), (LC1-5), (LC1-6), (LC1-13), (LC1-14) and (LC1-17) are preferred, and the lactone structure of (LC1-4) is more preferred. By virtue of using such a specific lactone structure, LWR and development defect are improved.

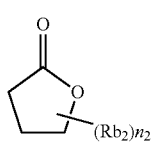 LC1-1

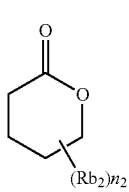 LC1-2

LC1-11
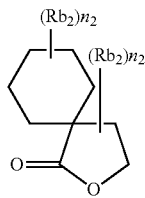

LC1-12
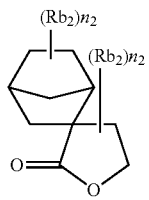

LC1-13
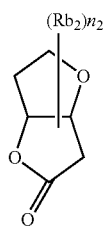

LC1-14
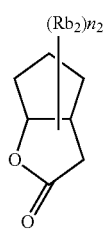

LC1-15
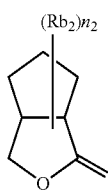

LC1-16
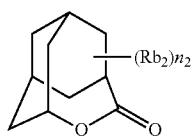

LC1-17
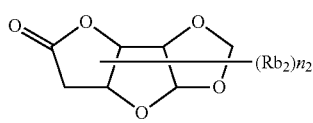

The lactone structure moiety may or may not have a substituent (Rb$_2$). Preferred examples of the substituent (Rb$_2$) include an alkyl group having a carbon number of 1 to 8, a cycloalkyl group having a carbon number of 4 to 7, an alkoxy group having a carbon number of 1 to 8, an alkoxycarbonyl group having a carbon number of 2 to 8, a carboxyl group, a halogen atom, a hydroxyl group, a cyano group and an acid-decomposable group. Among these, an alkyl group having a carbon number of 1 to 4, a cyano group and an acid-decomposable group are more preferred. n$_2$ represents an integer of 0 to 4. When n$_2$ is 2 or more, each substituent (Rb$_2$) may be the same as or different from every other substituents (Rb$_2$) and also, the plurality of substituents (Rb$_2$) may combine together to form a ring.

The repeating unit having a lactone group usually has an optical isomer, but any optical isomer may be used. One optical isomer may be used alone, or a mixture of a plurality of optical isomers may be used. In the case of mainly using one optical isomer, the optical purity (ee) thereof is preferably 90% or more, more preferably 95% or more.

The lactone structure-containing repeating unit is preferably a unit represented by the following formula (III):

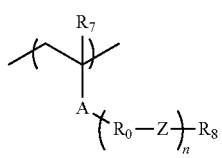
(III)

In formula (III), A represents an ester bond (a group represented by —COO—) or an amido bond (a group represented by —CONH—).

R$_0$ represents, when a plurality of R$_0$s are present, each independently represents, an alkylene group, a cycloalkylene group or a combination thereof.

Z represents, when a plurality of Zs are present, each independently represents, a single bond, an ether bond, an ester bond, an amide bond, a urethane bond
(a group represented by

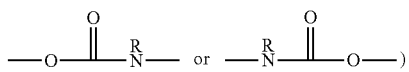

or a urea bond
(a group represented by $$-\underset{R}{N}-\overset{O}{\underset{\|}{C}}-\underset{R}{N}-),$$

wherein each R independently represents a hydrogen atom, an alkyl group, a cycloalkyl group or an aryl group.

R$_8$ represents a monovalent organic group having a lactone structure.

n is the repetition number of the structure represented by —R$_0$—Z— and represents an integer of 0 to 5, preferably 0 or 1. When n is 0, —R$_0$—Z— is not present and a single bond results.

R$_7$ represents a hydrogen atom, a halogen atom or an alkyl group.

The alkylene group and cycloalkylene group of R$_0$ may have a substituent.

Z is preferably an ether bond or an ester bond, more preferably an ester bond.

The alkyl group of R$_7$ is preferably an alkyl group having a carbon number of 1 to 4, more preferably a methyl group or an ethyl group, still more preferably a methyl group.

The alkylene group and the cycloalkylene group of R$_0$ and the alkyl group of R$_7$ may be substituted, and examples of the substituent include a halogen atom such as fluorine atom, chlorine atom and bromine atom, a mercapto group, a hydroxyl group, an alkoxy group such as methoxy group, ethoxy group, isopropoxy group, tert-butoxy group and benzyloxy group, and an acyloxy group such as acetyloxy group and propionyloxy group.

$R_7$ is preferably a hydrogen atom, a methyl group, a trifluoromethyl group or a hydroxymethyl group.

The chain alkylene group in $R_0$ is preferably a chain alkylene group having a carbon number of 1 to 10, more preferably from 1 to 5, and examples thereof include a methylene group, an ethylene group and a propylene group. The cycloalkylene group is preferably a cycloalkylene group having a carbon number of 3 to 20, and examples thereof include a cyclohexylene group, a cyclopentylene group, a norbornylene group and an adamantylene group. For bringing out the effects of the present invention, a chain alkylene group is more preferred, and a methylene group is still more preferred.

The lactone structure-containing monovalent organic group represented by $R_8$ is not limited as long as it has a lactone structure. Specific examples thereof include lactone structures represented by formulae (LC1-1) to (LC1-17) and among these, the structure represented by (LC1-4) is preferred. Also, structures where $n_2$ in (LC1-1) to (LC1-17) is 2 or less are more preferred.

$R_8$ is preferably a monovalent organic group having an unsubstituted lactone structure, or a monovalent organic group having a lactone structure containing a methyl group, a cyano group or an alkoxycarbonyl group as the substituent, more preferably a monovalent organic group having a lactone structure containing a cyano group as the substituent (cyano-lactone).

Specific examples of the repeating unit containing a group having a lactone structure are illustrated below, but the present invention is not limited thereto.

In specific examples, R represents a hydrogen atom, an alkyl group which may have a substituent, or a halogen atom, preferably a hydrogen atom, a methyl group, a hydroxymethyl group or an acetyloxymethyl group.

(In the formulae, Rx represents H, $CH_3$, $CH_2OH$ or $CF_3$.)

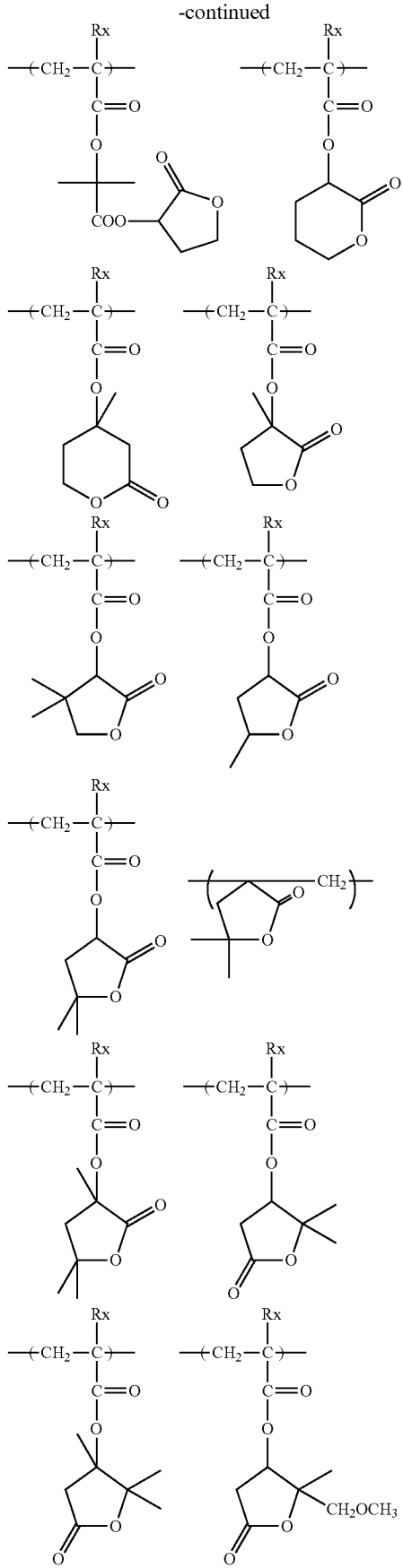

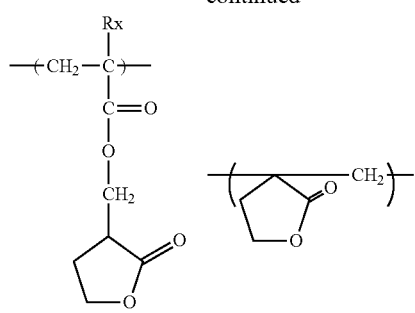
(In the formulae, Rx represents H, CH₃, CH₂OH or CF₃.)
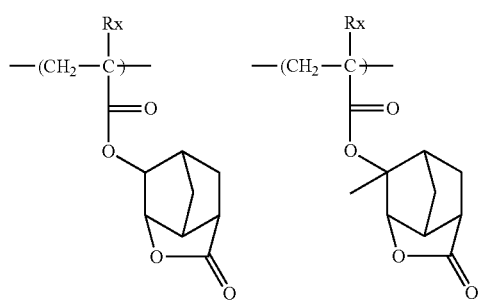
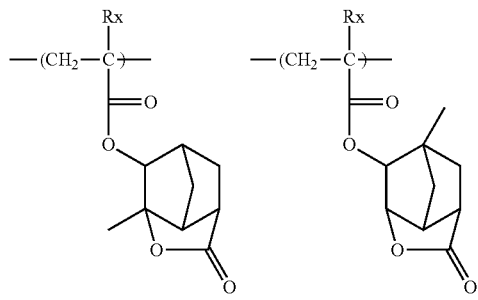
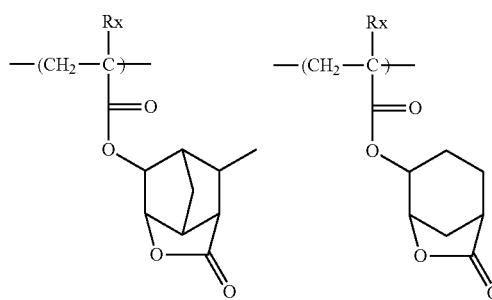
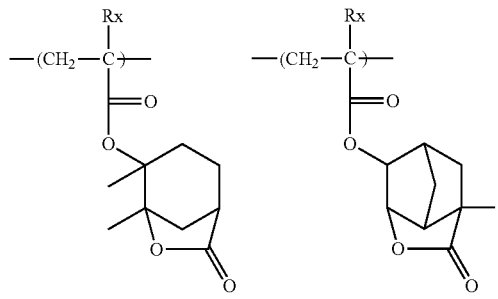
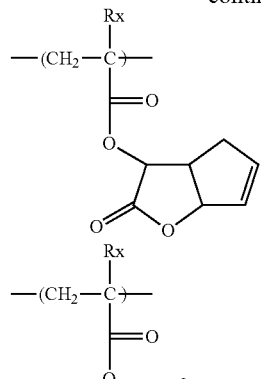
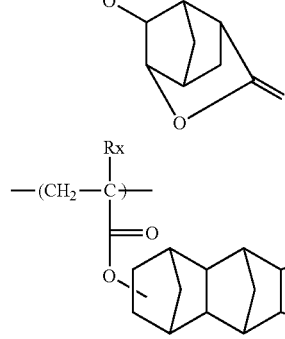
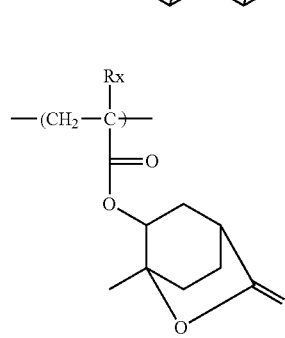
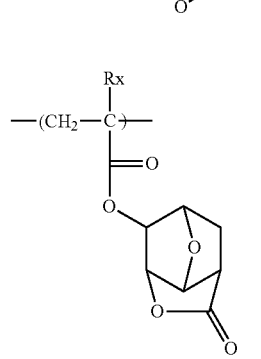
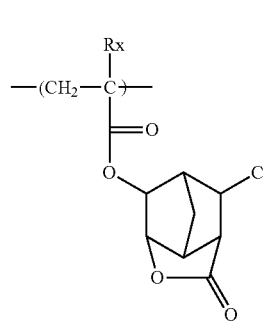

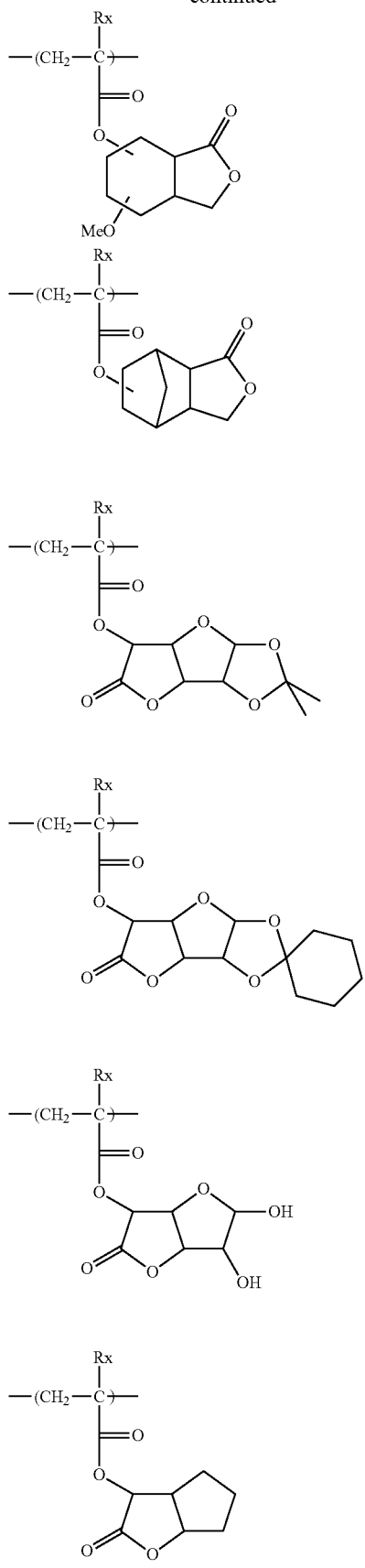
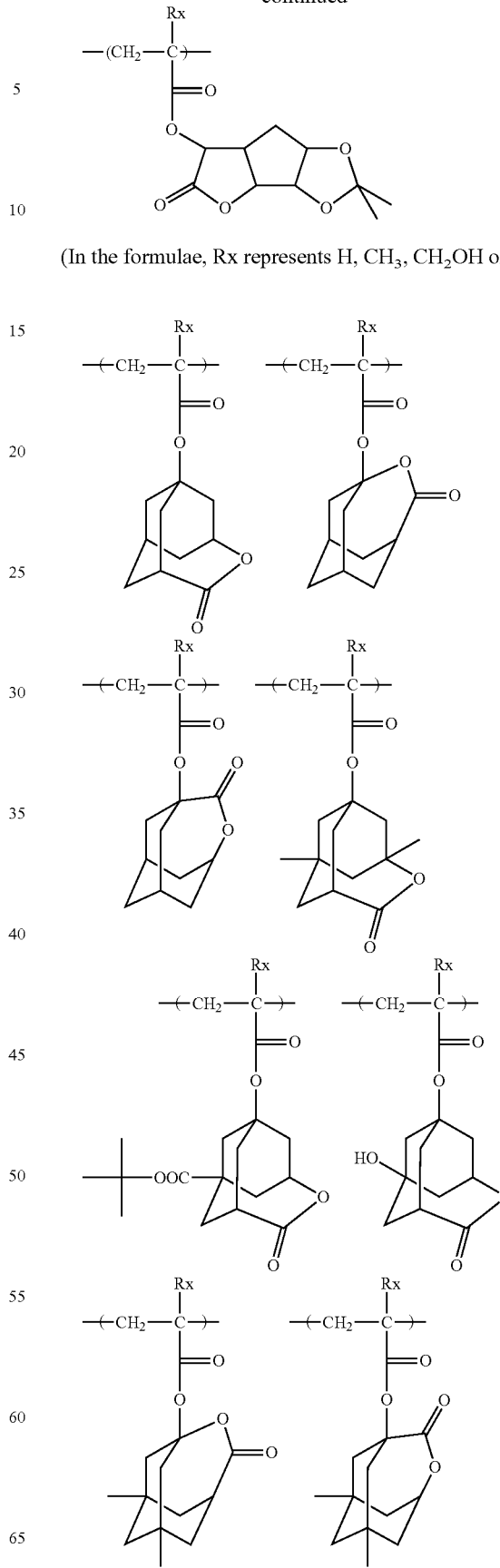
(In the formulae, Rx represents H, CH₃, CH₂OH or CF₃.)

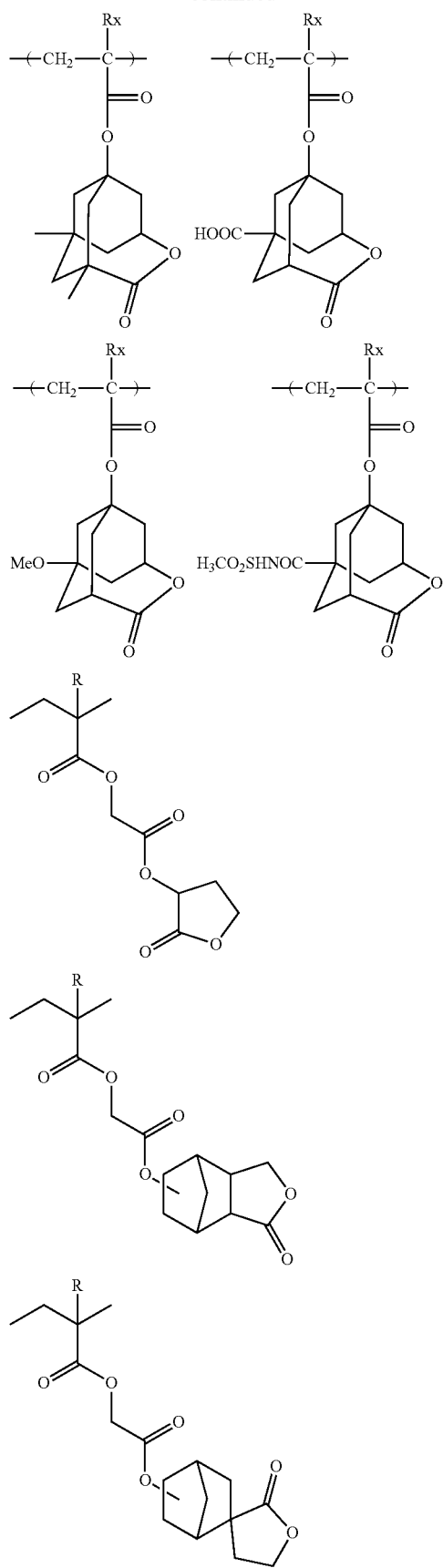
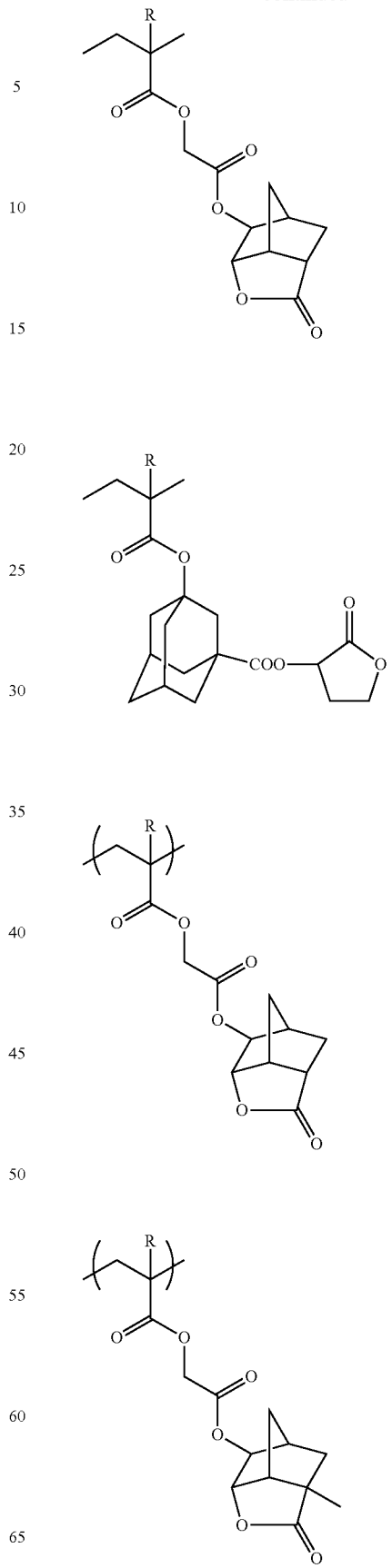

53
-continued
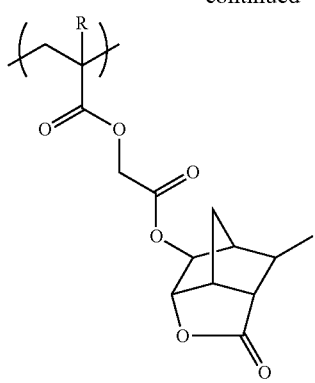
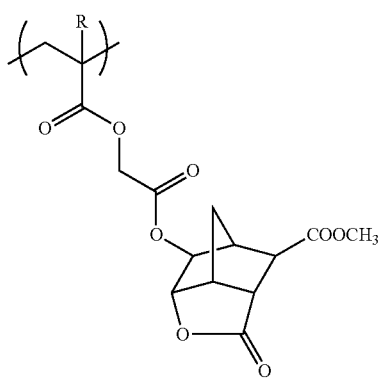
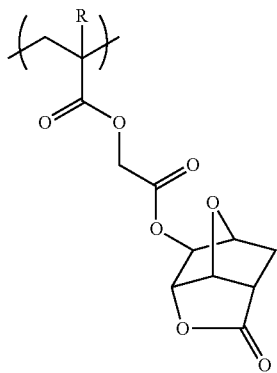
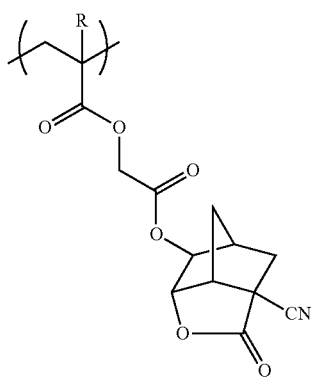
54
-continued
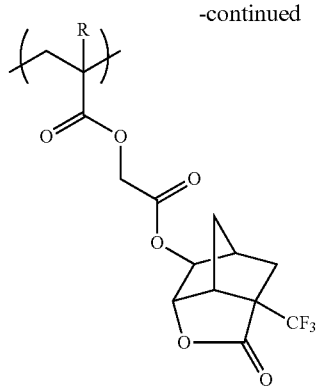
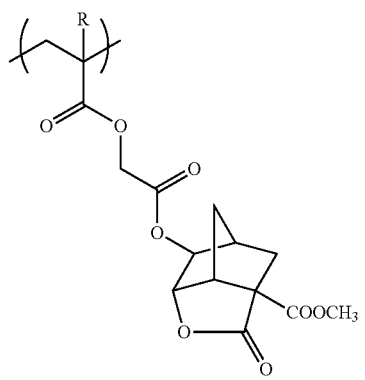
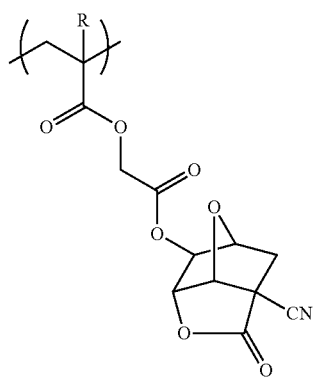
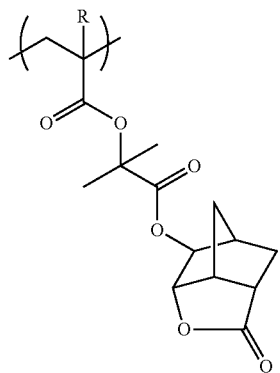

55
-continued
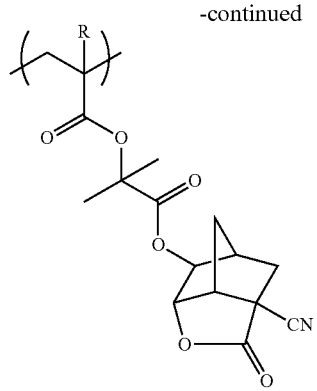
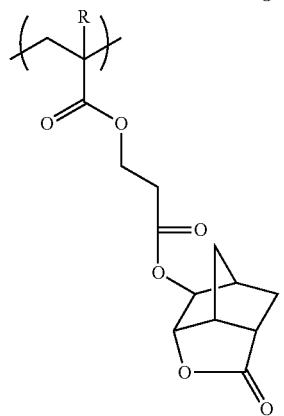
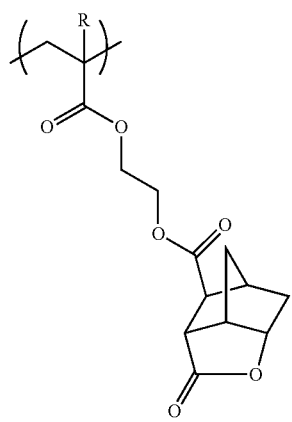
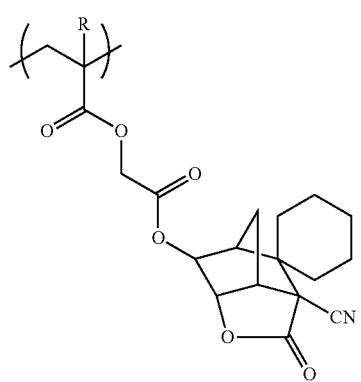
56
-continued
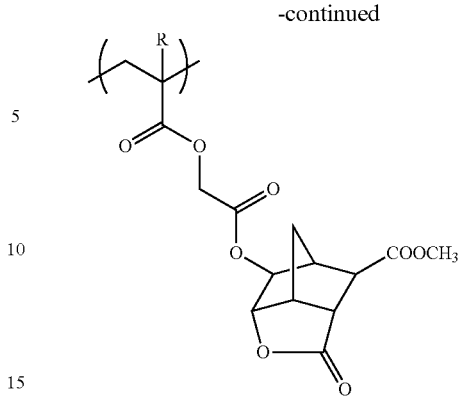
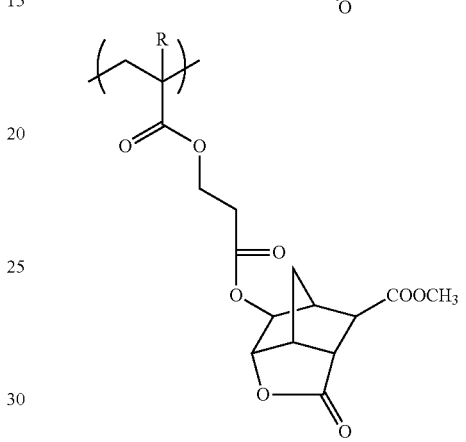
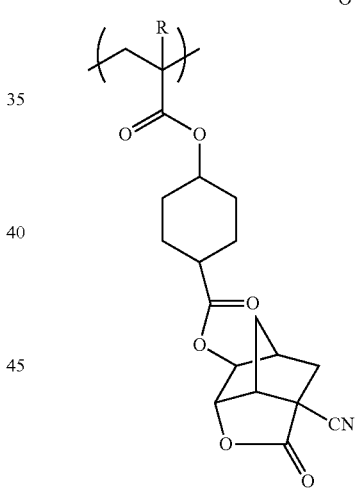
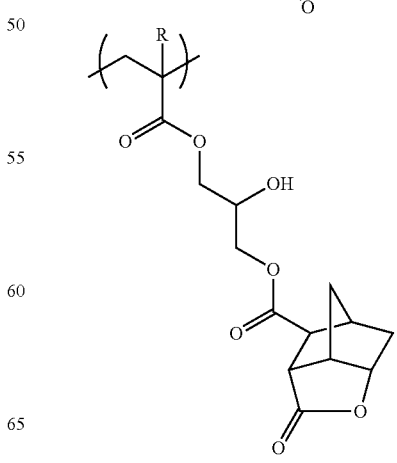

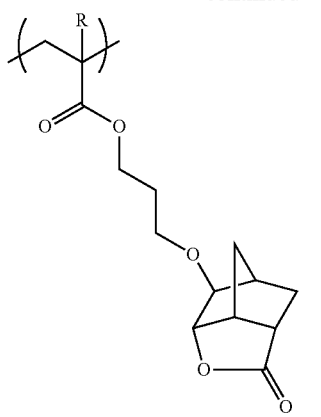
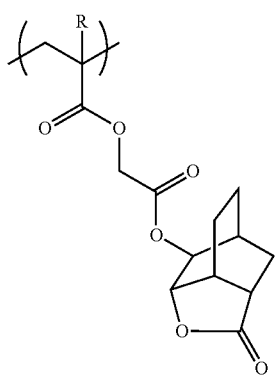
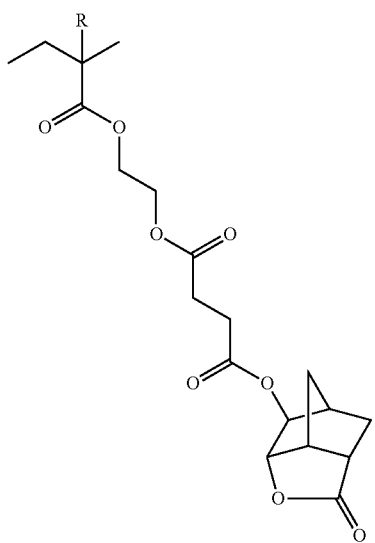
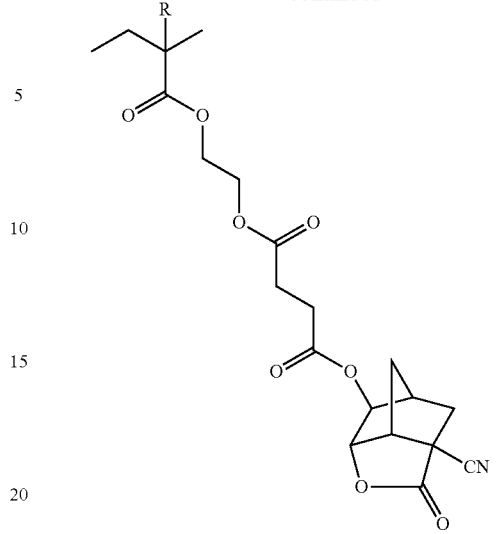
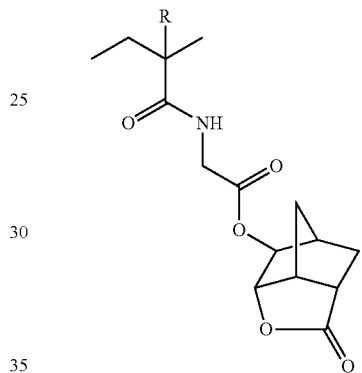
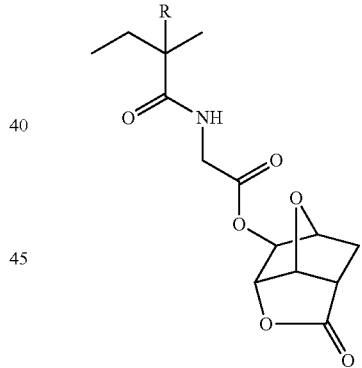
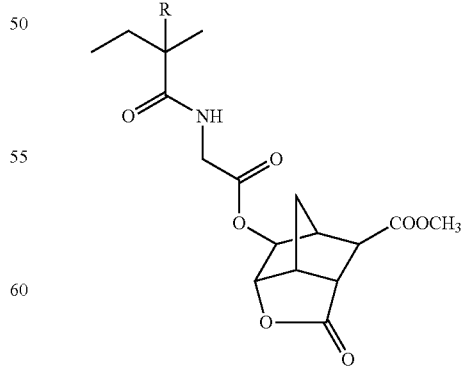
For increasing the effects of the present invention, it is also possible to use two or more kinds of lactone structure-containing repeating units in combination.

The content of the repeating unit having a lactone structure is preferably from 10 to 70 mol %, more preferably from 15 to 65 mol %, still more preferably from 20 to 60 mol %, yet still more preferably from 20 to 50 mol %, based on all repeating units in the resin (A).

The resin (A) preferably contains a repeating unit having a hydroxyl group or a cyano group, other than formula (III). Thanks to this repeating unit, adherence to substrate and affinity for developer are enhanced. The repeating unit having a hydroxyl group or a cyano group is preferably a repeating unit having an alicyclic hydrocarbon structure substituted with a hydroxyl group or a cyano group and preferably has no acid-decomposable group. The alicyclic hydrocarbon structure in the alicyclic hydrocarbon structure substituted with a hydroxyl group or a cyano group is preferably an adamantyl group, a diamantyl group or a norbornane group. The alicyclic hydrocarbon structure substituted with a hydroxyl group or a cyano group is preferably a partial structure represented by the following formulae (VIIa) to (VIId):

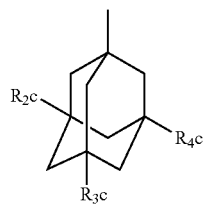

(VIIa)

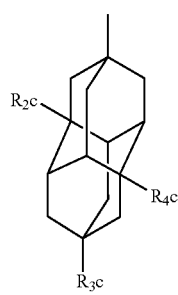

(VIIb)

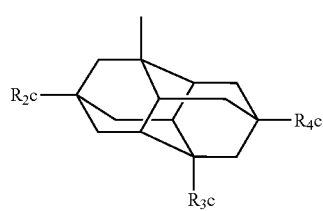

(VIIc)

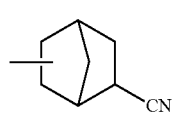

(VIId)

In formulae (VIIa) to (VIIc), each of $R_2c$ to $R_4c$ independently represents a hydrogen atom, a hydroxyl group or a cyano group, provided that at least one of $R_2c$ to $R_4c$ represents a hydroxyl group or a cyano group. A structure in which one or two members out of $R_2c$ to $R_4c$ are a hydroxyl group with the remaining being a hydrogen atom is preferred. In formula (VIIa), it is more preferred that two members out of $R_2c$ to $R_4c$ are a hydroxyl group and the remaining is a hydrogen atom.

The repeating unit having a partial structure represented by formulae (VIIa) to (VIId) includes repeating units represented by the following formulae (AIIa) to (AIId):

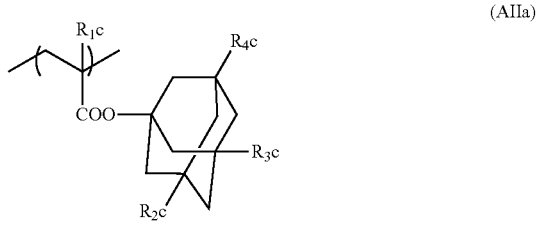

(AIIa)

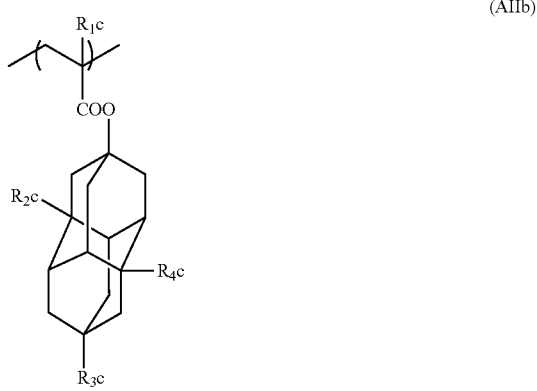

(AIIb)

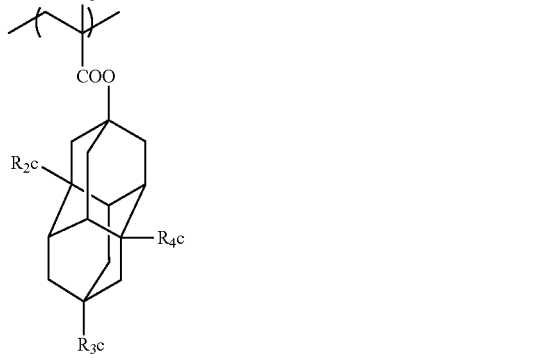

(AIIc)

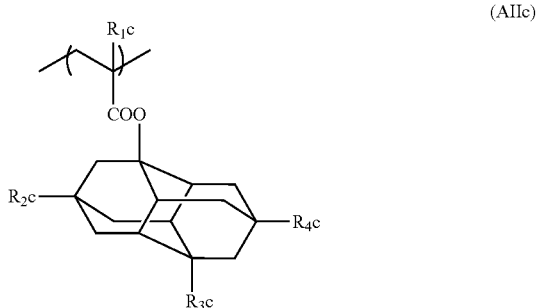

(AIId)

In formulae (AIIa) to (AIId), $R_1c$ represents a hydrogen atom, a methyl group, a trifluoromethyl group or a hydroxymethyl group.

$R_2c$ to $R_4c$ have the same meanings as $R_2c$ to $R_4c$ in formulae (VIIa) to (VIIc).

The content of the repeating unit having a hydroxyl group or a cyano group is preferably from 5 to 40 mol %, more preferably from 5 to 30 mol %, still more preferably from 5 to 25 mol %, based on all repeating units in the resin (A).

Specific examples of the repeating unit having a hydroxyl group or a cyano group are illustrated below, but the present invention is not limited thereto.

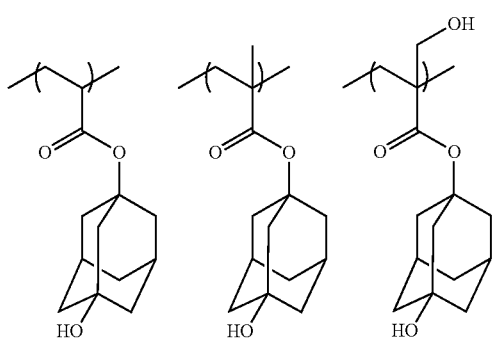
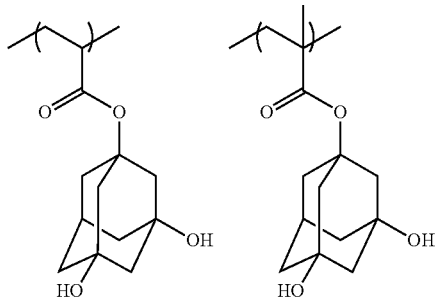
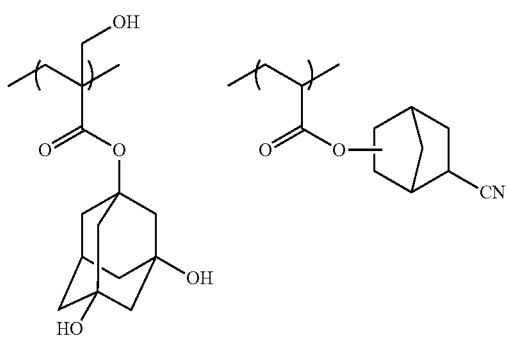
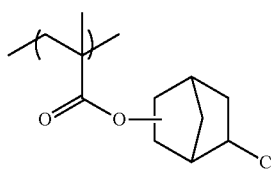
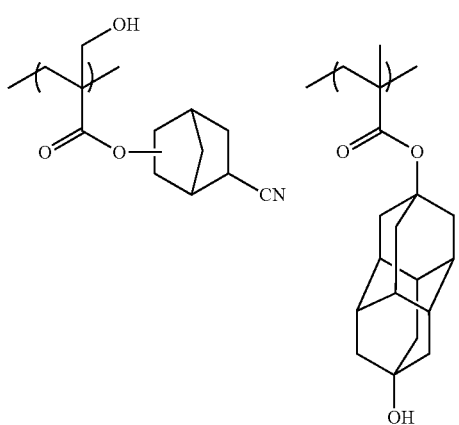
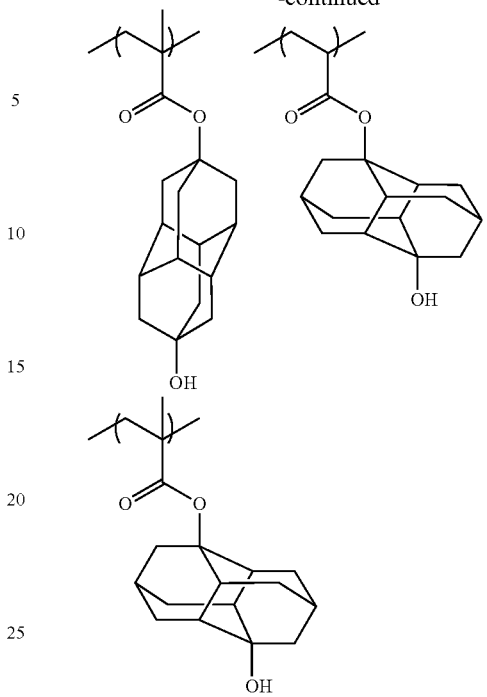

As described above, the dissolution rate of 18 nm/sec or more can be suitably achieved by decreasing the content of the hydrophilic repeating unit in the resin (A), for example, by setting the total content, in the resin (A), of repeating units having a hydroxyl group or a cyano group other than formula (III) to be smaller than the total content of those repeating units in an acid-decomposable resin used for a normal resist composition. Specifically, the total content, in the resin (A), of the repeating unit having a lactone structure and the repeating unit having a hydroxyl group or a cyano group other than formula (III) is preferably 60 mol % or less, more preferably 50 mol % or less, still more preferably 45 mol % or less, yet still more preferably 40 mol % or less, even yet still more preferably 35 mol % or less, and still preferably 30 mol % or less, based on all repeating units in the resin (A).

The total content, in the resin (A), of the repeating unit having a lactone structure and the repeating unit having a hydroxyl group or a cyano group other than formula (III) is preferably 1 mol % or more based on all repeating units in the resin (A).

The resin (A) may contain a repeating unit having an acid group. The acid group includes a carboxyl group, a sulfonamide group, a sulfonylimide group, a bisulfonylimide group, and an aliphatic alcohol group substituted with an electron-withdrawing group at the α-position (e.g., hexafluoroisopropanol), and it is preferred to contain a repeating unit having a carboxy group. By virtue of containing a repeating unit having an acid group, the resolution increases in the usage of forming contact holes. As for the repeating unit having an acid group, a repeating unit where an acid group is directly bonded to the main chain of the resin, such as repeating unit by an acrylic acid or a methacrylic acid, a repeating unit where an acid group is bonded to the main chain of the resin through a linking group, and a repeating unit where an acid group is introduced into the terminal of the polymer chain by using a polymerization initiator or chain transfer agent having an acid group at the polymerization, all are preferred. The linking group may have a monocyclic or polycyclic, cyclic hydrocarbon structure. Above all, a repeating unit by an acrylic acid or a methacrylic acid is preferred.

The resin (A) may or may not contain a repeating unit having an acid group, but in the case of containing a repeating unit having an acid group, the content thereof is preferably 15 mol % or less, more preferably 10 mol % or less, based on all repeating units in the resin (A). In the case where the resin (A) contains a repeating unit having an acid group, the content of the acid group-containing repeating unit in the resin (A) is usually 1 mol % or more.

Specific examples of the repeating unit having an acid group are illustrated below, but the present invention is not limited thereto.

In specific examples, Rx represents H, $CH_3$, $CH_2OH$ or $CF_3$.

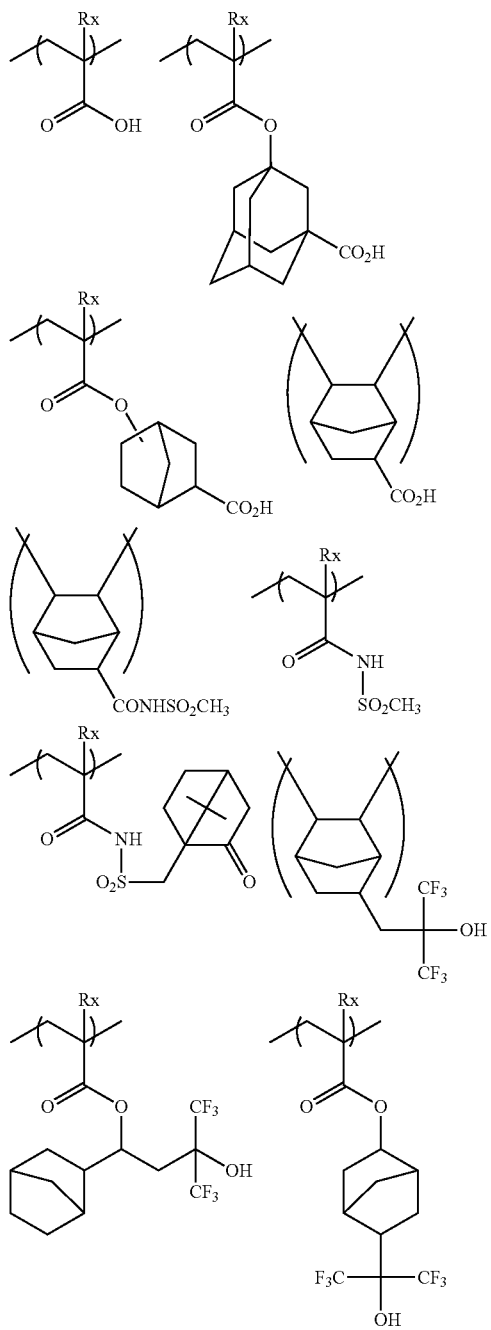
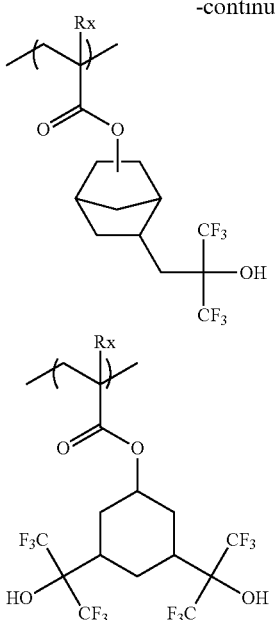

The resin (A) for use in the present invention may further contain a repeating unit having an alicyclic hydrocarbon structure free from a polar group (for example, the above-described acid group, a hydroxyl group or a cyano group) and not exhibiting acid decomposability. Thanks to this repeating unit, not only elution of low molecular components from the resist film into the immersion liquid at the immersion exposure can be reduced but also the solubility of the resin at the development using an organic solvent-containing developer can be appropriately adjusted. Such a repeating unit includes a repeating unit represented by formula (IV):

(IV)

In formula (IV), $R_5$ represents a hydrocarbon group having at least one cyclic structure and having no polar group.

Ra represents a hydrogen atom, an alkyl group, or a —$CH_2$—O—$Ra_2$ group, wherein $Ra_2$ represents a hydrogen atom, an alkyl group or an acyl group. Ra is preferably a hydrogen atom, a methyl group, a hydroxymethyl group or a trifluoromethyl group, more preferably a hydrogen atom or a methyl group.

The cyclic structure contained in $R_5$ includes a monocyclic hydrocarbon group and a polycyclic hydrocarbon group. Examples of the monocyclic hydrocarbon group include a cycloalkyl group having a carbon number of 3 to 12, such as cyclopentyl group, cyclohexyl group, cycloheptyl group and cyclooctyl group, and a cycloalkenyl group having a carbon number of 3 to 12, such as cyclohexenyl group. The monocyclic hydrocarbon group is preferably a monocyclic hydrocarbon group having a carbon number of 3 to 7, more preferably a cyclopentyl group or a cyclohexyl group.

The polycyclic hydrocarbon group includes a ring assembly hydrocarbon group and a crosslinked cyclic hydrocarbon group. Examples of the ring assembly hydrocarbon group include a bicyclohexyl group and a perhydronaphthalenyl group. Examples of the crosslinked cyclic hydrocarbon ring include a bicyclic hydrocarbon ring such as pinane ring, bornane ring, norpinane ring, norbornane ring and bicyclooctane ring (e.g., bicyclo[2.2.2]octane ring, bicyclo[3.2.1]octane ring), a tricyclic hydrocarbon ring such as homobledane ring, adamantane ring, tricyclo[5.2.1.0$^{2,6}$]decane ring and tricyclo[4.3.1.1$^{2,5}$]undecane ring, and a tetracyclic hydrocarbon ring such as tetracyclo[4.4.0.1$^{2,5}$.1$^{7,10}$]dodecane ring and perhydro-1,4-methano-5,8-methanonaphthalene ring. The crosslinked cyclic hydrocarbon ring also includes a condensed cyclic hydrocarbon ring, for example, a condensed ring formed by fusing a plurality of 5- to 8-membered cycloalkane rings, such as perhydronaphthalene (decalin) ring, perhydroanthracene ring, perhydrophenathrene ring, perhydroacenaphthene ring, perhydrofluorene ring, perhydroindene ring and perhydrophenalene ring.

Preferred examples of the crosslinked cyclic hydrocarbon ring include a norbornyl group, an adamantyl group, a bicyclooctanyl group and a tricycle[5,2,1,0$^{2,6}$]decanyl group. Of these crosslinked cyclic hydrocarbon rings, a norbornyl group and an adamantyl group are more preferred.

These alicyclic hydrocarbon groups may have a substituent, and preferred examples of the substituent include a halogen atom, an alkyl group, a hydroxyl group with a hydrogen atom being substituted for, and an amino group with a hydrogen atom being substituted for. The halogen atom is preferably bromine atom, chlorine atom or fluorine atom, and the alkyl group is preferably methyl group, ethyl group, butyl group or tert-butyl group. This alkyl group may further have a substituent, and the substituent which may be further substituted on the alkyl group includes a halogen atom, an alkyl group, a hydroxyl group with a hydrogen atom being substituted for, and an amino group with a hydrogen atom being substituted for.

Examples of the substituent for hydrogen atom include an alkyl group, a cycloalkyl group, an aralkyl group, a substituted methyl group, a substituted ethyl group, an alkoxycarbonyl group and an aralkyloxycarbonyl group. The alkyl group is preferably an alkyl group having a carbon number of 1 to 4; the substituted methyl group is preferably methoxymethyl group, methoxythiomethyl group, benzyloxymethyl group, tert-butoxymethyl group or 2-methoxyethoxymethyl group; the substituted ethyl group is preferably 1-ethoxyethyl group or 1-methyl-1-methoxyethyl group; the acyl group is preferably an aliphatic acyl group having a carbon number of 1 to 6, such as formyl group, acetyl group, propionyl group, butyryl group, isobutyryl group, valeryl group and pivaloyl group; and the alkoxycarbonyl group includes, for example, an alkoxycarbonyl group having a carbon number of 1 to 4.

The resin (A) may or may not contain a repeating unit having a polar group-free alicyclic hydrocarbon structure and not exhibiting acid decomposability, but in the case of containing the repeating unit, the content thereof is preferably from 1 to 40 mol %, more preferably from 5 to 20 mol %, based on all repeating units in the resin (A).

Specific examples of the repeating unit having a polar group-free alicyclic hydrocarbon structure and not exhibiting acid decomposability are illustrated below, but the present invention is not limited thereto. In the formulae, Ra represents H, CH$_3$, CH$_2$OH or CF$_3$.

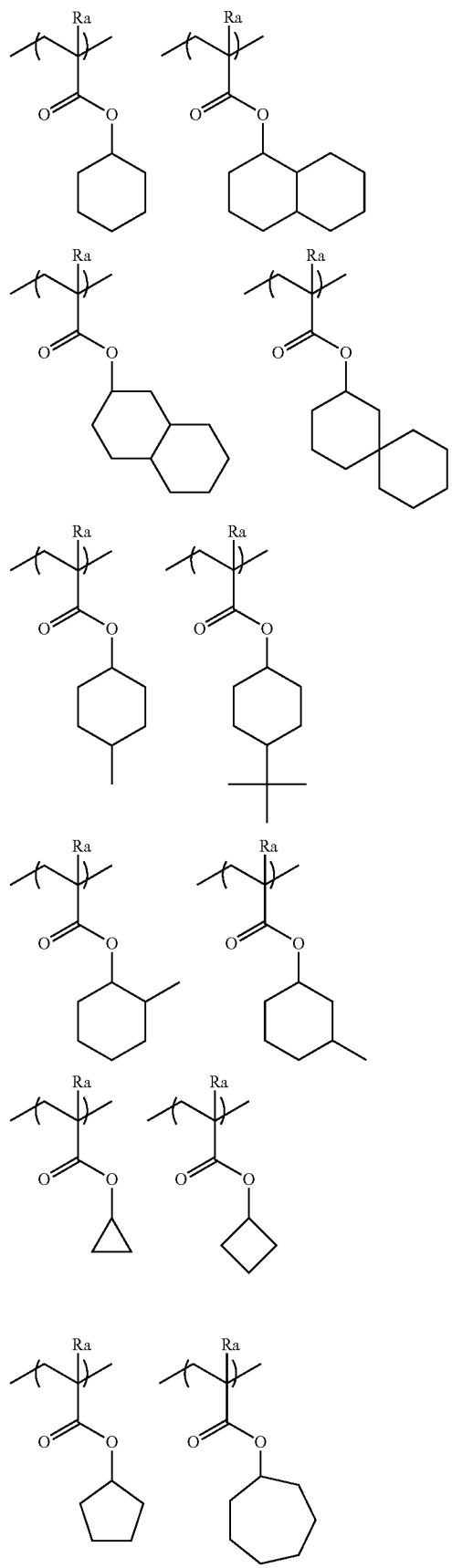

-continued

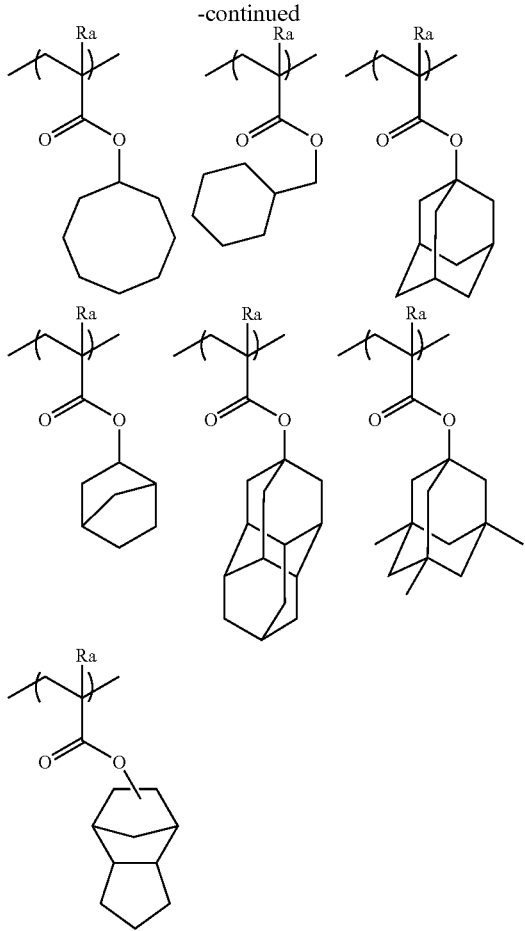

The resin (A) for use in the composition of the present invention may contain, in addition to the above-described repeating structural units, various repeating structural units for the purpose of controlling the dry etching resistance, suitability for standard developer, adherence to substrate, resist profile and properties generally required of a resist composition, such as resolution, heat resistance and sensitivity.

Examples of such a repeating structural unit include, but are not limited to, repeating structural units corresponding to the monomers described below.

Thanks to such a repeating structural unit, the performance required of the resin for use in the composition of the present invention, particularly (1) solubility for coating solvent,
(2) film-forming property (glass transition temperature),
(3) alkali developability,
(4) film loss (selection of hydrophilic, hydrophobic or alkali-soluble group),
(5) adherence of unexposed area to substrate,
(6) dry etching resistance, and the like, can be subtly controlled.

Examples of the monomer include a compound having one addition-polymerizable unsaturated bond selected from acrylic acid esters, methacrylic acid esters, acrylamides, methacrylamides, allyl compounds, vinyl ethers and vinyl esters.

Other than these, an addition-polymerizable unsaturated compound copolymerizable with the monomers corresponding to the above-described various repeating structural units may be copolymerized.

In the resin (A) for use in the composition of the present invention, the molar ratio of respective repeating structural units contained is appropriately set to control dry etching resistance of the resist composition, suitability for standard developer, adherence to substrate, resist profile and performances generally required of the resist composition, such as resolution, heat resistance and sensitivity.

In the case where the composition of the present invention is used for ArF exposure, in view of transparency to ArF light, the resin (A) for use in the composition of the present invention preferably has substantially no aromatic ring (specifically, the ratio of an aromatic group-containing repeating unit in the resin is preferably 5 mol % or less, more preferably 3 mol % or less, and ideally 0 mol %, that is, the resin does not have an aromatic group), and the resin (A) preferably has a monocyclic or polycyclic alicyclic hydrocarbon structure.

The resin (A) for use in the composition of the present invention is preferably a resin where all repeating units are composed of a (meth)acrylate-based repeating unit. In this case, all repeating units may be a methacrylate-based repeating unit, all repeating units may be an acrylate-based repeating unit, or all repeating units may be composed of a methacrylate-based repeating unit and an acrylate-based repeating unit, but the content of the acrylate-based repeating unit is preferably 50 mol % or less based on all repeating units. A copolymerized polymer containing from 20 to 50 mol % of an acid decomposable group-containing (meth)acrylate-based repeating unit (in the case of containing acid-decomposable repeating units (A2) and/or (B), as the total amount of the acid-decomposable unit (A) and the acid-decomposable repeating units (A2) and/or (B)), from 20 to 50 mol % of a lactone group-containing (meth)acrylate-based repeating unit, from 5 to 30 mol % of a (meth)acrylate-based repeating unit having an alicyclic hydrocarbon structure substituted with a hydroxyl group or a cyano group, and from 0 to 20 mol % of other (meth)acrylate-based repeating units is also preferred.

In the case of irradiating the composition of the present invention with KrF excimer laser light, electron beam, X-ray or high-energy beam at a wavelength of 50 nm or less (e.g., EUV), the resin (A) preferably further contains a hydroxystyrene-based repeating unit. It is more preferred to contain a hydroxystyrene-based repeating unit, a hydroxystyrene-based repeating unit protected with an acid-decomposable group, and an acid-decomposable repeating unit such as tertiary alkyl(meth)acrylate.

Preferred examples of the hydroxystyrene-based repeating unit having an acid-decomposable group include repeating units composed of a tert-butoxycarbonyloxystyrene, a 1-alkoxyethoxystyrene and a tertiary alkyl(meth)acrylate. Repeating units composed of a 2-alkyl-2-adamantyl(meth)acrylate and a dialkyl(1-adamantyl)methyl(meth)acrylate are more preferred.

The resin (A) for use in the present invention can be synthesized by a conventional method (for example, radical polymerization). Examples of the general synthesis method include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include tetrahydrofuran, 1,4-dioxane, ethers such as diisopropyl ether, ketones such as methyl ethyl ketone and methyl isobutyl ketone, an ester solvent such as ethyl acetate, an amide solvent such as dimethylformamide and dimethylacetamide, and the later-described solvent capable of dissolving the composition of the present invention, such as propylene glycol monomethyl ether acetate, propylene glycol monomethyl ether and cyclohexanone. The polymerization is more preferably performed using the same solvent as the solvent used in the photosensitive composition of the present invention. By the use of the same solvent, production of particles during storage can be suppressed.

The polymerization reaction is preferably performed in an inert gas atmosphere such as nitrogen or argon. As for the polymerization initiator, the polymerization is started using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The initiator is added additionally or in parts, if desired. After the completion of reaction, the reaction solution is poured in a solvent, and the desired polymer is collected, for example, by a powder or solid recovery method. The concentration at the reaction is from 5 to 50 mass %, preferably from 10 to 30 mass %, and the reaction temperature is usually from 10 to 150° C., preferably from 30 to 120° C., more preferably from 60 to 100° C.

After the completion of reaction, the reaction solution is allowed to cool to room temperature and purified. The purification may be performed by a normal method, for example, a liquid-liquid extraction method of applying water washing or combining an appropriate solvent to remove residual monomers or oligomer components; a purification method in a solution state, such as ultrafiltration of extracting and removing only polymers having a molecular weight not more than a specific value; a reprecipitation method of adding dropwise the resin solution in a poor solvent to solidify the resin in the poor solvent and thereby remove residual monomers and the like; and a purification method in a solid state, such as washing of a resin slurry with a poor solvent after separation of the slurry by filtration. For example, the resin is precipitated as a solid by contacting the reaction solution with a solvent in which the resin is sparingly soluble or insoluble (poor solvent) and which is in a volumetric amount of 10 times or less, preferably from 10 to 5 times, the reaction solution.

The solvent used at the operation of precipitation or reprecipitation from the polymer solution (precipitation or reprecipitation solvent) may be sufficient if it is a poor solvent for the polymer, and the solvent which can be used may be appropriately selected from, for example, a hydrocarbon, a halogenated hydrocarbon, a nitro compound, an ether, a ketone, an ester, a carbonate, an alcohol, a carboxylic acid, water, and a mixed solvent containing such a solvent, according to the kind of the polymer. Among these solvents, a solvent containing at least an alcohol (particularly, methanol or the like) or water is preferred as the precipitation or reprecipitation solvent.

The amount of the precipitation or reprecipitation solvent used may be appropriately selected by taking into consideration the efficiency, yield and the like, but in general, the amount used is from 100 to 10,000 parts by mass, preferably from 200 to 2,000 parts by mass, more preferably from 300 to 1,000 parts by mass, per 100 parts by mass of the polymer solution.

The temperature at the precipitation or reprecipitation may be appropriately selected by taking into consideration the efficiency or operability but is usually on the order of 0 to 50° C., preferably in the vicinity of room temperature (for example, approximately from 20 to 35° C.). The precipitation or reprecipitation operation may be performed using a commonly employed mixing vessel such as stirring tank by a known method such as batch system and continuous system.

The precipitated or reprecipitated polymer is usually subjected to commonly employed solid-liquid separation such as filtration and centrifugation, then dried and used. The filtration is performed using a solvent-resistant filter element preferably under pressure. The drying is performed under atmospheric pressure or reduced pressure (preferably under reduced pressure) at a temperature of approximately from 30 to 100° C., preferably on the order of 30 to 50° C.

Incidentally, after the resin is once precipitated and separated, the resin may be again dissolved in a solvent and then put into contact with a solvent in which the resin is sparingly soluble or insoluble. That is, there may be used a method comprising, after the completion of radical polymerization reaction, bringing the polymer into contact with a solvent in which the polymer is sparingly soluble or insoluble, to precipitate a resin (step a), separating the resin from the solution (step b), anew dissolving the resin in a solvent to prepare a resin solution A (step c), bringing the resin solution A into contact with a solvent in which the resin is sparingly soluble or insoluble and which is in a volumetric amount of less than 10 times (preferably 5 times or less) the resin solution A, to precipitate a resin solid (step d), and separating the precipitated resin (step e).

Also, in order to prevent the resin from aggregating after the preparation of the composition, a step of dissolving the synthesized resin in a solvent to make a solution and heating the solution at approximately from 30 to 90° C. for approximately from 30 minutes to 4 hours may be added, as described, for example, in JP-A-2009-037108.

The weight average molecular weight of the resin (A) for use in the present invention is preferably 5,000 or more, more preferably from 5,000 to 20,000, still more preferably from 6,000 to 17,000, yet still more preferably from 6,000 to 15,000, even yet still more preferably from 7,000 to 12,000, still more preferably from 7,500 to 11,000, in terms of polystyrene by the GPC method. When the weight average molecular weight is 5,000 or more, reduction in the heat resistance and dry etching resistance can be prevented and not only diffusibility of the acid generated can be suppressed but also the developability can be kept from deteriorating. Also, when the weight average molecular weight (Mw) of the resin (A) is adjusted to the above-described range which is lower than the weight average molecular weight of an acid-decomposable resin usually used for a resist composition, the dissolution rate of 18 nm/sec or more can be suitably achieved.

The glass transition temperature (Tg) of the resin (A) for use in the present invention is preferably from 130 to 230° C., more preferably from 140 to 220° C., still more preferably 145 to 200° C. When the Tg is from 130 to 230° C., reduction in the heat resistance and dry etching resistance can be prevented and not only diffusibility of the acid generated can be suppressed but also the developability can be kept from deteriorating.

The polydispersity (molecular weight distribution) is usually from 1.0 to 3.0, preferably from 1.0 to 2.6, more preferably from 1.0 to 2.0, still more preferably from 1.3 to 2.0. As the molecular weight distribution is smaller, the resolution and resist profile are more excellent, the side wall of the resist pattern is smoother, and the roughness is more improved.

In the resist composition of the present invention, the content of the resin (A) in the entire composition is preferably from 30 to 99 mass %, more preferably from 50 to 99 mass %, still more preferably from 55 to 95 mass %, yet still more preferably from 65 to 95 mass %, based on the entire solid content.

In the present invention, as for the resin (A), one kind of a resin may be used or a plurality of kinds of resins may be used in combination. The resin (A) and another resin not coming under the resin (A) may be also used in combination. In this case, the resin (A) is preferably present in a ratio of 50 mass % or more based on all resins.

[2] (B) Compound Capable of Generating an Acid Upon Irradiation with an Actinic Ray or Radiation The composition of the present invention contains (B) a compound capable of generating an acid upon irradiation with an actinic ray or radiation (hereinafter, sometimes referred to as an "acid generator").

The acid generator which can be used may be appropriately selected from a photo-initiator for cationic photopolymerization, a photo-initiator for radical photopolymerization, a photo-decoloring agent for dyes, a photo-discoloring agent, a known compound capable of generating an acid upon irradiation with an actinic ray or radiation, which is used for microresist or the like, and a mixture thereof.

Examples thereof include a diazonium salt, a phosphonium salt, a sulfonium salt, an iodonium salt, imidosulfonate, oxime sulfonate, diazodisulfone, disulfone and o-nitrobenzyl sulfonate.

Out of the acid generators, preferred compounds include compounds represented by the following formulae (ZI), (ZII) and (ZIII):

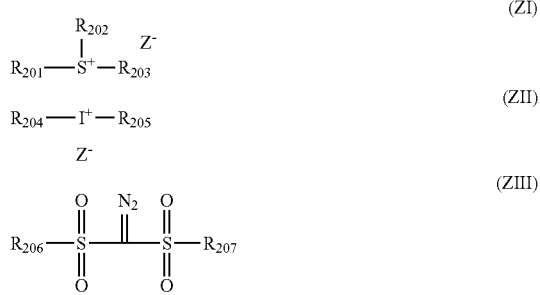

In formula (ZI), each of $R_{201}$, $R_{202}$ and $R_{203}$ independently represents an organic group.

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group. Examples of the group formed by combining two members out of $R_{201}$ to $R_{203}$ include an alkylene group (e.g., butylene, pentylene).

$Z^-$ represents a non-nucleophilic anion.

Examples of the non-nucleophilic anion as $Z^-$ include a sulfonate anion, a carboxylate anion, a sulfonylimide anion, a bis(alkylsulfonyl)imide anion and a tris(alkylsulfonyl)methyl anion.

The non-nucleophilic anion is an anion having an extremely low ability of causing a nucleophilic reaction, and this anion can suppress the decomposition with aging due to intramolecular nucleophilic reaction. Thanks to this anion, the aging stability of the resist composition is enhanced.

Examples of the sulfonate anion include an aliphatic sulfonate anion, an aromatic sulfonate anion and a camphorsulfonate anion.

Examples of the carboxylate anion include an aliphatic carboxylate anion, an aromatic carboxylate anion and an aralkylcarboxylate anion.

The aliphatic moiety in the aliphatic sulfonate anion and aliphatic carboxylate anion may be an alkyl group or a cycloalkyl group but is preferably an alkyl group having a carbon number of 1 to 30 or a cycloalkyl group having a carbon number of 3 to 30, and examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group and a bornyl group.

The aromatic group in the aromatic sulfonate anion and aromatic carboxylate anion is preferably an aryl group having a carbon number of 6 to 14, and examples thereof include a phenyl group, a tolyl group and a naphthyl group.

The alkyl group, cycloalkyl group and aryl group in the aliphatic sulfonate anion and aromatic sulfonate anion may have a substituent. Examples of the substituent on the alkyl group, cycloalkyl group and aryl group in the aliphatic sulfonate anion and aromatic sulfonate anion include a nitro group, a halogen atom (e.g., fluorine, chlorine, bromine, iodine), a carboxyl group, a hydroxyl group, an amino group, a cyano group, an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), an alkoxycarbonyloxy group (preferably having a carbon number of 2 to 7), an alkylthio group (preferably having a carbon number of 1 to 15), an alkylsulfonyl group (preferably having a carbon number of 1 to 15), an alkyliminosulfonyl group (preferably having a carbon number of 1 to 15), an aryloxysulfonyl group (preferably having a carbon number of 6 to 20), an alkylaryloxysulfonyl group (preferably having a carbon number of 7 to 20), a cycloalkylaryloxysulfonyl group (preferably having a carbon number of 10 to 20), an alkyloxyalkyloxy group (preferably having a carbon number of 5 to 20), and a cycloalkylalkyloxyalkyloxy group (preferably having a carbon number of 8 to 20). As for the aryl group or ring structure in each group, examples of the substituent further include an alkyl group (preferably having a carbon number of 1 to 15) and a cycloalkyl group (preferably having a carbon number of 3 to 15).

The aralkyl group in the aralkylcarboxylate anion is preferably an aralkyl group having a carbon number of 7 to 12, and examples thereof include a benzyl group, a phenethyl group, a naphthylmethyl group, a naphthylethyl group and a naphthylbutyl group.

The alkyl group, cycloalkyl group, aryl group and aralkyl group in the aliphatic carboxylate anion, aromatic carboxylate anion and aralkylcarboxylate anion may have a substituent. Examples of the substituent include the same halogen atom, alkyl group, cycloalkyl group, alkoxy group and alkylthio group as in the aromatic sulfonate anion.

Examples of the sulfonylimide anion include saccharin anion.

The alkyl group in the bis(alkylsulfonyl)imide anion and tris(alkylsulfonyl)methide anion is preferably an alkyl group having a carbon number of 1 to 5, and examples thereof include a methyl group, an ethyl group, a propyl group, an isopropyl group, an n-butyl group, an isobutyl group, a sec-butyl group, a pentyl group and a neopentyl group. Examples of the substituent on this alkyl group include a halogen atom, a halogen atom-substituted alkyl group, an alkoxy group, an alkylthio group, an alkyloxysulfonyl group, an aryloxysulfonyl group, and a cycloalkylaryloxysulfonyl group, with a fluorine atom-substituted alkyl group being preferred.

Other examples of the non-nucleophilic anion include fluorinated phosphorus, fluorinated boron and fluorinated antimony.

The non-nucleophilic anion of $Z^-$ is preferably an aliphatic sulfonate anion substituted with a fluorine atom at least at the α-position of the sulfonic acid, an aromatic sulfonate anion substituted with a fluorine atom or a fluorine atom-containing group, a bis(alkylsulfonyl)imide anion in which the alkyl group is substituted with a fluorine atom, or a tris(alkylsulfonyl)methide anion in which the alkyl group is substituted with a fluorine atom. The non-nucleophilic anion is more preferably a perfluoroaliphatic sulfonate anion having a carbon number of 4 to 8 or a fluorine atom-containing benzenesulfonate anion, still more preferably nonafluorobutanesulfonate anion, perfluorooctanesulfonate anion, pentafluorobenzenesulfonate anion or 3,5-bis(trifluoromethyl)benzenesulfonate anion.

The acid generator is preferably a compound capable of generating a sulfonic acid represented by the following formula (BI), and thanks to this compound, more excellent performance can be obtained in terms of resolution and roughness. The sulfonic acid represented by formula (BI) has an aromatic ring which is a cyclic organic group. It is considered that such a cyclic organic group is bulky compared with a chain group and makes it easy for the sulfonic acid generated in the exposed area to reside in the exposed area, lessening the fear of the acid diffusing into the non-exposed area to cause an unintended reaction, and the above-described performance can be more excellent.

Accordingly, when the acid generator is, for example, a compound represented by formula (ZI) or (ZII), the aromatic sulfonate anion is preferably an anion capable of producing an arylsulfonic acid represented by the following formula (BI):

(BI)

In formula (BI), Ar represents an aromatic ring and may have a substituent in addition to the sulfonic acid group and the A group.

p represents an integer of 0 or more.

A represents a group containing a hydrocarbon group.

When p is 2 or more, each A group may be the same as or different from every other A groups.

Formula (BI) is described in detail below.

The aromatic ring represented by Ar is preferably an aromatic ring having a carbon number of 6 to 30.

Specific examples thereof include a benzene ring, a naphthalene ring, a pentalene ring, an indene ring, an azulene ring, a heptalene ring, an indecene ring, a perylene ring, a pentacene ring, an acenaphthalene ring, a phenanthrene ring, an anthracene ring, a naphthacene ring, a chrysene ring, a triphenylene ring, an indene ring, a fluorene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolidine ring, a quinoline ring, a phthalazine ring, a naphthylidine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiine ring, a phenothiazine ring and a phenazine ring. A benzene ring, a naphthalene ring and an anthracene ring are preferred, and a benzene ring is more preferred.

Examples of the substituent which the aromatic ring may have in addition to the sulfonic acid group and the A group include a halogen atom (e.g., fluorine, chlorine, bromine, iodine), a hydroxyl group, a cyano group, a nitro group and a carboxyl group. In the case of having two or more substituents, at least two substituents may combine with each other to form a ring.

Examples of the group having a hydrocarbon group, represented by A, include an alkoxy group such as methoxy group, ethoxy group and tert-butoxy group; an aryloxy group such as phenoxy group and p-tolyloxy group; an alkylthioxy group such as methylthioxy group, ethylthioxy group and tert-butylthioxy group; an arylthioxy group such as phenylthioxy group and p-tolylthioxy group; an alkoxycarbonyl group such as methoxycarbonyl group, butoxycarbonyl group and phenoxycarbonyl group; an acetoxy group; a linear or branched alkyl group such as methyl group, ethyl group, propyl group, butyl group, heptyl group, hexyl group, dodecyl group and 2-ethylhexyl group; an alkenyl group such as vinyl group, propenyl group and hexenyl group; an acetylene group; an alkynyl group such as propynyl group and hexynyl group; an aryl group such as phenyl group and tolyl group; and an acyl group such as benzoyl group, acetyl group and tolyl group.

The hydrocarbon group in the group containing a hydrocarbon group, represented by A, includes an acyclic hydrocarbon group and a cyclic aliphatic group. The carbon number of the hydrocarbon group is preferably 3 or more.

As for the A group, the carbon atom adjacent to Ar is preferably a tertiary or quaternary carbon atom.

Examples of the acyclic hydrocarbon group in the A group include an isopropyl group, a tert-butyl group, a tert-pentyl group, a neopentyl group, an s-butyl group, an isobutyl group, an isohexyl group, a 3,3-dimethylpentyl group and a 2-ethylhexyl group. The upper limit of the carbon number of the acyclic hydrocarbon group is preferably 12 or less, more preferably 10 or less.

Examples of the cyclic aliphatic group in the A group include a cycloalkyl group such as cyclobutyl group, cyclopentyl group, cyclohexyl group, cycloheptyl group and cyclooctyl group, an adamantyl group, a norbornyl group, a bornyl group, a camphenyl group, a decahydronaphthyl group, a tricyclodecanyl group, a tetracyclodecanyl group, a camphoroyl group, a dicyclohexyl group and a pinenyl group. These groups may have a substituent. The upper limit of the carbon number of the cyclic aliphatic group is preferably 15 or less, more preferably 12 or less.

In the case where the acyclic hydrocarbon group or cyclic aliphatic group has a substituent, examples of the substituent include a halogen atom such as fluorine atom, chlorine atom, bromine atom and iodine atom, an alkoxy group such as methoxy group, ethoxy group and tert-butoxy group, an aryloxy group such as phenoxy group and p-tolyloxy group, an alkylthioxy group such as methylthioxy group, ethylthioxy group and tert-butylthioxy group, an arylthioxy group such as phenylthioxy group and p-tolylthioxy group, an alkoxycarbonyl group such as methoxycarbonyl group, butoxycarbonyl group and phenoxycarbonyl group, an acetoxy group, a linear or branched alkyl group such as methyl group, ethyl group, propyl group, butyl group, heptyl group, hexyl group, dodecyl group and 2-ethylhexyl group, a cyclic alkyl group such as cyclohexyl group, an alkenyl group such as vinyl group, propenyl group and hexenyl group, an acetylene group, an alkynyl group such as propynyl group and hexynyl group, an aryl group such as phenyl group and tolyl group, a hydroxy group, a carboxy group, a sulfonic acid group, a carbonyl group and a cyano group.

Specific examples of the cyclic aliphatic group and acyclic hydrocarbon group as A are illustrated below.

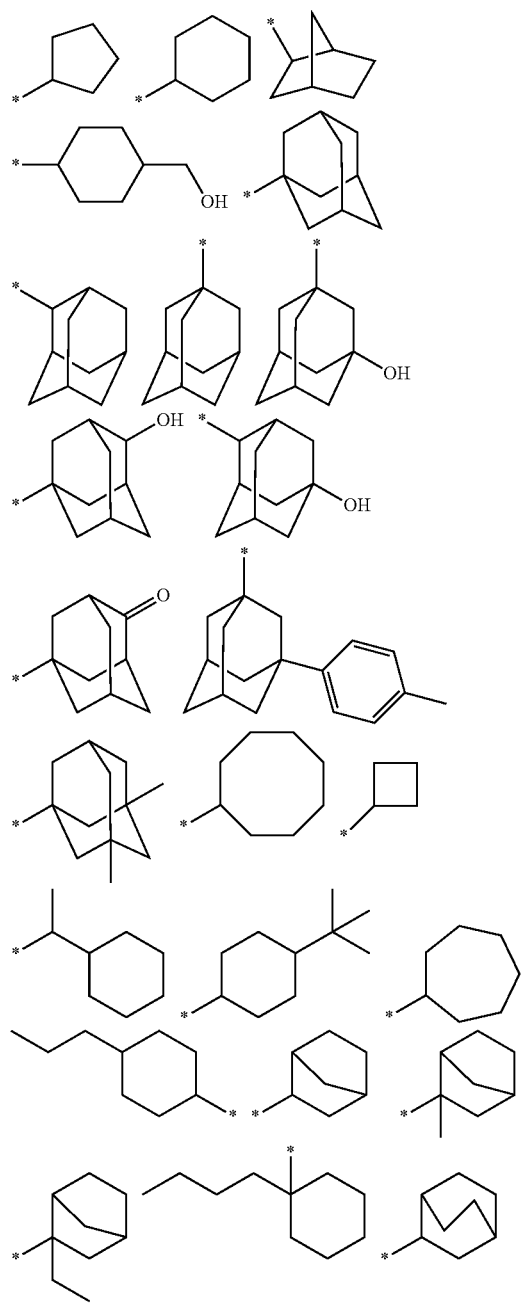

-continued

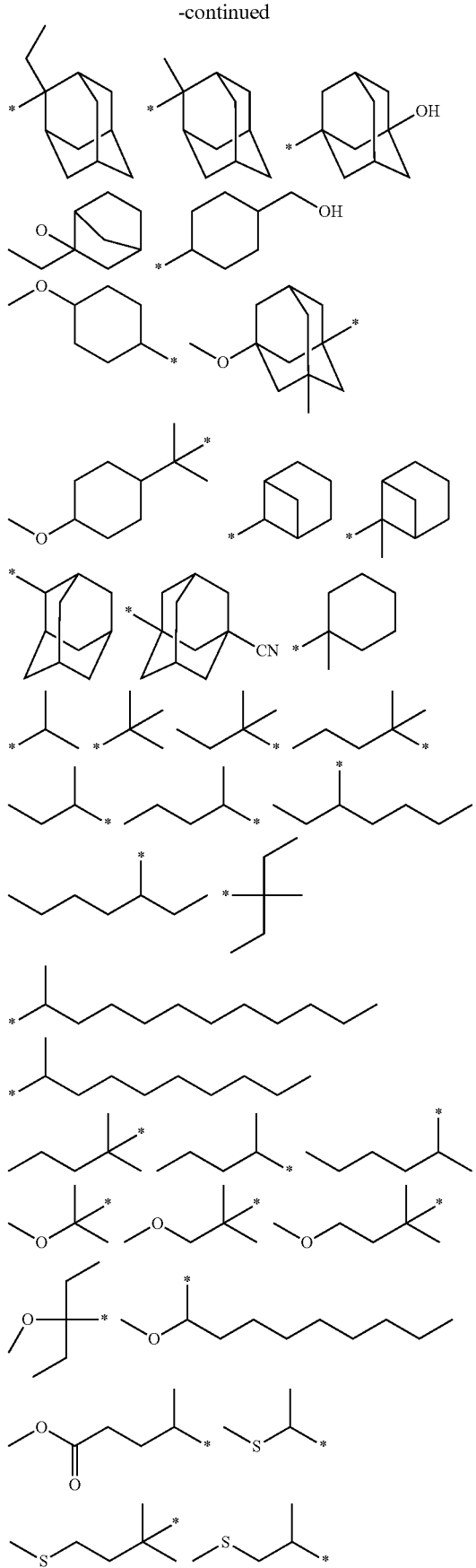

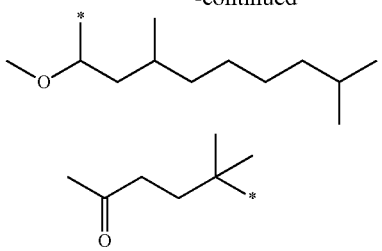

Among these, the following structures are preferred in view of suppressing the acid diffusion.

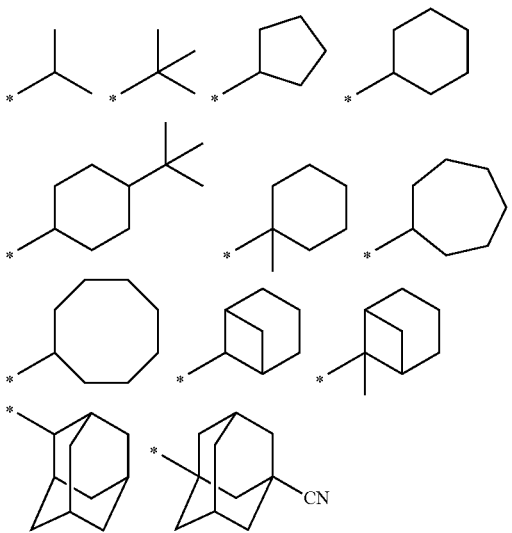

p represents an integer of 0 or more, and the upper limit thereof is not particularly limited as long as it is a chemically possible number. From the standpoint of suppressing the acid diffusion, p is an integer of usually from 0 to 5, preferably from 1 to 4, more preferably 2 or 3, and most preferably 3.

In view of suppressing the acid diffusion, the A group is preferably substituted on at least one o-position, more preferably on two o-positions, with respect to the sulfonic acid group.

In one embodiment, the acid generator for use in the present invention is a compound capable of generating an acid represented by the following formula (BII):

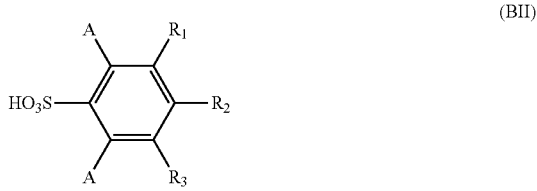

In the formula, A has the same meaning as A in formula (BI), and two A's may be the same or different. Each of $R_1$ to $R_3$ independently represents a hydrogen atom, a hydrocarbon group-containing group, a halogen atom, a hydroxyl group, a cyano group or a nitro group. Specific examples of the hydrocarbon group-containing group are the same as the groups exemplified above.

The acid generator is preferably a compound capable of generating a sulfonic acid represented by the following formula (I). The sulfonic acid represented by formula (I) has a cyclic organic group and therefore, for the same reason as above, the performance in terms of resolution and roughness can be more improved.

Accordingly, in the case where the acid generator is, for example, a compound represented by formula (ZI) or (ZII), the aromatic sulfonate anion is preferably an anion capable of producing an acid represented by the following formula (I):

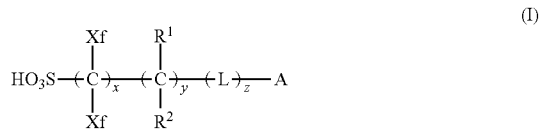

In the formula, each Xf independently represents a fluorine atom or an alkyl group substituted with at least one fluorine atom.

Each of $R^1$ and $R^2$ independently represents a hydrogen atom, a fluorine atom or an alkyl group, and when a plurality of $R^1$s or $R^2$s are present, each $R^1$ or $R^2$ may be the same as or different from every other $R^1$ or $R^2$.

L represents a divalent linking group, and when a plurality of Ls are present, each L may be the same as or different from every other L.

A represents a cyclic organic group.

x represents an integer of 1 to 20, y represents an integer of 0 to 10, and z represents an integer of 0 to 10.

Formula (I) is described in more detail below.

The alkyl group in the fluorine atom-substituted alkyl group of Xf is preferably an alkyl group having a carbon number of 1 to 10, more preferably a carbon number of 1 to 4. Also, the fluorine atom-substituted alkyl group of Xf is preferably a perfluoroalkyl group.

Xf is preferably a fluorine atom or a perfluoroalkyl group having a carbon number of 1 to 4. Specific examples of Xf include a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$, with a fluorine atom and $CF_3$ being preferred. In particular, it is preferred that both Xfs are a fluorine atom.

The alkyl group of $R^1$ and $R^2$ may have a substituent (preferably fluorine atom) and is preferably an alkyl group having a carbon number of 1 to 4, more preferably a perfluoroalkyl group having a carbon number of 1 to 4. Specific examples of the alkyl group having a substituent of $R^1$ and $R^2$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$, with $CF_3$ being preferred.

Each of $R^1$ and $R^2$ is preferably a fluorine atom or $CF_3$.

y is preferably from 0 to 4, more preferably 0. x is preferably from 1 to 8, more preferably from 1 to 4, still more preferably 1. z is preferably from 0 to 8, more preferably from 0 to 4.

The divalent linking group of L is not particularly limited and includes —COO—, —OCO—, —CONR— (wherein R represents a hydrogen atom, an alkyl group or a cycloalkyl group), —CO—, —O—, —S—, —SO—, —SO₂—, an alkylene group, a cycloalkylene group, an alkenylene group, and a linking group formed by combining a plurality of these members, and a linking group having a total carbon number of 12 or less is preferred. Above all, —COO—, —OCO—, —CONR—, —CO—, —O— and —SO$_2$— are preferred, and —COO—, —OCO— and —SO$_2$— are more preferred.

The cyclic organic group of A is not particularly limited as long as it has a cyclic structure, and examples thereof include an alicyclic group, an aryl group and a heterocyclic group (including not only those having aromaticity but also those having no aromaticity; including, for example, tetrahydropyran ring and lactone ring structures).

The alicyclic group may be monocyclic or polycyclic and is preferably a monocyclic cycloalkyl group such as cyclopentyl group, cyclohexyl group and cyclooctyl group, or a polycyclic cycloalkyl group such as norbornyl group, tricyclodecanyl group, tetracyclodecanyl group, tetracyclododecanyl group and adamantyl group. Above all, an alicyclic group having a bulky structure with a carbon number of 7 or more, such as norbornyl group, tricyclodecanyl group, tetracyclodecanyl group, tetracyclododecanyl group and adamantyl group, is preferred from the standpoint that the diffusion in the film at the PEB (post-exposure baking) step can be suppressed and MEEF (mask error enhancement factor) can be improved.

The aryl group may be monocyclic or polycyclic and includes a benzene ring, a naphthalene ring, a phenanthrene ring and an anthracene ring. Among these, naphthalene having low absorbance is preferred in view of absorbance for light at 193 nm.

The heterocyclic group may be monocyclic or polycyclic and includes those derived from a furan ring, a thiophene ring, a benzofuran ring, a benzothiophene ring, a dibenzofuran ring, a dibenzothiophene ring, a pyridine ring and a decahydroisoquinoline ring. In particular, those derived from a furan ring, a thiophene ring, a pyridine ring and a decahydroisoquinoline ring are preferred.

The cyclic organic group also includes a lactone structure.

The above-described cyclic organic group may have a substituent, and examples of the substituent include an alkyl group (may be either linear or branched, preferably having a carbon number of 1 to 12), a cycloalkyl group (may be any of monocyclic, polycyclic or spirocyclic, preferably having a carbon number of 3 to 20), an aryl group (preferably having a carbon number of 6 to 14), a hydroxyl group, an alkoxy group, an ester group, an amide group, a urethane group, a ureido group, a thioether group, a sulfonamido group, and a sulfonic acid ester group. Incidentally, the carbon constituting the cyclic organic group (the carbon contributing to ring formation) may be carbonyl carbon.

Examples of the organic group represented by $R_{201}$, $R_{202}$ and $R_{203}$ include corresponding groups in the later-described compounds (ZI-1), (ZI-2), (ZI-3) and (ZI-4).

The compound may be a compound having a plurality of structures represented by formula (ZI). For example, the compound may be a compound having a structure where at least one of $R_{201}$ to $R_{203}$ in a compound represented by formula (ZI) is bonded to at least one of $R_{201}$ to $R_{203}$ in another compound represented by formula (ZI) through a single bond or a linking group.

Compounds (ZI-1), (ZI-2), (ZI-3) and (ZI-4) described below are more preferred as the component (ZI).

The compound (ZI-1) is an arylsulfonium compound where at least one of $R_{201}$ to $R_{203}$ in formula (ZI) is an aryl group, that is, a compound having an arylsulfonium as the cation.

In the arylsulfonium compound, all of $R_{201}$ to $R_{203}$ may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound and an aryldicycloalkylsulfonium compound.

The aryl group in the arylsulfonium compound is preferably a phenyl group or a naphthyl group, more preferably a phenyl group. The aryl group may be an aryl group having a heterocyclic structure containing an oxygen atom, a nitrogen atom, a sulfur atom or the like. Examples of the heterocyclic structure include a pyrrole residue group, a furan residue group, a thiophene residue group, an indole residue group, a benzofuran residue group and a benzothiophene residue group. In the case where the arylsulfonium compound has two or more aryl groups, these two or more aryl groups may be the same or different.

The alkyl or cycloalkyl group which is contained, if desired, in the arylsulfonium compound is preferably a linear or branched alkyl group having a carbon number of 1 to 15 or a cycloalkyl group having a carbon number of 3 to 15, and examples thereof include a methyl group, an ethyl group, a propyl group, an n-butyl group, a sec-butyl group, a tert-butyl group, a cyclopropyl group, a cyclobutyl group and a cyclohexyl group.

The aryl group, alkyl group and cycloalkyl group of $R_{201}$ to $R_{203}$ may have, as the substituent, an alkyl group (for example, having a carbon number of 1 to 15), a cycloalkyl group (for example, having a carbon number of 3 to 15), an aryl group (for example, having a carbon number of 6 to 14), an alkoxy group (for example, having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4, or an alkoxy group having a carbon number of 1 to 4. The substituent may be substituted on any one of three members $R_{201}$ to $R_{203}$ or may be substituted on all of these three members. In the case where $R_{201}$ to $R_{203}$ are an aryl group, the substituent is preferably substituted at the p-position of the aryl group.

The compound (ZI-2) is described below.

The compound (ZI-2) is a compound where each of $R_{201}$ to $R_{203}$ in formula (ZI) independently represents an aromatic ring-free organic group. The aromatic ring as used herein includes an aromatic ring containing a heteroatom.

The aromatic ring-free organic group as $R_{201}$ to $R_{203}$ has a carbon number of generally from 1 to 30, preferably from 1 to 20.

Each of $R_{201}$ to $R_{203}$ independently represents preferably an alkyl group, a cycloalkyl group, an allyl group or a vinyl group, more preferably a linear or branched 2-oxoalkyl group, a 2-oxocycloalkyl group or an alkoxycarbonylmethyl group, still more preferably a linear or branched 2-oxoalkyl group.

The alkyl group and cycloalkyl group of $R_{201}$ to $R_{203}$ are preferably a linear or branched alkyl group having a carbon number of 1 to 10 (e.g., methyl, ethyl, propyl, butyl, pentyl), and a cycloalkyl group having a carbon number of 3 to 10 (e.g., cyclopentyl, cyclohexyl, norbornyl). The alkyl group is more preferably a 2-oxoalkyl group or an alkoxycarbonylmethyl group. The cycloalkyl group is more preferably a 2-oxocycloalkyl group.

The 2-oxoalkyl group may be either linear or branched and is preferably a group having >C=O at the 2-position of the above-described alkyl group.

The 2-oxocycloalkyl group is preferably a group having >C=O at the 2-position of the above-described cycloalkyl group.

The alkoxy group in the alkoxycarbonylmethyl group is preferably an alkoxy group having a carbon number of 1 to 5 (e.g., methoxy, ethoxy, propoxy, butoxy, pentoxy).

$R_{201}$ to $R_{203}$ may be further substituted with a halogen atom, an alkoxy group (for example, having a carbon number of 1 to 5), a hydroxyl group, a cyano group or a nitro group.

The compound (ZI-3) is described below.

The compound (ZI-3) is a compound represented by the following formula (ZI-3), and this is a compound having a phenacylsulfonium salt structure.

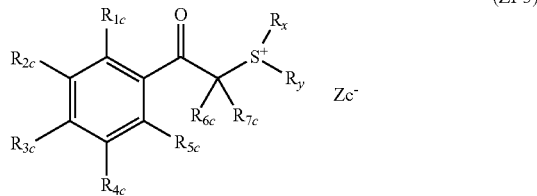

(ZI-3)

In formula (ZI-3), each of $R_{1c}$ to $R_{5c}$ independently represents a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group or an arylthio group.

Each of $R_{6c}$ and $R_{7c}$ independently represents a hydrogen atom, an alkyl group, a cycloalkyl group, a halogen atom, a cyano group or an aryl group.

Each of $R_x$ and $R_y$ independently represents an alkyl group, a cycloalkyl group, a 2-oxoalkyl group, a 2-oxocycloalkyl group, an alkoxycarbonylalkyl group, an allyl group or a vinyl group.

Any two or more members out of $R_{1c}$ to $R_{5c}$, a pair of $R_{5c}$ and $R_{6c}$, a pair of $R_{6c}$ and $R_{7c}$, a pair of $R_{5c}$ and $R_x$, or a pair of $R_x$ and $R_y$, may combine together to form a ring structure. This ring structure may contain an oxygen atom, a sulfur atom, a ketone group, an ester bond or an amide bond.

The ring structure includes an aromatic or non-aromatic hydrocarbon ring, an aromatic or non-aromatic heterocyclic ring, and a polycyclic condensed ring formed by combining two or more of these rings. The ring structure includes a 3- to 10-membered ring and is preferably a 4- to 8-membered ring, more preferably a 5- or 6-membered ring.

Examples of the group formed by combining any two or more members out of $R_{1c}$ to $R_{5c}$, a pair of $R_{6c}$ and $R_{7c}$, or a pair of $R_x$ and $R_y$ include a butylene group and a pentylene group.

The group formed by combining a pair of $R_{5c}$ and $R_{6c}$ or a pair of $R_{5c}$ and $R_x$ is preferably a single bond or an alkylene group, and examples of the alkylene group include a methylene group and an ethylene group.

$Z_c^-$ represents a non-nucleophilic anion, and examples thereof are the same as those of the non-nucleophilic anion of $Z^-$ in formula (ZI).

The alkyl group as $R_{1c}$ to $R_{7c}$ may be either linear or branched and is, for example, an alkyl group having a carbon number of 1 to 20, preferably a linear or branched alkyl group having a carbon number of 1 to 12 (e.g., methyl, ethyl, linear or branched propyl, linear or branched butyl, linear or branched pentyl). The cycloalkyl group is, for example, a cycloalkyl group having a carbon number of 3 to 10 (e.g., cyclopentyl, cyclohexyl).

The aryl group as $R_{1c}$ to $R_{5c}$ is preferably an aryl group having a carbon number of 5 to 15, and examples thereof include a phenyl group and a naphthyl group.

The alkoxy group as $R_{1c}$ to $R_{5c}$ may be linear, branched or cyclic and is, for example, an alkoxy group having a carbon number of 1 to 10, preferably a linear or branched alkoxy group having a carbon number of 1 to 5 (e.g., methoxy, ethoxy, linear or branched propoxy, linear or branched butoxy, linear or branched pentoxy), or a cyclic alkoxy group having a carbon number of 3 to 10 (e.g., cyclopentyloxy, cyclohexyloxy).

Specific examples of the alkoxy group in the alkoxycarbonyl group of $R_{1c}$ to $R_{5c}$ are the same as specific examples of the alkoxy group of $R_{1c}$ to $R_{5c}$.

Specific examples of the alkyl group in the alkylcarbonyloxy group and alkylthio group of $R_{1c}$ to $R_{5c}$ are the same as specific examples of the alkyl group of $R_{1c}$ to $R_{5c}$.

Specific examples of the cycloalkyl group in the cycloalkylcarbonyloxy group of $R_{1c}$ to $R_{5c}$ are the same as specific examples of the cycloalkyl group of $R_{1c}$ to $R_{5c}$.

Specific examples of the aryl group in the aryloxy group and arylthio group of $R_{1c}$ to $R_{5c}$ are the same as specific examples of the aryl group of $R_{1c}$ to $R_{5c}$.

A compound where any one of $R_{1c}$ to $R_{5c}$ is a linear or branched alkyl group, a cycloalkyl group or a linear, branched or cyclic alkoxy group is preferred, and a compound where the sum of carbon numbers of $R_{1c}$ to $R_{5c}$ is from 2 to 15 is more preferred. Thanks to such a compound, the solvent solubility is more enhanced and production of particles during storage can be suppressed.

The ring structure which may be formed by combining any two or more members out of $R_{1c}$ to $R_{5c}$ with each other is preferably a 5- or 6-membered ring, more preferably a 6-membered ring (for example, phenyl ring).

The ring structure which may be formed by combining $R_{5c}$ and $R_{6c}$ with each other includes a 4- or higher-membered ring (preferably a 5- or 6-membered ring) formed together with the carbonyl carbon atom and carbon atom in formula (I) by combining $R_{5c}$ and $R_{6c}$ with each other to constitute a single bond or an alkylene group (e.g., methylene, ethylene).

The aryl group as $R_{6c}$ and $R_{7c}$ is preferably an aryl group having a carbon number of 5 to 15, and examples thereof include a phenyl group and a naphthyl group.

An embodiment where both $R_{6c}$ and $R_{7c}$ are an alkyl group is preferred, an embodiment where each of $R_{6c}$ and $R_{7c}$ is a linear or branched alkyl group having a carbon number of 1 to 4 is more preferred, and an embodiment where both are a methyl group is still more preferred.

In the case where $R_{6c}$ and $R_{7c}$ are combined to form a ring, the group formed by combining $R_{6c}$ and $R_{7c}$ is preferably an alkylene group having a carbon number of 2 to 10, and examples thereof include an ethylene group, a propylene group, a butylene group, a pentylene group and a hexylene group. Also, the ring formed by combining $R_{6c}$ and $R_{7c}$ may contain a heteroatom such as oxygen atom in the ring.

Examples of the alkyl group and cycloalkyl group as $R_x$ and $R_y$ are the same as those of the alkyl group and cycloalkyl group in $R_{1c}$ to $R_{7c}$.

Examples of the 2-oxoalkyl group and 2-oxocycloalkyl group as $R_x$ and $R_y$ include a group having >C=O at the 2-position of the alkyl group or cycloalkyl group of $R_{1c}$ to $R_{7c}$.

Examples of the alkoxy group in the alkoxycarbonylalkyl group as $R_x$ and $R_y$ are the same as those of the alkoxy group of $R_{1c}$ to $R_{5c}$. The alkyl group is, for example, an alkyl group having a carbon number of 1 to 12, preferably a linear alkyl group having a carbon number of 1 to 5 (e.g., methyl, ethyl).

The allyl group as $R_x$ and $R_y$ is not particularly limited but is preferably an unsubstituted allyl group or an allyl group substituted with a monocyclic or polycyclic cycloalkyl group (preferably a cycloalkyl group having a carbon number of 3 to 10).

The vinyl group as $R_x$ and $R_y$ is not particularly limited but is preferably an unsubstituted vinyl group or a vinyl group substituted with a monocyclic or polycyclic cycloalkyl group (preferably a cycloalkyl group having a carbon number of 3 to 10).

The ring structure which may be formed by combining $R_{5c}$ and $R_x$ with each other includes a 5- or higher-membered ring (preferably a 5-membered ring) formed together with the sulfur atom and carbonyl carbon atom in formula (I) by combining $R_{5c}$ and $R_x$ with each other to constitute a single bond or an alkylene group (e.g., methylene, ethylene).

The ring structure which may be formed by combining $R_x$ and $R_y$ with each other includes a 5- or 6-membered ring, preferably a 5-membered ring (i.e., tetrahydrothiophene ring), formed by divalent $R_x$ and $R_y$ (for example, a methylene group, an ethylene group or a propylene group) together with the sulfur atom in formula (ZI-3).

Each of $R_x$ and $R_y$ is an alkyl or cycloalkyl group having a carbon number of preferably 4 or more, more preferably 6 or more, still more preferably 8 or more.

$R_{1c}$ to $R_{7c}$, $R_x$ and $R_y$ may further have a substituent, and examples of the substituent include a halogen atom (e.g., fluorine), a hydroxyl group, a carboxyl group, a cyano group, a nitro group, an alkyl group, a cycloalkyl group, an aryl group, an alkoxy group, an aryloxy group, an acyl group, an arylcarbonyl group, an alkoxyalkyl group, an aryloxyalkyl group, an alkoxycarbonyl group, an aryloxycarbonyl group, an alkoxycarbonyloxy group and an aryloxycarbonyloxy group.

In formula (ZI-3), it is more preferred that each of $R_{1c}$, $R_{2c}$, $R_{4c}$ and $R_{5c}$ independently represents a hydrogen atom and $R_{3c}$ represents a group except for hydrogen atom, that is, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group or an arylthio group.

Specific examples of the cation of the compound represented by formula (ZI-2) or (ZI-3) for use in the present invention are illustrated below.

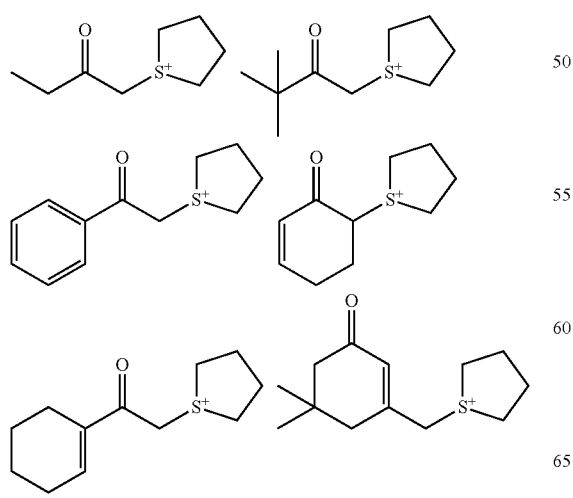

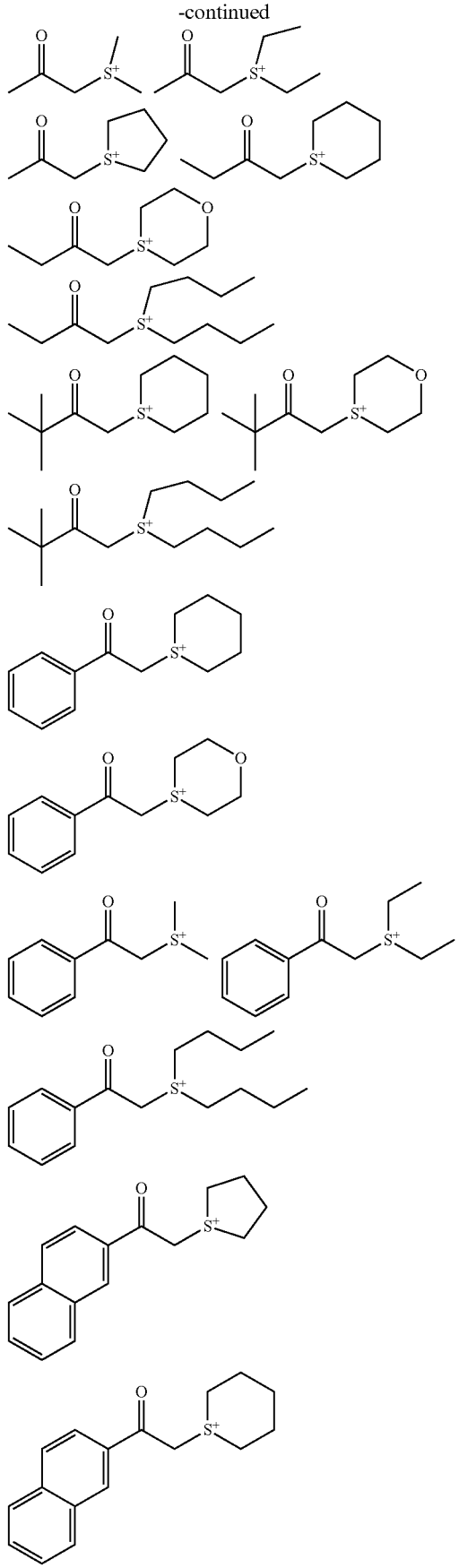

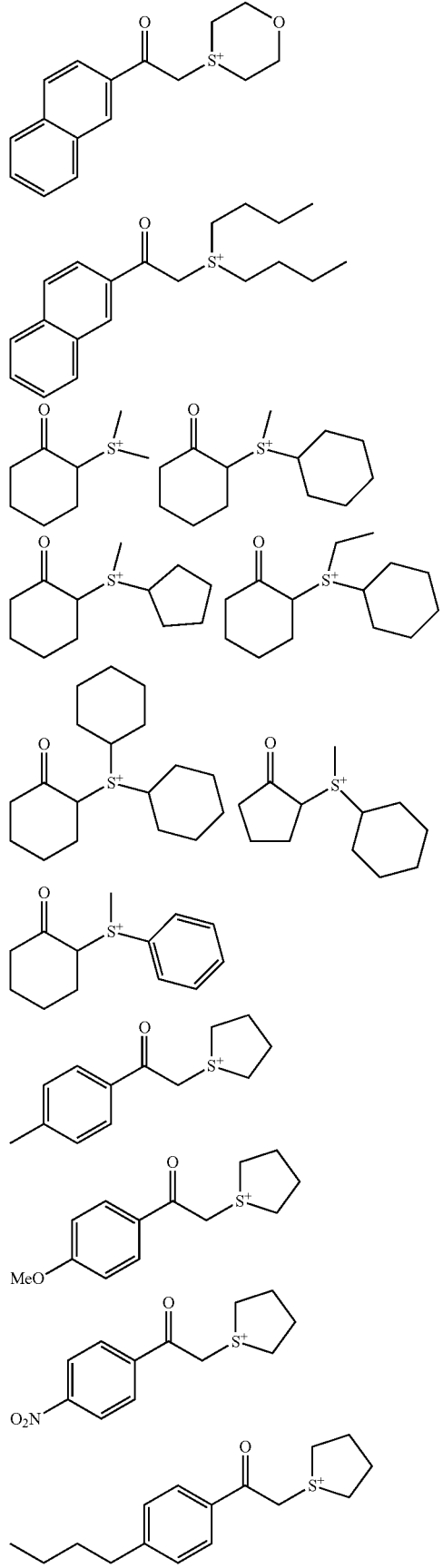
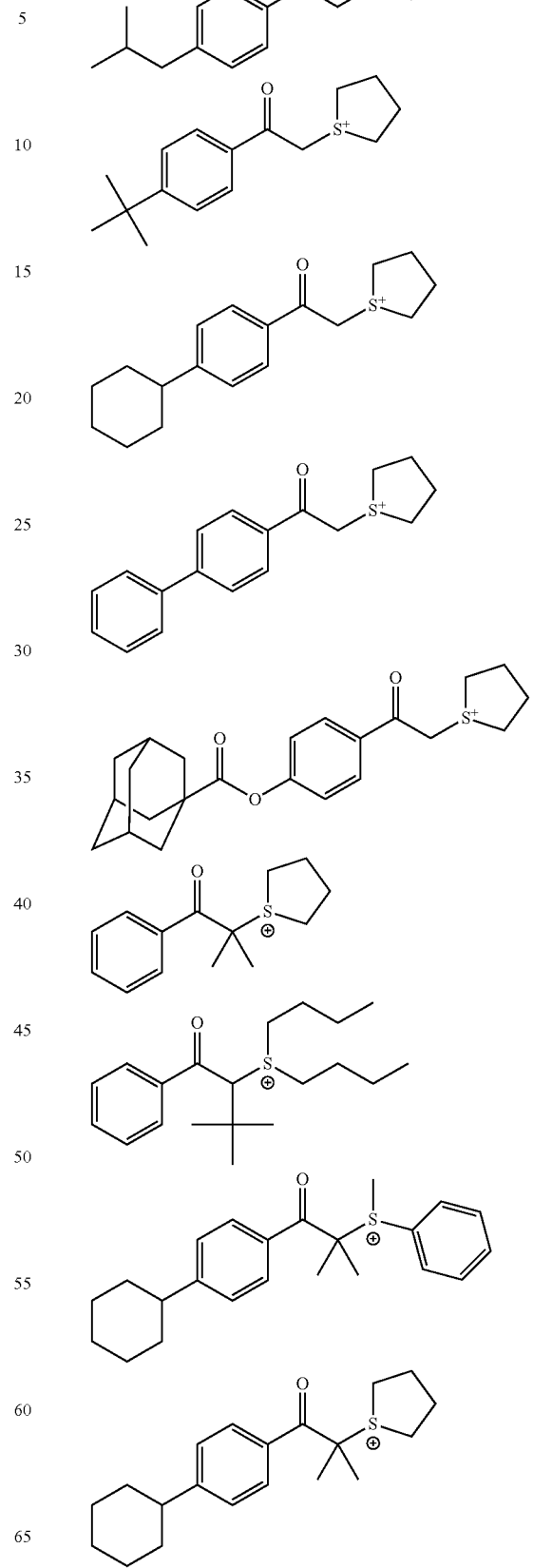

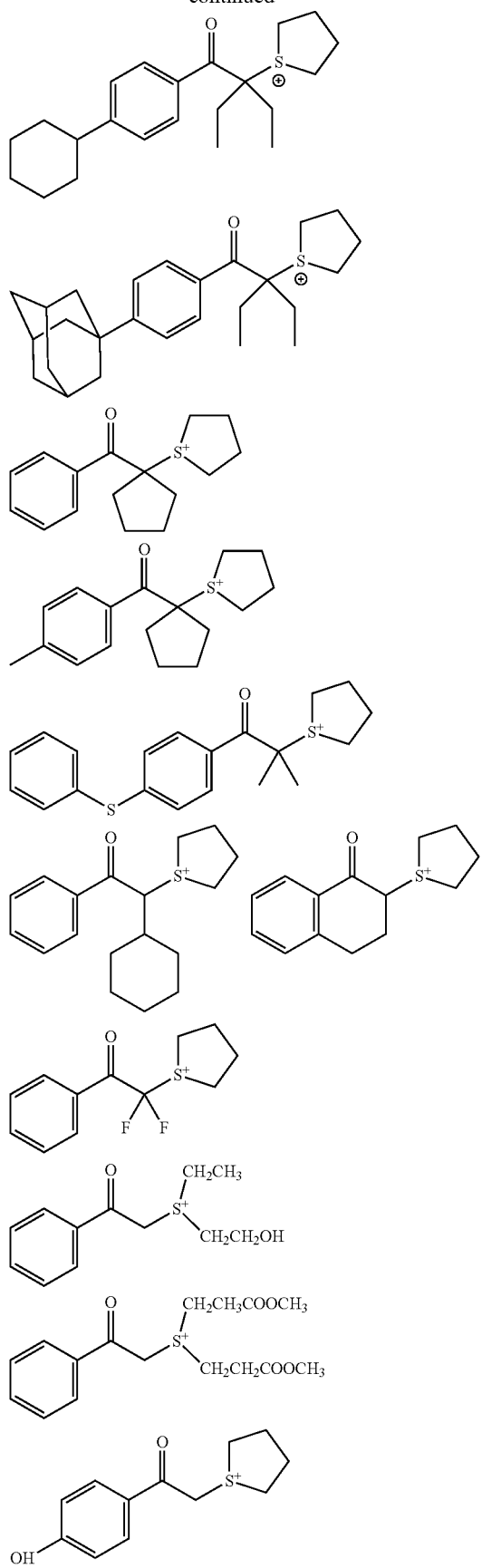
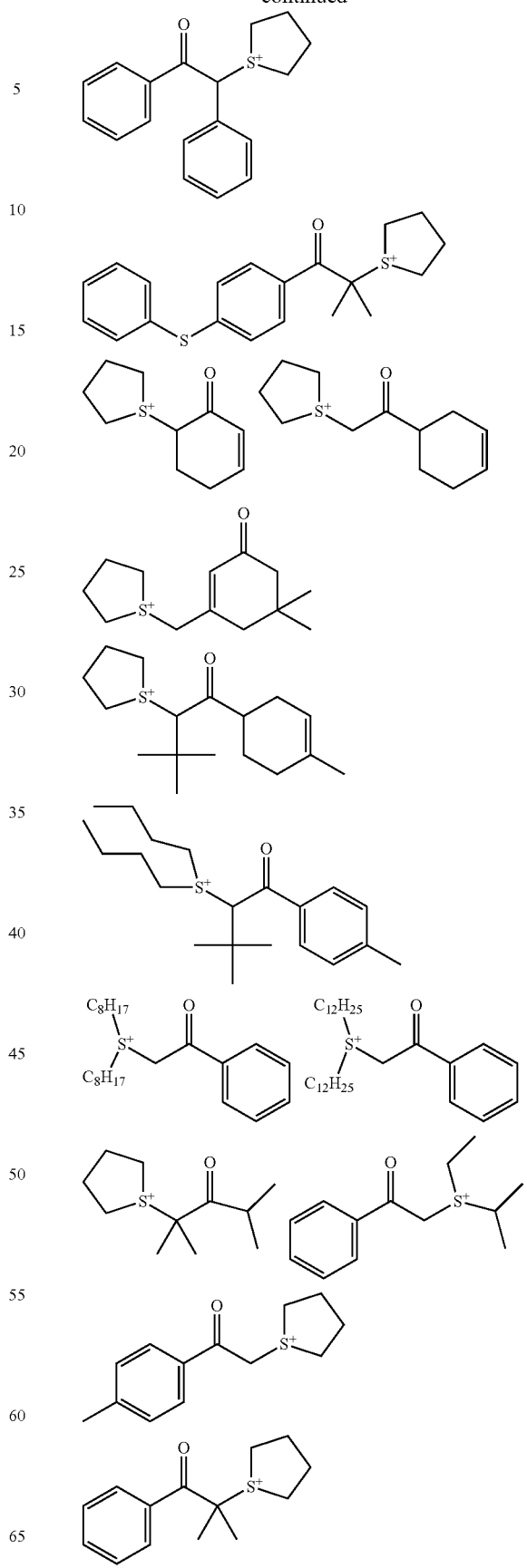

-continued

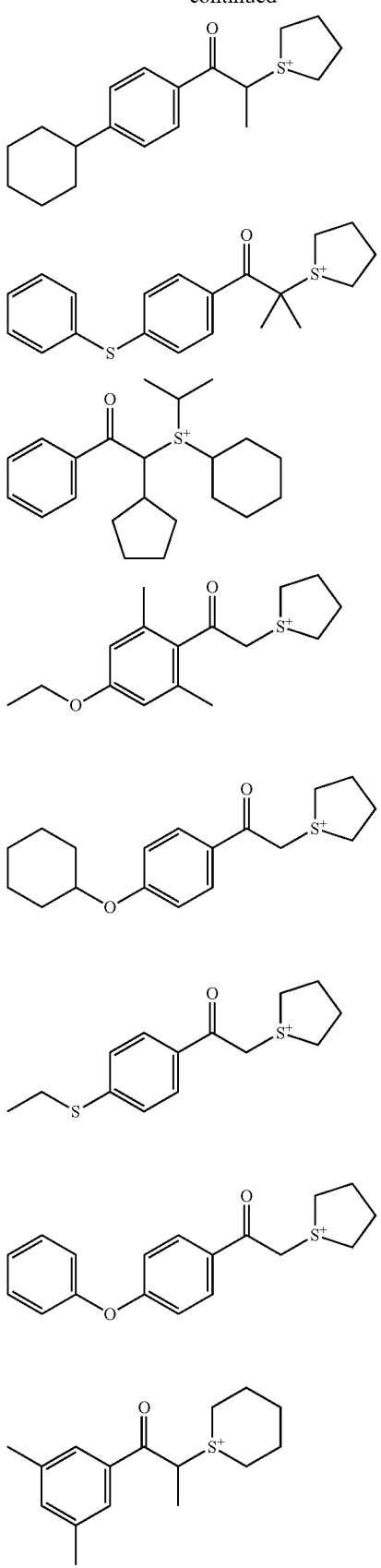

The compound (ZI-4) is described below.
The compound (ZI-4) is represented by the following formula (ZI-4):

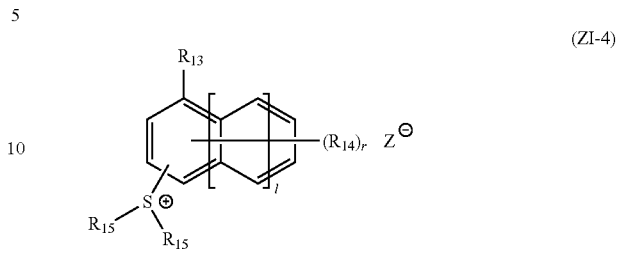

In formula (ZI-4), $R_{13}$ represents a hydrogen atom, a fluorine atom, a hydroxyl group, an alkyl group, a cycloalkyl group, an alkoxy group, an alkoxycarbonyl group, or a group having a cycloalkyl group. These groups may have a substituent.

$R_{14}$ represents, when a plurality of $R_{14}$s are present, each independently represents, a hydroxyl group, an alkyl group, a cycloalkyl group, an alkoxy group, an alkoxycarbonyl group, an alkylcarbonyl group, an alkylsulfonyl group, a cycloalkylsulfonyl group, or a group having a cycloalkyl group. These groups may have a substituent.

Each $R_{15}$ independently represents an alkyl group, a cycloalkyl group or a naphthyl group. Two $R_{15}$s may combine with each other to form a ring. These groups may have a substituent.

l represents an integer of 0 to 2.
r represents an integer of 0 to 8.
$Z^-$ represents a non-nucleophilic anion, and examples thereof are the same as those of the non-nucleophilic anion of $Z^-$ in formula (ZI).

In formula (ZI-4), the alkyl group of $R_{13}$, $R_{14}$ and $R_{15}$ is a linear or branched alkyl group preferably having a carbon number of 1 to 10, and, for example, a methyl group, an ethyl group, an n-butyl group and a tert-butyl group are preferred.

The cycloalkyl group of $R_{13}$, $R_{14}$ and $R_{15}$ includes a monocyclic or polycyclic cycloalkyl group (preferably a cycloalkyl group having a carbon number of 3 to 20) and is preferably cyclopropyl, cyclopentyl, cyclohexyl, cycloheptyl or cyclooctyl.

The alkoxy group of $R_{13}$ and $R_{14}$ is a linear or branched alkoxy group preferably having a carbon number of 1 to 10, and, for example, a methoxy group, an ethoxy group, an n-propoxy group and an n-butoxy group are preferred.

The alkoxycarbonyl group of $R_{13}$ and $R_{14}$ is a linear or branched alkoxycarbonyl group preferably having a carbon number of 2 to 11, and, for example, a methoxycarbonyl group, an ethoxycarbonyl group and an n-butoxycarbonyl group are preferred.

The cycloalkyl group-containing group of $R_{13}$ and $R_{14}$ includes a monocyclic or polycyclic cycloalkyl group (preferably a cycloalkyl group having a carbon number of 3 to 20), and examples thereof include a monocyclic or polycyclic cycloalkyloxy group and an alkoxy group containing a monocyclic or polycyclic cycloalkyl group. These groups may further have a substituent.

The monocyclic or polycyclic cycloalkyloxy group of $R_{13}$ and $R_{14}$ preferably has a total carbon number of 7 or more, more preferably a total carbon number of 7 to 15, and preferably has a monocyclic cycloalkyl group. The monocyclic cycloalkyloxy group having a total carbon number of 7 or more indicates a monocyclic cycloalkyloxy group where a cycloalkyloxy group such as cyclopropyloxy group, cyclobutyloxy group, cyclopentyloxy group, cyclohexyloxy group, cycloheptyloxy group, cyclooctyloxy group and cyclododecanyloxy group arbitrarily has a substituent such as alkyl group (e.g., methyl, ethyl, propyl, butyl, pentyl, hexyl, heptyl, octyl, dodecyl, 2-ethylhexyl, isopropyl, sec-butyl, tert-butyl, isoamyl), hydroxyl group, halogen atom (e.g., fluorine, chlorine, bromine, iodine), nitro group, cyano group, amido group, sulfonamido group, alkoxy group (e.g., methoxy, ethoxy, hydroxyethoxy, propoxy, hydroxypropoxy, butoxy), alkoxycarbonyl group (e.g., methoxycarbonyl, ethoxycarbonyl), acyl group (e.g., formyl, acetyl, benzoyl), acyloxy group (e.g., acetoxy, butyryloxy) and carboxy group and where the total carbon number inclusive of the carbon number of an arbitrary substituent on the cycloalkyl group is 7 or more.

Examples of the polycyclic cycloalkyloxy group having a total carbon number of 7 or more include a norbornyloxy group, a tricyclodecanyloxy group, a tetracyclodecanyloxy group and an adamantyloxy group.

The alkoxy group having a monocyclic or polycyclic cycloalkyl group of $R_{13}$ and $R_{14}$ preferably has a total carbon number of 7 or more, more preferably a total carbon number of 7 to 15, and is preferably alkoxy group having a monocyclic cycloalkyl group. The alkoxy group having a total carbon number of 7 or more and having a monocyclic cycloalkyl group indicates an alkoxy group where the above-described monocyclic cycloalkyl group which may have a substituent is substituted on an alkoxy group such as methoxy, ethoxy, propoxy, butoxy, pentyloxy, hexyloxy, heptoxy, octyloxy, dodecyloxy, 2-ethylhexyloxy, isopropoxy, sec-butoxy, tert-butoxy and isoamyloxy and where the total carbon number inclusive of the carbon number of the substituent is 7 or more. Examples thereof include a cyclohexylmethoxy group, a cyclopentylethoxy group and a cyclohexylethoxy group, with a cyclohexylmethoxy group being preferred.

Examples of the alkoxy group having a total carbon number of 7 or more and having a polycyclic cycloalkyl group include a norbornylmethoxy group, a norbornylethoxy group, a tricyclodecanylmethoxy group, a tricyclodecanylethoxy group, a tetracyclodecanylmethoxy group, a tetracyclodecanylethoxy group, an adamantylmethoxy group and an adamantylethoxy group, with a norbornylmethoxy group and a norbornylethoxy group being preferred.

Specific examples of the alkyl group in the alkylcarbonyl group of $R_{14}$ are the same as those of the alkyl group of $R_{13}$ to $R_{15}$ above.

The alkylsulfonyl group and cycloalkylsulfonyl group of $R_{14}$ are a linear, branched or cyclic alkylsulfonyl group preferably having a carbon number of 1 to 10, and, for example, a methanesulfonyl group, an ethanesulfonyl group, an n-propanesulfonyl group, an n-butanesulfonyl group, a cyclopentanesulfonyl group and a cyclohexanesulfonyl group are preferred.

Examples of the substituent which may be substituted on each of the groups above include a halogen atom (e.g., fluorine), a hydroxyl group, a carboxyl group, a cyano group, a nitro group, an alkoxy group, an alkoxyalkyl group, an alkoxycarbonyl group and an alkoxycarbonyloxy group.

The alkoxy group above includes, for example, a linear, branched or cyclic alkoxy group having a carbon number of 1 to 20, such as methoxy group, ethoxy group, n-propoxy group, i-propoxy group, n-butoxy group, 2-methylpropoxy group, 1-methylpropoxy group, tert-butoxy group, cyclopentyloxy group and cyclohexyloxy group.

The alkoxyalkyl group includes, for example, a linear, branched or cyclic alkoxyalkyl group having a carbon number of 2 to 21, such as methoxymethyl group, ethoxymethyl group, 1-methoxyethyl group, 2-methoxyethyl group, 1-ethoxyethyl group and 2-ethoxyethyl group.

The alkoxycarbonyl group includes, for example, a linear, branched or cyclic alkoxycarbonyl group having a carbon number of 2 to 21, such as methoxycarbonyl group, ethoxycarbonyl group, n-propoxycarbonyl group, i-propoxycarbonyl group, n-butoxycarbonyl group, 2-methylpropoxycarbonyl group, 1-methylpropoxycarbonyl group, tert-butoxycarbonyl group, cyclopentyloxycarbonyl group and cyclohexyloxycarbonyl group.

The alkoxycarbonyloxy group includes, for example, a linear, branched or cyclic alkoxycarbonyloxy group having a carbon number of 2 to 21, such as methoxycarbonyloxy group, ethoxycarbonyloxy group, n-propoxycarbonyloxy group, i-propoxycarbonyloxy group, n-butoxycarbonyloxy group, tert-butoxycarbonyloxy group, cyclopentyloxycarbonyloxy group and cyclohexyloxycarbonyloxy group.

The ring structure which may be formed by combining two $R_{15}$s with each other includes a 5- or 6-membered ring, preferably a 5-membered ring (i.e., tetrahydrothiophene ring), formed by two divalent $R_{15}$s together with the sulfur atom in formula (ZI-4) and may be fused with an aryl group or a cycloalkyl group. This divalent $R_{15}$ may have a substituent, and examples of the substituent include a hydroxyl group, a carboxyl group, a cyano group, a nitro group, an alkyl group, a cycloalkyl group, an alkoxy group, an alkoxyalkyl group, an alkoxycarbonyl group and an alkoxycarbonyloxy group. A plurality of substituents may be substituted on the ring structure, and these substituents may combine with each other to form a ring (for example, an aromatic or non-aromatic hydrocarbon ring, an aromatic or non-aromatic heterocyclic ring, or a polycyclic condensed ring formed by combining two or more of such rings).

In formula (ZI-4), $R_{15}$ is preferably, for example, a methyl group, an ethyl group, a naphthyl group, or a divalent group capable of forming a tetrahydrothiophene ring structure together with the sulfur atom when two $R_{15}$s are combined with each other.

The substituent which may be substituted on $R_{13}$ and $R_{14}$ is preferably a hydroxyl group, an alkoxy group, an alkoxycarbonyl group, or a halogen atom (particularly fluorine atom).

l is preferably 0 or 1, more preferably 1.

r is preferably 0 to 2.

Specific examples of the cation in the compound represented by formula (ZI-4) for use in the present invention are illustrated below.

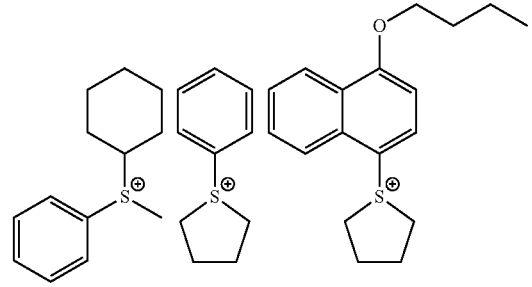

-continued
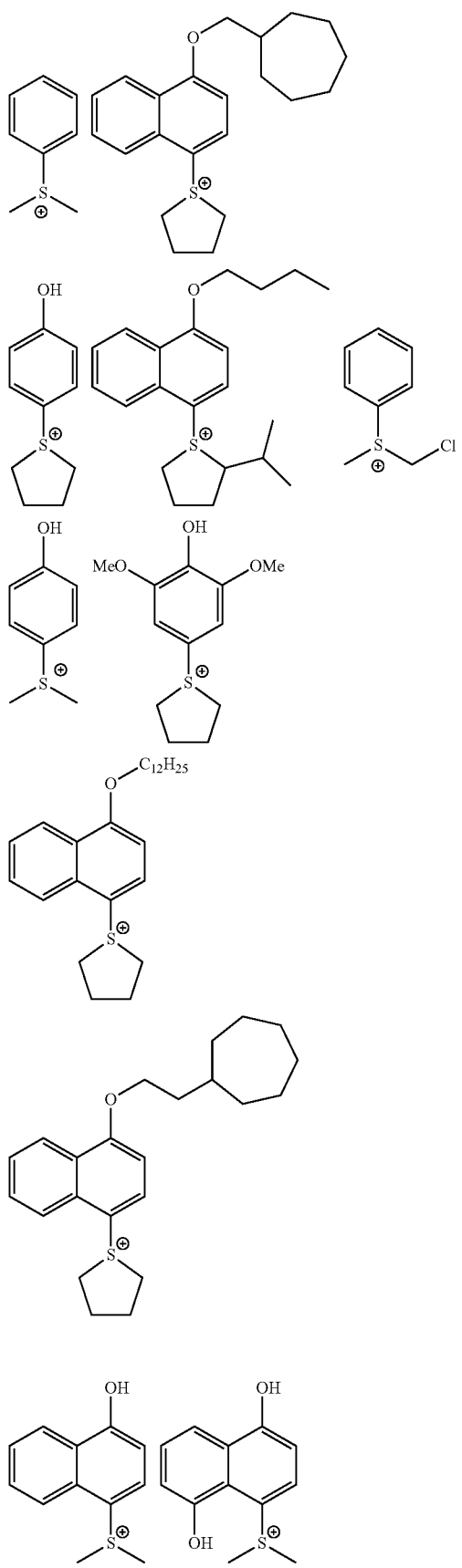
-continued
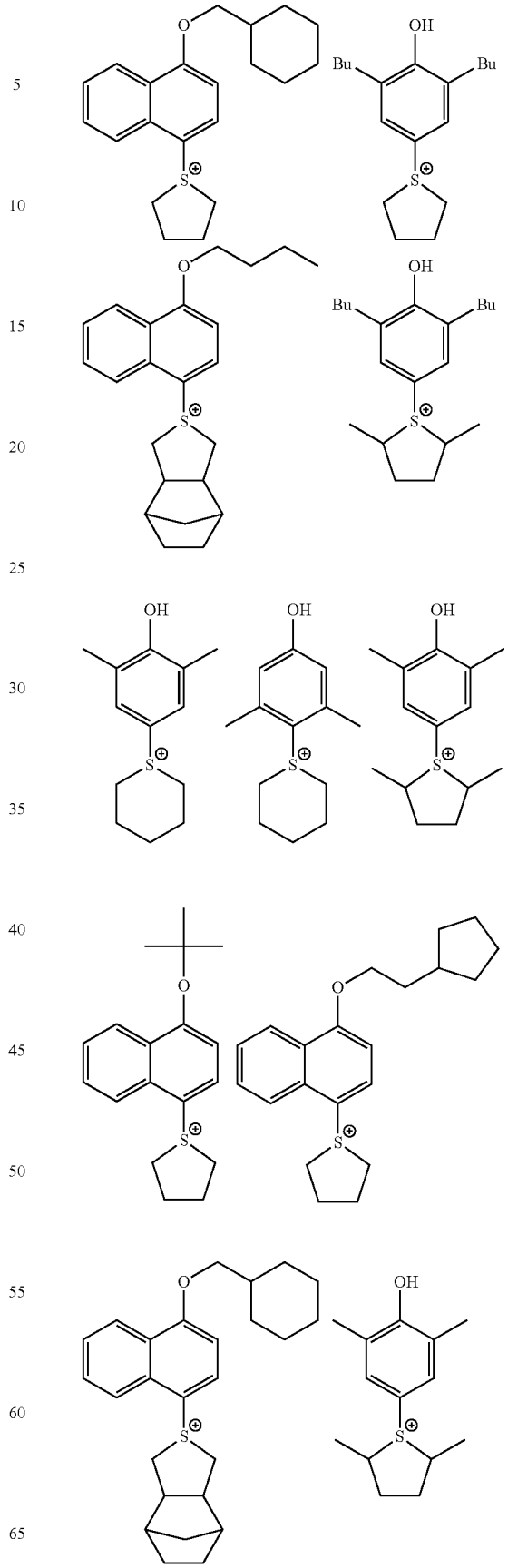

95
-continued
96
-continued
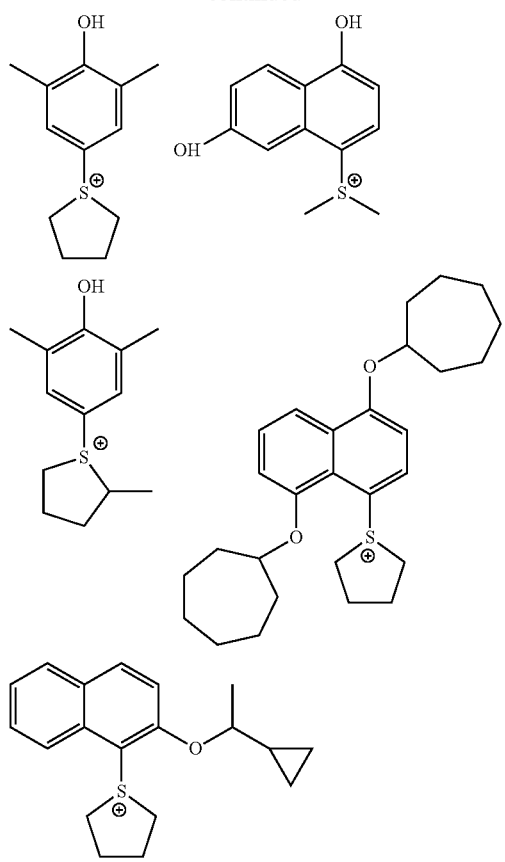
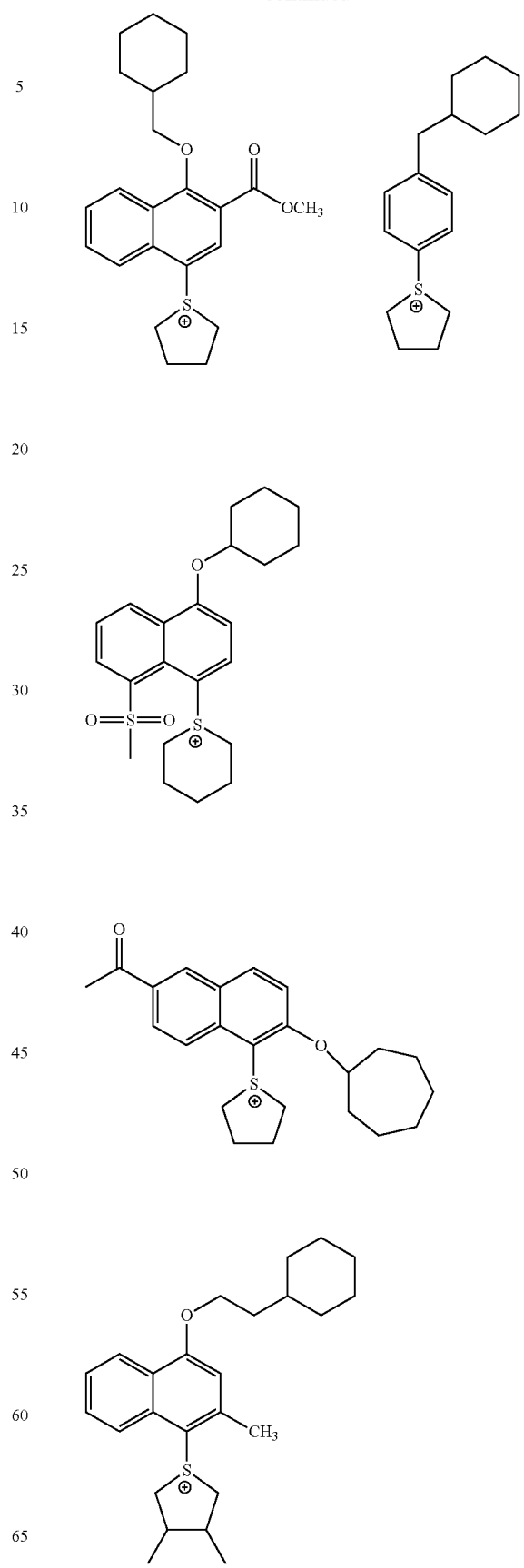

-continued

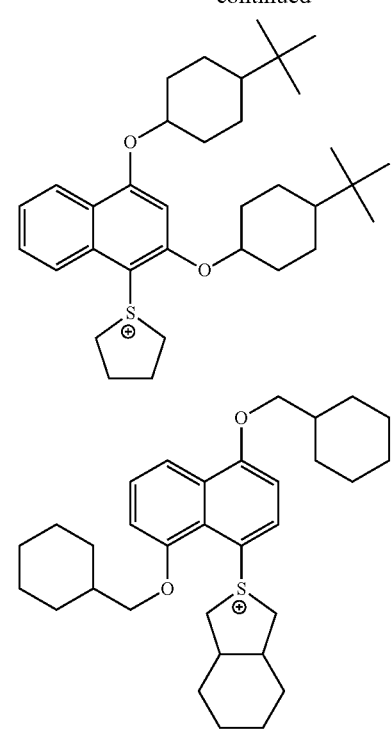

-continued

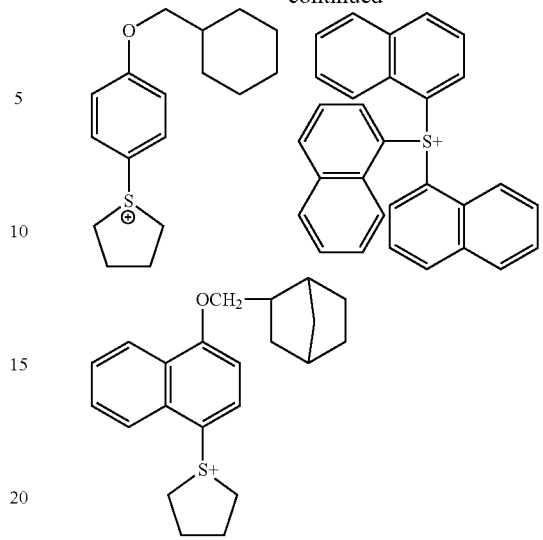

Formulae (ZII) and (ZIII) are described below.

In formulae (ZII) and (ZIII), each of $R_{204}$ to $R_{207}$ independently represents an aryl group, an alkyl group or a cycloalkyl group.

The aryl group of $R_{204}$ to $R_{207}$ is preferably a phenyl group or a naphthyl group, more preferably a phenyl group. The aryl group of $R_{204}$ to $R_{207}$ may be an aryl group having a heterocyclic structure containing an oxygen atom, a nitrogen atom, a sulfur atom or the like. Examples of the framework of the aryl group having a heterocyclic structure include pyrrole, furan, thiophene, indole, benzofuran and benzothiophene.

The alkyl group and cycloalkyl group of $R_{204}$ to $R_{207}$ are preferably a linear or branched alkyl group having a carbon number of 1 to 10 (e.g., methyl, ethyl, propyl, butyl, pentyl) and a cycloalkyl group having a carbon number of 3 to 10 (e.g., cyclopentyl, cyclohexyl, norbornyl).

The aryl group, alkyl group and cycloalkyl group of $R_{204}$ to $R_{207}$ may have a substituent. Examples of the substituent which may be substituted on the aryl group, alkyl group and cycloalkyl group of $R_{204}$ to $R_{207}$ include an alkyl group (for example, having a carbon number of 1 to 15), a cycloalkyl group (for example, having a carbon number of 3 to 15), an aryl group (for example, having a carbon number of 6 to 15), an alkoxy group (for example, having a carbon number of 1 to 15), a halogen atom, a hydroxyl group and a phenylthio group.

$Z^-$ represents a non-nucleophilic anion, and examples thereof the same as those of the non-nucleophilic anion of $Z^-$ in formula (ZI).

The acid generator further includes compounds represented by the following formulae (ZIV), (ZV) and (ZVI):

(ZIV)

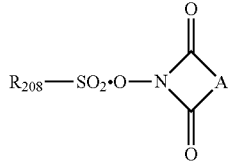
(ZV)

-continued

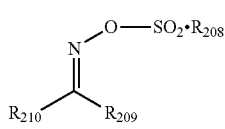
(ZVI)

In formulae (ZIV) to (ZVI), each of $Ar_3$ and $Ar_4$ independently represents an aryl group.

Each of $R_{208}$, $R_{209}$ and $R_{210}$ independently represents an alkyl group, a cycloalkyl group or an aryl group.

A represents an alkylene group, an alkenylene group or an arylene group.

Specific examples of the aryl group of $Ar_3$, $Ar_4$, $R_{208}$, $R_{209}$ and $R_{210}$ are the same as specific examples of the aryl group of $R_{201}$, $R_{202}$ and $R_{203}$ in formula (ZI-1).

Specific examples of the alkyl group and cycloalkyl group of $R_{208}$, $R_{209}$ and $R_{210}$ are the same as specific examples of the alkyl group and cycloalkyl group of $R_{201}$, $R_{202}$ and $R_{203}$ in formula (ZI-2).

The alkylene group of A includes an alkylene group having a carbon number of 1 to 12 (e.g., methylene, ethylene, propylene, isopropylene, butylene, isobutylene); the alkenylene group of A includes an alkenylene group having a carbon number of 2 to 12 (e.g., ethenylene, propenylene, butenylene); and the arylene group of A includes an arylene group having a carbon number of 6 to 10 (e.g., phenylene, tolylene, naphthylene).

Among the acid generators, more preferred are the compounds represented by formulae (ZI) to (ZIII).

The acid generator is preferably a compound capable of generating an acid having one sulfonic acid group or imide group, more preferably a compound capable of generating a monovalent perfluoroalkanesulfonic acid, a compound capable of generating an aromatic sulfonic acid substituted with a monovalent fluorine atom or a fluorine atom-containing group, or a compound capable of generating an imide acid substituted with a monovalent fluorine atom or a fluorine atom-containing group, still more preferably a sulfonium salt of fluoro-substituted alkanesulfonic acid, fluorine-substituted benzenesulfonic acid, fluorine-substituted imide acid or fluorine-substituted methide acid. In particular, the acid generator which can be used is preferably a compound capable of generating a fluoro-substituted alkanesulfonic acid, a fluoro-substituted benzenesulfonic acid or a fluoro-substituted imide acid, where pKa of the acid generated is −1 or less, and in this case, the sensitivity is enhanced.

Out of the acid generators, particularly preferred examples are illustrated below.

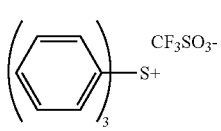
(z1)

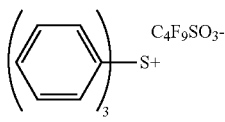
(z2)

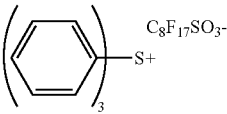
(z3)

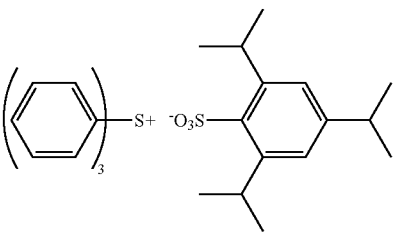
(z4)

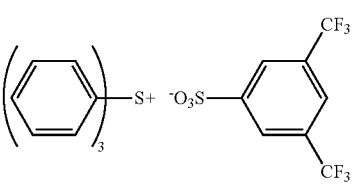
(z5)

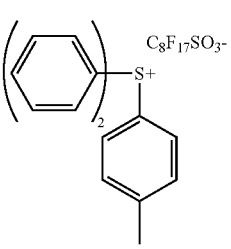
(z6)

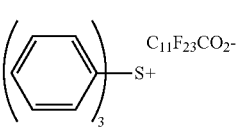
(z7)

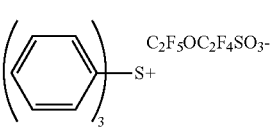
(z8)

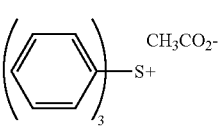
(z9)

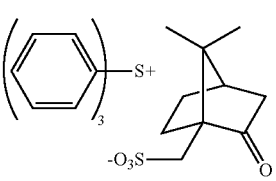
(z10)

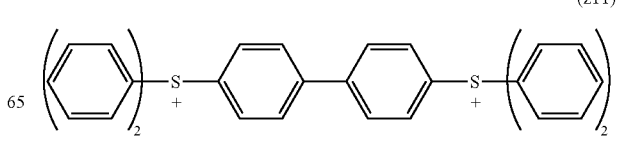
(z11)

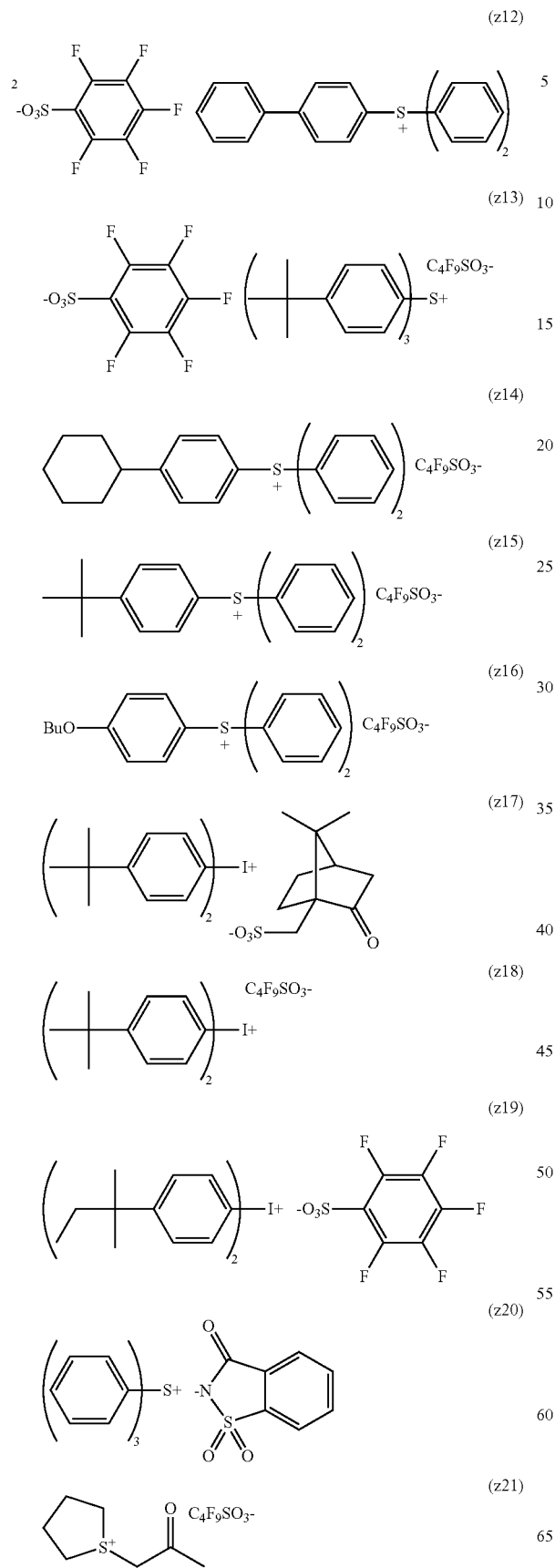
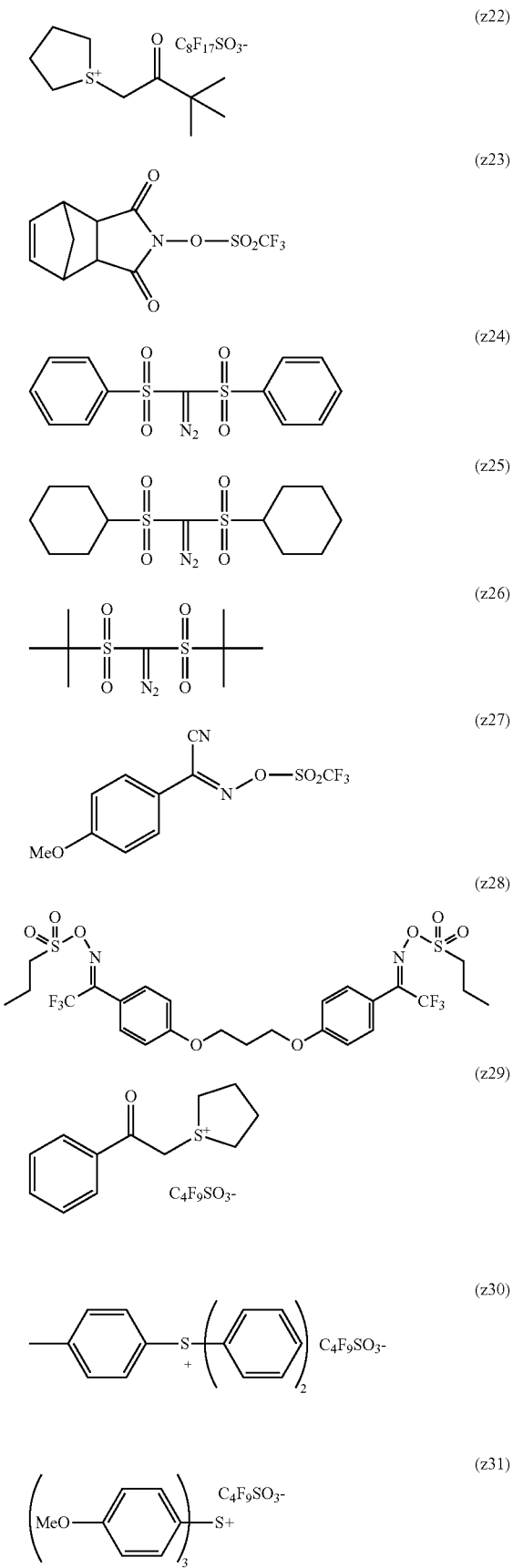

-continued
(z32)
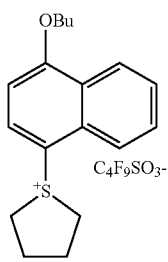
(z33)
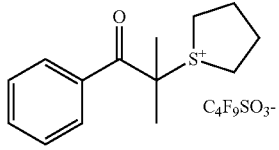
(z34)
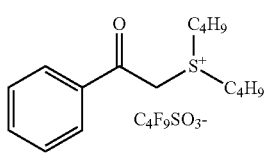
(z35)
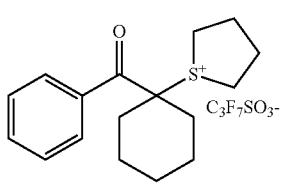
(z36)
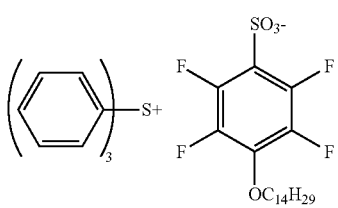
(z37)
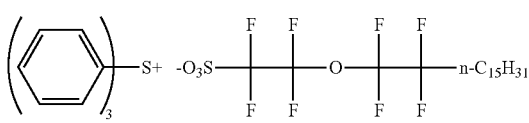
(z38)
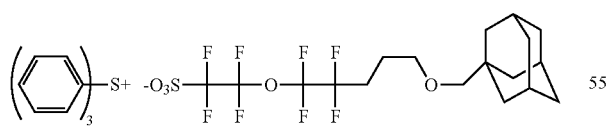
(z39)
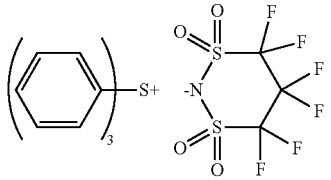
-continued
(z40)
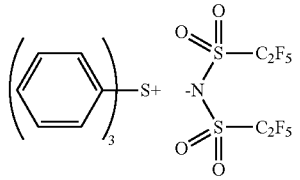
(z41)
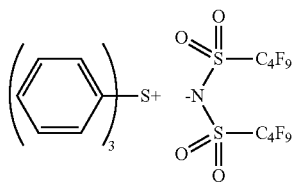
(z42)
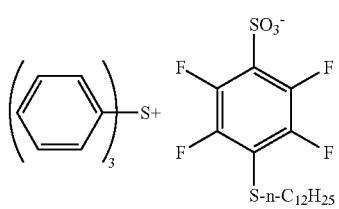
(z43)
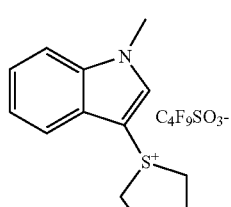
(z44)
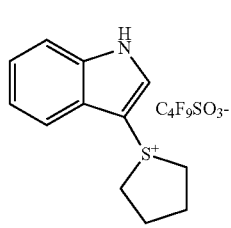
(z45)
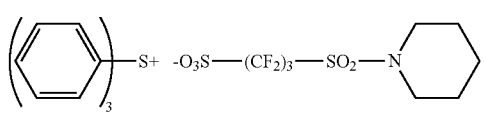
(z46)
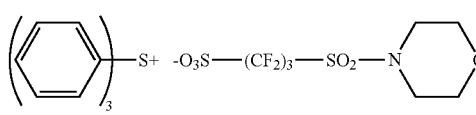
(z47)
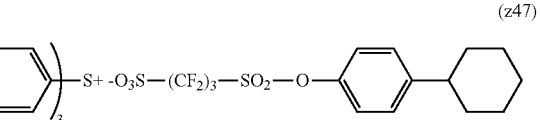
(z48)
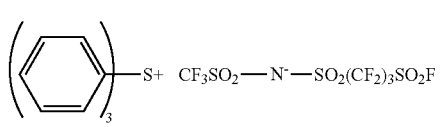

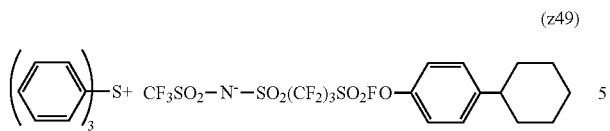 (z49)
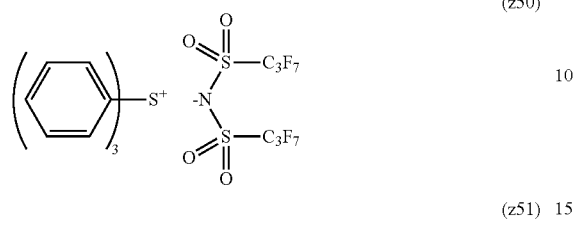 (z50)
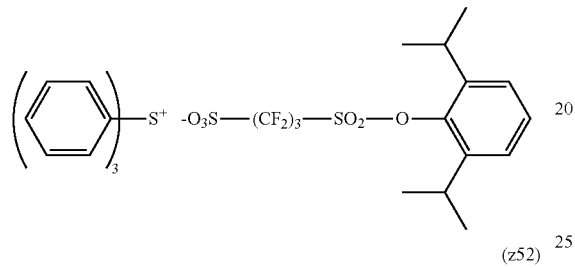 (z51)
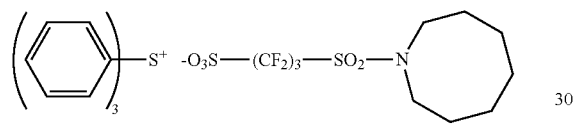 (z52)
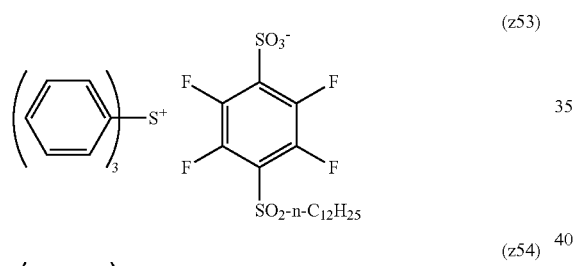 (z53)
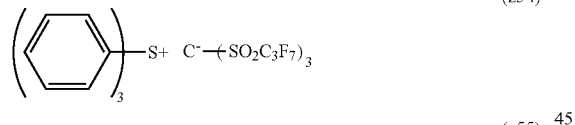 (z54)
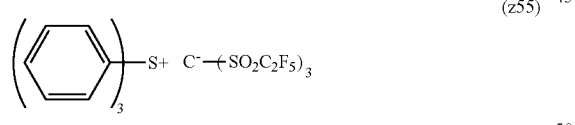 (z55)
(z56)
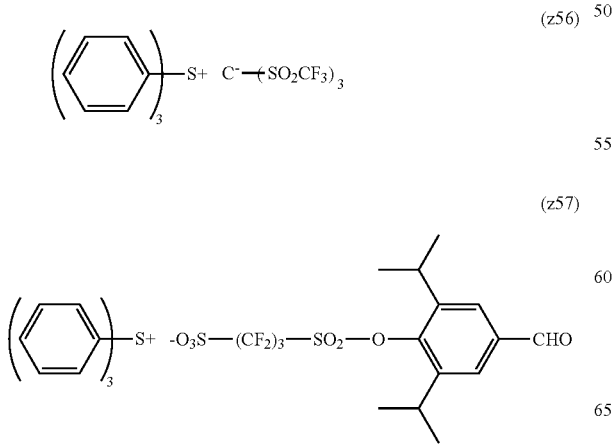 (z57)
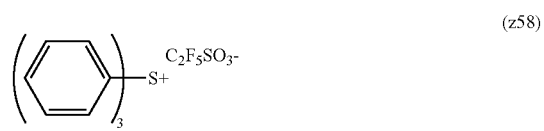 (z58)
(z59)
(z60)
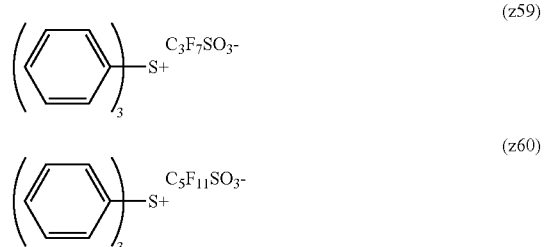 (z61)
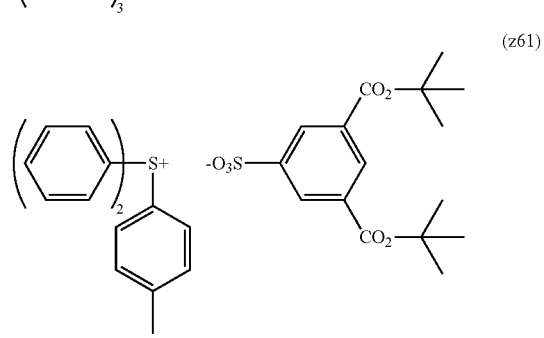 (z62)
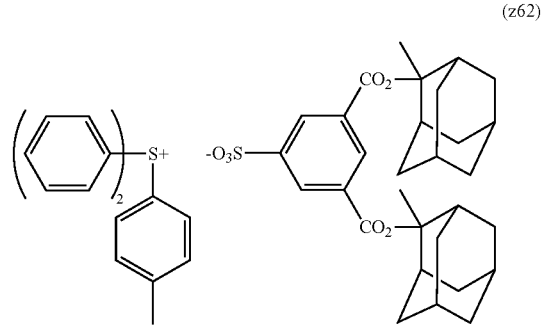 (z63)
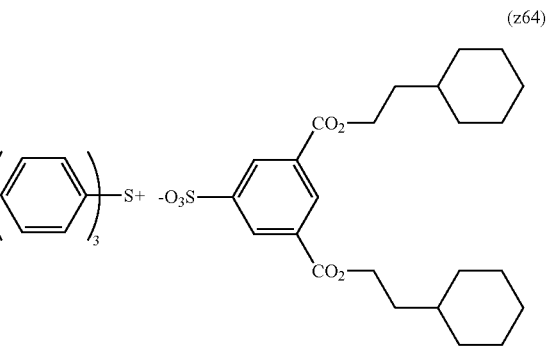 (z64)

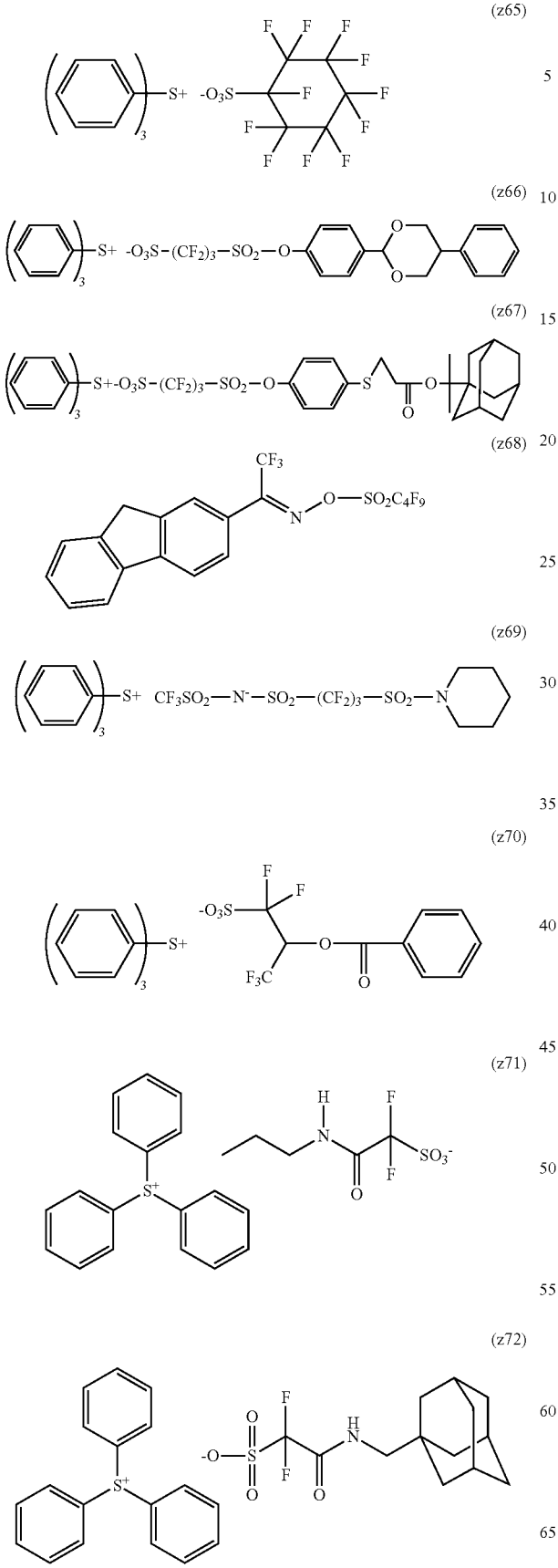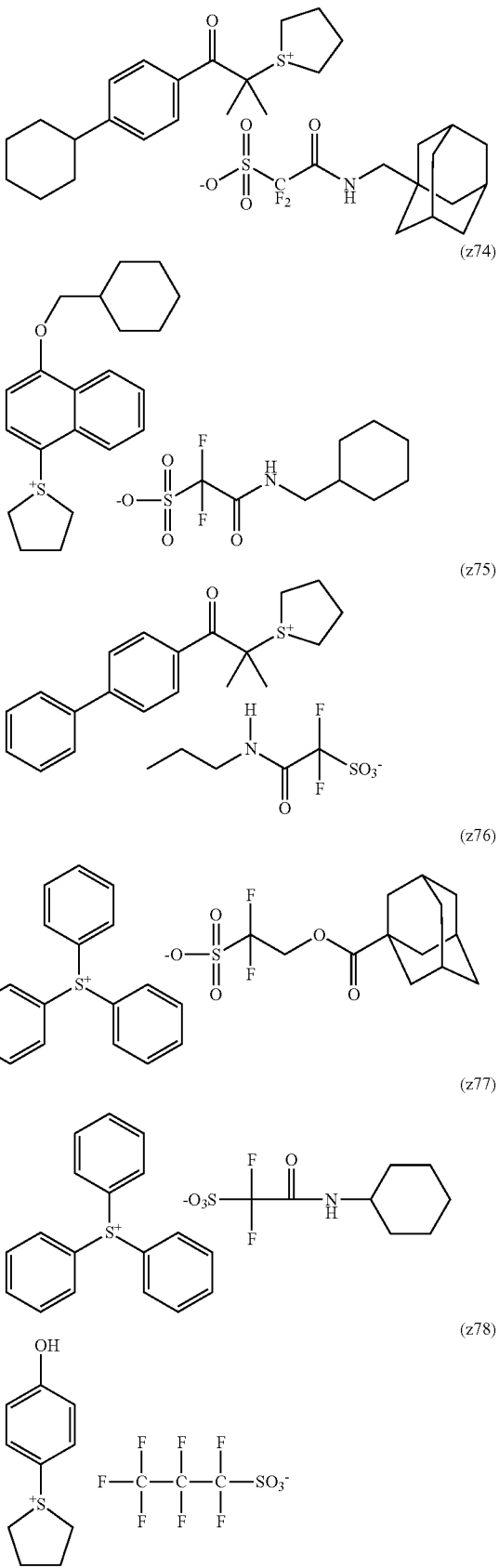

(z79)
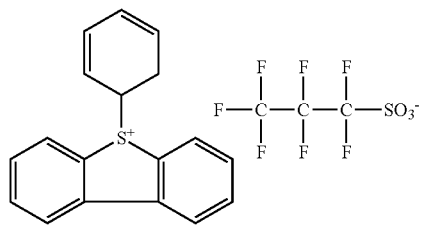
(z84)
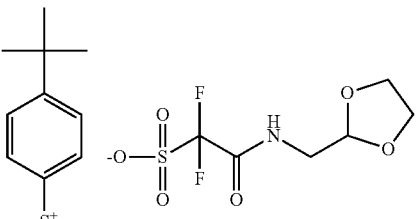
(z80)
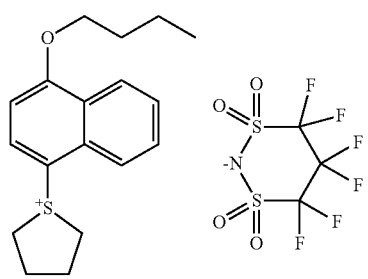
(z85)
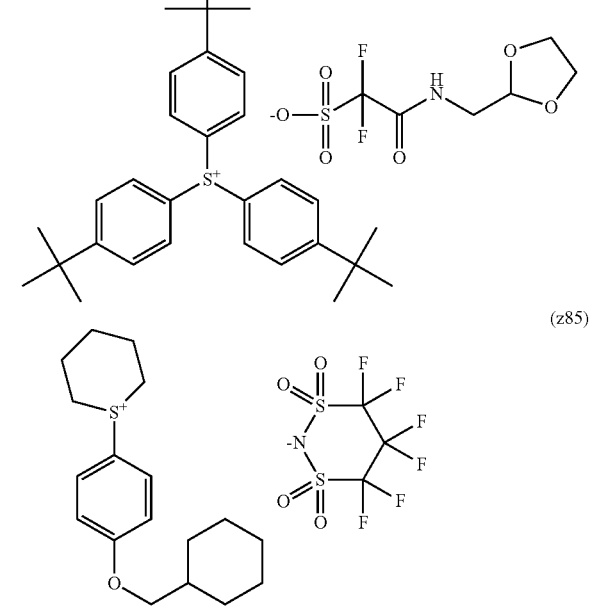
(z81)
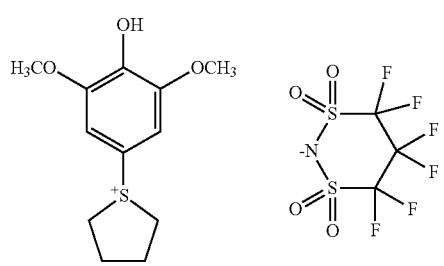
(z86)
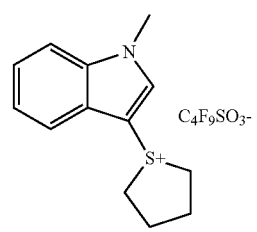
(z82)
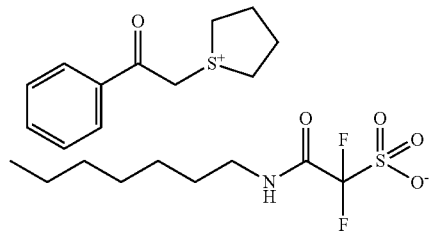
(z87)
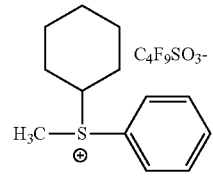
(z88)
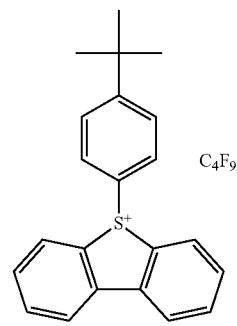
(z83)
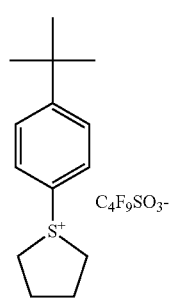
(z89)
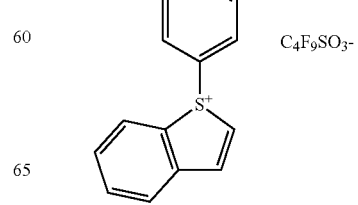

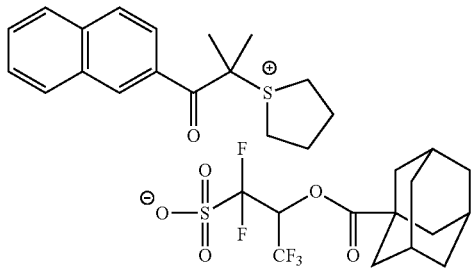
(z90)
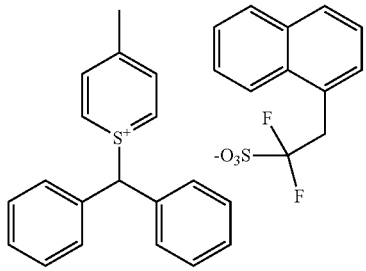
(z91) (z92) (z93) (z94) (z95)
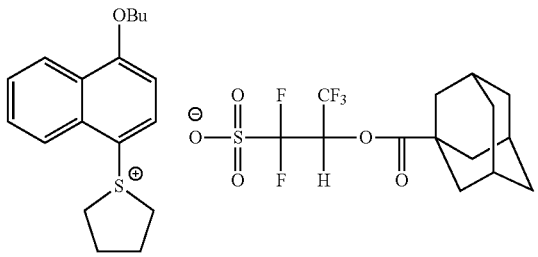
(z96) (z97)
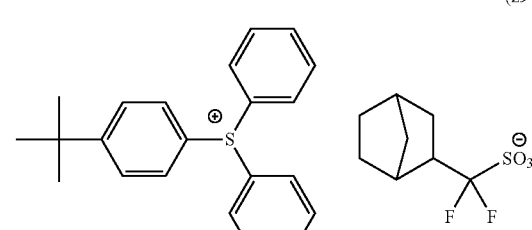
(z98) (z99) (z100) (z101)

(z102)
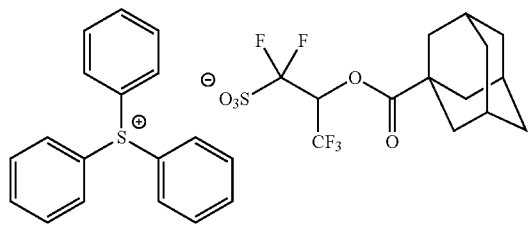
(z103)
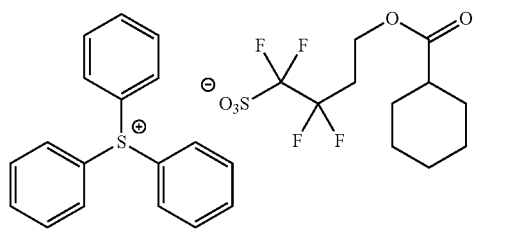
(z104)
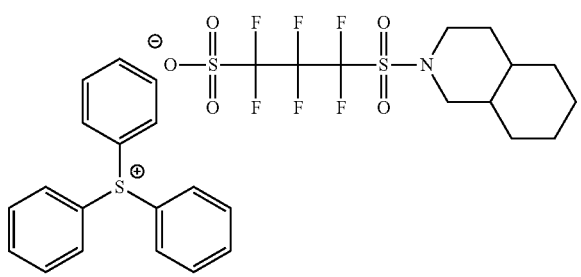
(z105)
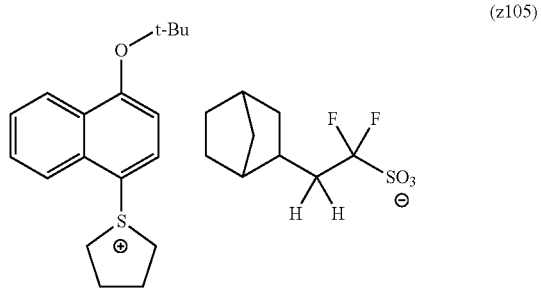
(z106)
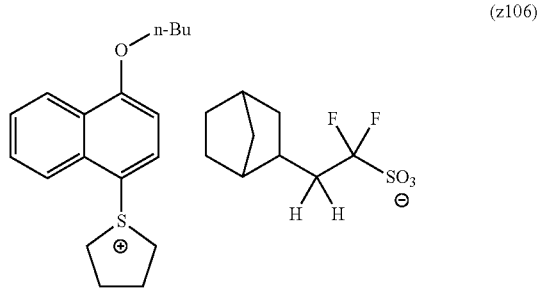
(z107)
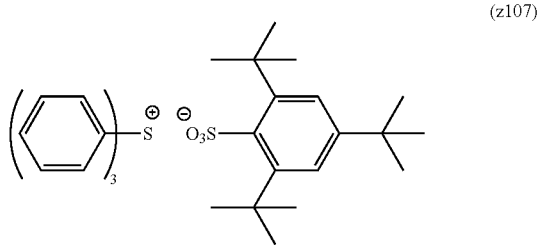
(z108)
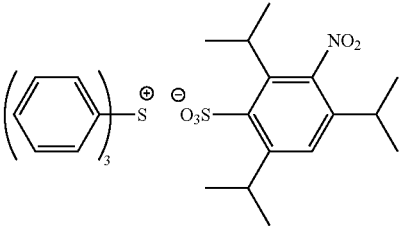
(z109)
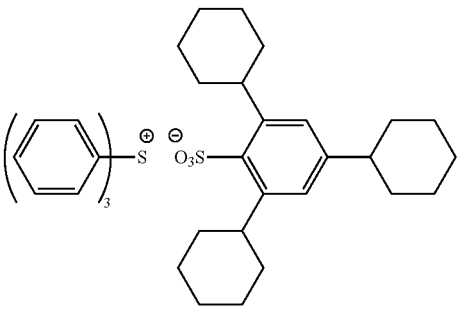
(z110)
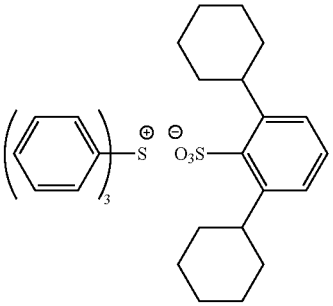
(z111)
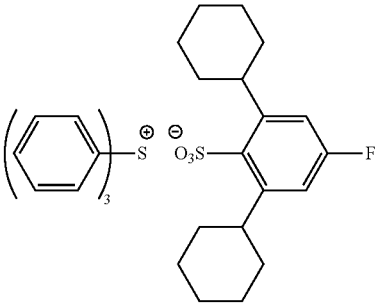
(z112)
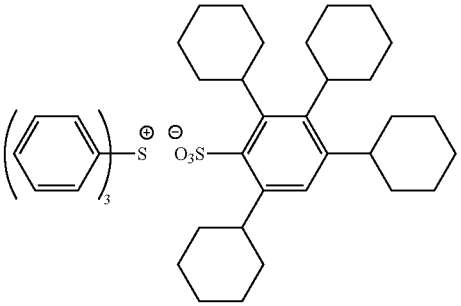

-continued
(z113)
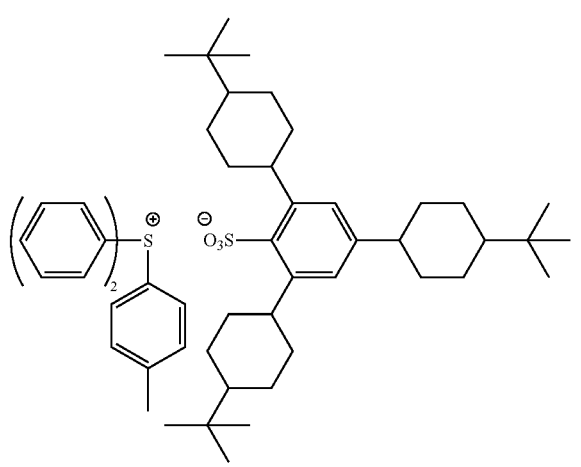
(z114)
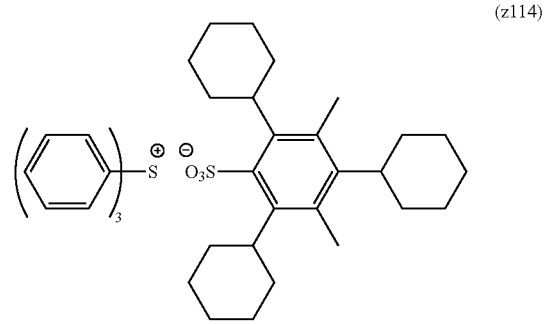
(z115)
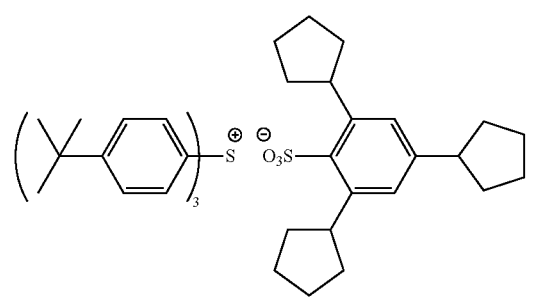
(z116)
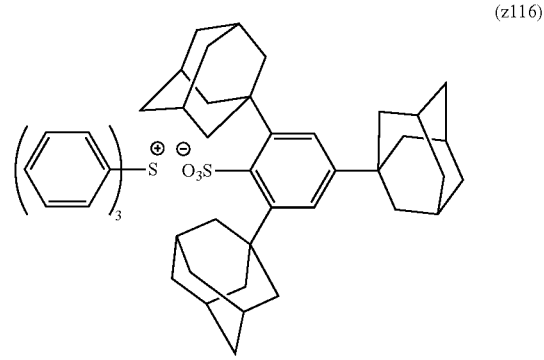
-continued
(z117)
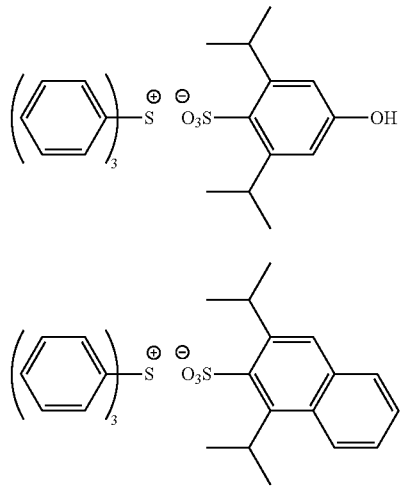
(z118)
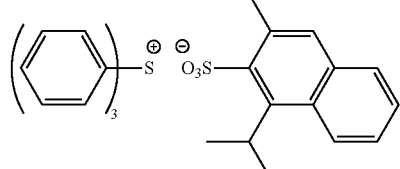
(z119)
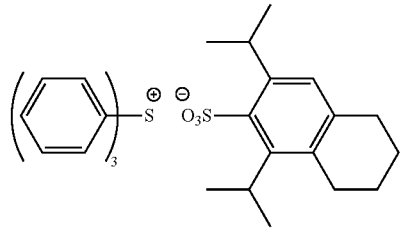
(z120)
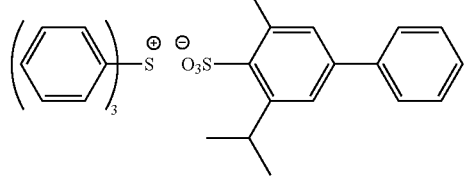
(z121)
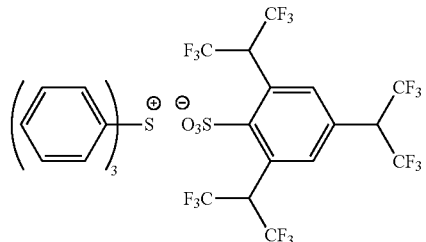
(z122)
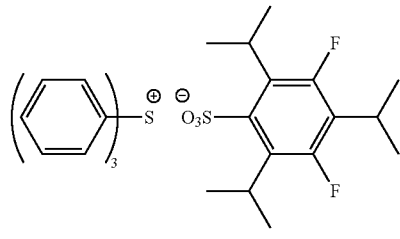

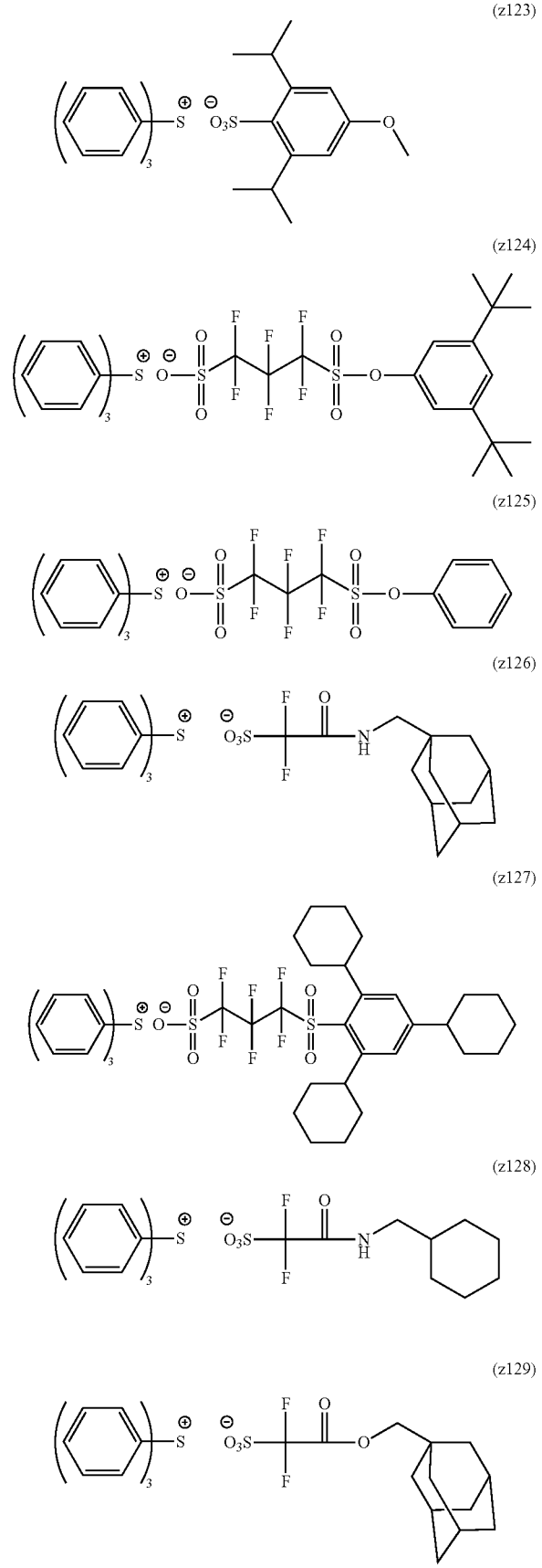

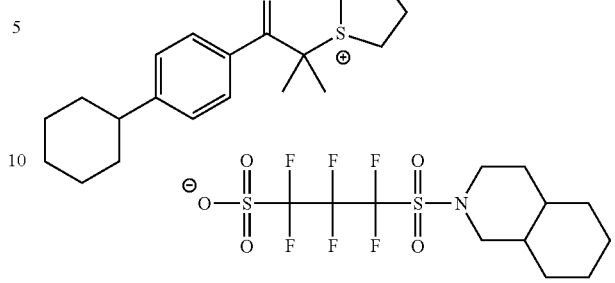

The acid generator can be synthesized by a known method, for example, can be synthesized in accordance with the method described in JP-A-2007-161707.

As for the acid generator, one kind may be used, or two or more kinds may be used in combination.

The content of the compound capable of generating an acid upon irradiation with an actinic ray or radiation, in the composition, is preferably from 0.1 to 40 mass %, more preferably from 1 to 30 mass %, still more preferably from 4 to 25 mass %, based on the entire solid content of the actinic ray-sensitive or radiation-sensitive resin composition.

[3] (C) Solvent

Examples of the solvent which can be used at the preparation of the resist composition of the present invention include an organic solvent such as alkylene glycol monoalkyl ether carboxylate, alkylene glycol monoalkyl ether, alkyl lactate, alkyl alkoxypropionate, cyclic lactone (preferably having a carbon number of 4 to 10), monoketone compound (preferably having a carbon number of 4 to 10) which may contain a ring, alkylene carbonate, alkyl alkoxyacetate and alkyl pyruvate.

Specific examples of these solvents include those described in paragraphs [0441] to [0455] of U.S. Patent Application Publication 2008/0187860.

In the present invention, a mixed solvent prepared by mixing a solvent containing a hydroxyl group in the structure and a solvent not containing a hydroxyl group may be used as the organic solvent.

The solvent containing a hydroxyl group and the solvent not containing a hydroxyl group may be appropriately selected from the compounds exemplified above, but the solvent containing a hydroxyl group is preferably an alkylene glycol monoalkyl ether, an alkyl lactate or the like, more preferably propylene glycol monomethyl ether (PGME, another name: 1-methoxy-2-propanol) or ethyl lactate. The solvent not containing a hydroxyl group is preferably an alkylene glycol monoalkyl ether acetate, an alkyl alkoxypropionate, a monoketone compound which may contain a ring, a cyclic lactone, an alkyl acetate or the like, more preferably propylene glycol monomethyl ether acetate (PGMEA, another name: 1-methoxy-2-acetoxypropane), ethyl ethoxypropionate, 2-heptanone, γ-butyrolactone, cyclohexanone or butyl acetate, and most preferably propylene glycol monomethyl ether acetate, ethyl ethoxypropionate or 2-heptanone.

The mixing ratio (by mass) of the solvent containing a hydroxyl group to the solvent not containing a hydroxyl group is from 1/99 to 99/1, preferably from 10/90 to 90/10, more preferably from 20/80 to 60/40. A mixed solvent in which the solvent not containing a hydroxyl group accounts for 50 mass % or more is particularly preferred in view of coating uniformity.

The solvent preferably contains propylene glycol monomethyl ether acetate and is preferably a solvent containing propylene glycol monomethyl ether acetate alone or a mixed solvent of two or more kinds of solvents containing propylene glycol monomethyl ether acetate.

[4] (D) Basic Compound

The resist composition of the present invention preferably contains (D) a basic compound so as to reduce the change of performance with aging from exposure to heating.

The basic compound is preferably a compound having a structure represented by the following formulae (A) to (E):

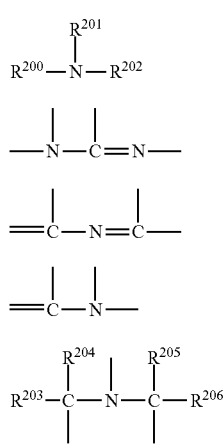

In formulae (A) to (E), each of $R^{200}$, $R^{201}$ and $R^{202}$, which may be the same or different, represents a hydrogen atom, an alkyl group (preferably having a carbon number of 1 to 20), a cycloalkyl group (preferably having a carbon number of 3 to 20) or an aryl group (having a carbon number of 6 to 20), and $R^{201}$ and $R^{202}$ may combine together to form a ring. Each of $R^{203}$, $R^{204}$, $R^{205}$ and $R^{206}$, which may be the same or different, represents an alkyl group having a carbon number of 1 to 20.

As for the alkyl group, the alkyl group having a substituent is preferably an aminoalkyl group having a carbon number of 1 to 20, a hydroxyalkyl group having a carbon number of 1 to 20, or a cyanoalkyl group having a carbon number of 1 to 20.

The alkyl group in formulae (A) and (E) is more preferably unsubstituted.

Preferred examples of the compound include guanidine, aminopyrrolidine, pyrazole, pyrazoline, piperazine, aminomorpholine, aminoalkylmorpholine and piperidine. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole, benzimidazole and 2-phenylbenzimidazole. Examples of the compound having a diazabicyclo structure include 1,4-diazabicyclo[2,2,2]octane, 1,5-diazabicyclo[4,3,0]non-5-ene and 1,8-diazabicyclo[5,4,0]undec-7-ene. Examples of the compound having an onium hydroxide structure include a triarylsulfonium hydroxide, a phenacylsulfonium hydroxide, and a 2-oxoalkyl group-containing sulfonium hydroxide, specifically, triphenylsulfonium hydroxide, tris(tert-butylphenyl)sulfonium hydroxide, bis(tert-butylphenyl)iodonium hydroxide, phenacylthiophenium hydroxide and 2-oxopropylthiophenium hydroxide. The compound having an onium carboxylate structure is a compound where the anion moiety of the compound having an onium hydroxide structure is replaced by a carboxylate, and examples thereof include acetate, adamantane-1-carboxylate and perfluoroalkyl carboxylate. Examples of the compound having a trialkylamine structure include tri(n-butyl)amine and tri(n-octyl)amine. Examples of the compound having an aniline structure include 2,6-diisopropylaniline, N,N-dimethylaniline, N,N-dibutylaniline and N,N-dihexylaniline. Examples of the alkylamine derivative having a hydroxyl group and/or an ether bond include ethanolamine, diethanolamine, N-phenyldiethanolamine, triethanolamine and tris(methoxyethoxyethyl)amine. Examples of the aniline derivative having a hydroxyl group and/or an ether bond include N,N-bis(hydroxyethyl)aniline.

Other preferred basic compounds include a phenoxy group-containing amine compound, a phenoxy group-containing ammonium salt compound, a sulfonic acid ester group-containing amine compound and a sulfonic acid ester group-containing ammonium salt compound.

In the phenoxy group-containing amine compound, phenoxy group-containing ammonium salt compound, sulfonic acid ester group-containing amine compound and sulfonic acid ester group-containing ammonium salt compound, at least one alkyl group is preferably bonded to the nitrogen atom. Also, an oxygen atom is preferably contained in the alkyl chain to form an oxyalkylene group. The number of oxyalkylene groups within the molecule is 1 or more, preferably from 3 to 9, more preferably from 4 to 6. Among oxyalkylene groups, structures of —$CH_2CH_2O$—, —$CH(CH_3)CH_2O$— and —$CH_2CH_2CH_2O$— are preferred.

Specific examples of the phenoxy group-containing amine compound, phenoxy group-containing ammonium salt compound, sulfonic acid ester group-containing amine compound and sulfonic acid ester group-containing ammonium salt compound include, but are not limited to, Compounds (C1-1) to (C3-3) illustrated in paragraph [0066] of U.S. Patent Application Publication 2007/0224539.

In addition, a nitrogen-containing organic compound having a group capable of leaving by the action of an acid, which is a kind of a basic compound, can be also used. Examples of this compound include a compound represented by the following formula (F). Incidentally, the compound represented by the following formula (F) exhibits an effective basicity in the system as a result of elimination of the group capable of leaving by the action of an acid.

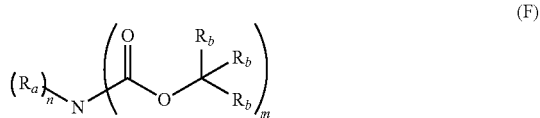

In formula (F), each $R_a$ independently represents a hydrogen atom, an alkyl group, a cycloalkyl group, an aryl group or an aralkyl group. Also, when n=2, two $R_a$s may be the same or different, and two $R_a$s may combine with each other to form a divalent heterocyclic hydrocarbon group (preferably having a carbon number of 20 or less) or a derivative thereof.

Each $R_b$ independently represents a hydrogen atom, an alkyl group, a cycloalkyl group, an aryl group or an aralkyl group, provided that in —C($R_b$)($R_b$)($R_b$), when one or more $R_b$s are a hydrogen atom, at least one of remaining $R_b$s is a cyclopropyl group or a 1-alkoxyalkyl group.

At least two $R_b$s may combine to form an alicyclic hydrocarbon group, an aromatic hydrocarbon group, a heterocyclic hydrocarbon group or a derivative thereof.

n represents an integer of 0 to 2, m represents an integer of 1 to 3, and n+m=3.

Specific examples particularly preferred in the present invention include N-tert-butoxycarbonyldi-n-octylamine, N-tert-butoxycarbonyldi-n-nonylamine, N-tert-butoxycarbonyldi-n-decylamine, N-tert-butoxycarbonyldicyclohexylamine, N-tert-butoxycarbonyl-1-adamantylamine, N-tert-butoxycarbonyl-2-adamantylamine, N-tert-butoxycarbonyl-N-methyl-1-adamantylamine, (S)-(−)-1-(tert-butoxycarbonyl)-2-pyrrolidinemethanol, (R)-(+)-1-(tert-butoxycarbonyl)-2-pyrrolidinemethanol, N-tert-butoxycarbonyl-4-hydroxypiperidine, N-tert-butoxycarbonylpyrrolidine, N-tert-butoxycarbonylmorpholine, N-tert-butoxycarbonylpiperazine, N,N-di-tert-butoxycarbonyl-1-adamantylamine, N,N-di-tert-butoxycarbonyl-N-methyl-1-adamantylamine, N-tert-butoxycarbonyl-4,4'-diaminodiphenylmethane, N,N'-di-tert-butoxycarbonylhexamethylenediamine, N,N,N',N'-tetra-tert-butoxycarbonylhexamethylenediamine, N,N'-di-tert-butoxycarbonyl-1,7-diaminoheptane, N,N'-di-tert-butoxycarbonyl-1,8-diaminooctane, N,N'-di-tert-butoxycarbonyl-1,9-diaminononane, N,N'-di-tert-butoxycarbonyl-1,10-diaminodecane, N,N'-di-tert-butoxycarbonyl-1,12-diaminododecane, N,N'-di-tert-butoxycarbonyl-4,4'-diaminodiphenylmethane, N-tert-butoxycarbonylbenzimidazole, N-tert-butoxycarbonyl-2-methylbenzimidazole and N-tert-butoxycarbonyl-2-phenylbenzimidazole.

The compound represented by formula (F) can be synthesized according to the method described, for example, in JP-A-2009-199021 and JP-A-2007-298569.

The molecular weight of the basic compound is preferably from 250 to 2,000, more preferably from 400 to 1,000. From the standpoint of more reducing LWR, the molecular weight of the basic compound is preferably 400 or more, more preferably 500 or more, still more preferably 600 or more.

One of these basic compounds is used alone, or two or more thereof are used in combination.

The amount of the basic compound used is usually from 0.001 to 10 mass %, preferably from 0.01 to 5 mass %, based on the solid content of the resist composition.

The ratio between the acid generator and the basic compound used in the composition is preferably acid generator/basic compound (by mol)=from 2.5 to 300. That is, the molar ratio is preferably 2.5 or more in view of sensitivity and resolution and preferably 300 or less from the standpoint of suppressing the reduction in resolution due to thickening of the resist pattern with aging after exposure until heat treatment. The acid generator/basic compound (by mol) is more preferably from 5.0 to 200, still more preferably from 7.0 to 150.

[5] (E) Surfactant

The resist composition of the present invention may or may not further contain a surfactant and in the case of containing a surfactant, it is preferred to contain any one of fluorine-containing and/or silicon-containing surfactants (a fluorine-containing surfactant, a silicon-containing surfactant or a surfactant containing both a fluorine atom and a silicon atom), or two or more thereof.

By virtue of containing a surfactant, the resist composition of the present invention can give a resist pattern with good sensitivity, resolution and adherence as well as little development defect when used for exposure to a light source of 250 nm or less, particularly 220 nm or less.

Examples of the fluorine-containing and/or silicon-containing surfactants include the surfactants described in paragraph [0276] of U.S. Patent Application Publication 2008/0248425, such as EFtop EF301 and EF303 (produced by Shin-Akita Kasei K.K.); Florad FC430, 431 and 4430 (produced by Sumitomo 3M Inc.); Megaface F171, F173, F176, F189, F113, F110, F177, F120 and R08 (produced by DIC Corporation); Surflon S-382, SC101, 102, 103, 104, 105 and 106 (produced by Asahi Glass Co., Ltd.); Troysol S-366 (produced by Troy Chemical); GF-300 and GF-150 (produced by Toagosei Chemical Industry Co., Ltd.); Surflon S-393 (produced by Seimi Chemical Co., Ltd.); EFtop EF121, EF122A, EF122B, RF122C, EF125M, EF135M, EF351, EF352, EF801, EF802 and EF601 (produced by JEMCO Inc.); PF636, PF656, PF6320 and PF6520 (produced by OMNOVA); and FTX-204G, 208G, 218G, 230G, 204D, 208D, 212D, 218D and 222D (produced by NEOS Co., Ltd.). In addition, Polysiloxane Polymer KP-341 (produced by Shin-Etsu Chemical Co., Ltd.) may be also used as the silicon-containing surfactant.

As for the surfactant, other than these known surfactants, a surfactant using a polymer having a fluoro-aliphatic group derived from a fluoro-aliphatic compound which is produced by a telomerization process (also called a telomer process) or an oligomerization process (also called an oligomer process), may be used. The fluoro-aliphatic compound can be synthesized by the method described in JP-A-2002-90991.

Examples of the surfactant coming under this type include Megaface F178, F-470, F-473, F-475, F-476 and F-472 (produced by DIC Corporation), a copolymer of a $C_6F_{13}$ group-containing acrylate (or methacrylate) with a (poly(oxyalkylene)) acrylate (or methacrylate), and a copolymer of a $C_3F_7$ group-containing acrylate (or methacrylate) with a (poly (oxyethylene)) acrylate (or methacrylate) and a (poly(oxypropylene)) acrylate (or methacrylate).

In the present invention, surfactants other than the fluorine-containing and/or silicon-containing surfactants, described in paragraph [0280] of U.S. Patent Application Publication 2008/0248425, may be also used.

One of these surfactants may be used alone, or some of them may be used in combination.

In the case where the resist composition contains a surfactant, the amount of the surfactant used is preferably from 0.0001 to 2 mass %, more preferably from 0.0005 to 1 mass %, based on the entire amount of the resist composition (excluding the solvent).

[6] (F) Onium Carboxylate

The resist composition for use in the present invention may or may not contain an onium carboxylate. Examples of onium carboxylate include those described in paragraphs [0605] and [0606] of U.S. Patent Application Publication No. 2008/0187860.

Such an onium carboxylate can be synthesized by reacting a sulfonium, iodonium or ammonium hydroxide and a carboxylic acid with silver oxide in an appropriate solvent.

In the case where the resist composition contains an onium carboxylate, the content thereof is generally from 0.1 to 20 mass %, preferably from 0.5 to 10 mass %, more preferably from 1 to 7 mass %, based on the entire solid content of the composition.

[7] (G) Other Additives

The resist composition of the present invention may further contain, for example, a dye, a plasticizer, a photosensitizer, a light absorber, an alkali-soluble resin, a dissolution inhibitor, and a compound capable of accelerating dissolution for a developer (for example, a phenol compound having a molecular weight of 1,000 or less, or a carboxyl group-containing alicyclic or aliphatic compound), if desired.

The phenol compound having a molecular weight of 1,000 or less can be easily synthesized by one skilled in the art by referring to the method described, for example, in JP-A-4-122938, JP-A-2-28531, U.S. Pat. No. 4,916,210 and European Patent 219294.

Specific examples of the carboxyl group-containing alicyclic or aliphatic compound include, but are not limited to, a carboxylic acid derivative having a steroid structure, such as cholic acid, deoxycholic acid and lithocholic acid, an adamantanecarboxylic acid derivative, an adamantanedicarboxylic acid, a cyclohexanecarboxylic acid and a cyclohexanedicarboxylic acid.

The solid content concentration of the resist composition of the present invention is usually from 4.0 to 20 mass %, preferably from 5.0 to 15 mass %, more preferably from 6.0 to 12 mass %. When the solid content concentration is in this range, the resist solution can be uniformly applied on a substrate and moreover, a resist pattern improved in the line edge roughness can be formed. The reasons therefor are not clearly known, but it is considered that by setting the solid content concentration to 20 mass % or less, preferably 15 mass % or less, the materials, particularly the photoacid generator, in the resist solution are prevented from aggregation, as a result, a uniform resist film can be formed.

The solid content concentration is a weight percentage of the weight of resist components excluding solvents, based on the total weight of the resist composition.

The composition of the present invention is used by dissolving the above-described components in a solvent and after filtration through a filter, applying the solution on a support. The filter is preferably a polytetrafluoroethylene-, polyethylene- or nylon-made filter having a pore size of 0.1 µm or less, more preferably 0.05 µm or less, still more preferably 0.03 µM. In the filtration through a filter, circulative filtration or filtration using different kinds of filters connected in series may be performed as in, for example, JP-A-2002-62667. In addition to the filtration through a filter, a deaeration step and the like may be also added.

[8] Negative Pattern Forming Method

The negative pattern forming method of the present invention comprises at least:

(i) a step of forming a film (resist film) having a film thickness of 200 nm or more from a chemical amplification resist composition containing (A) a resin capable of increasing the polarity by the action of an acid to decrease the solubility for an organic solvent-containing developer, (B) a compound capable of generating an acid upon irradiation with an actinic ray or radiation, and (C) a solvent, (ii) a step of exposing the film, and (iii) a step of developing the exposed film with an organic solvent-containing developer.

The resist film is formed from the chemical amplification resist composition of the present invention and, more specifically, is preferably formed on a substrate. In the negative pattern forming method of the present invention, the step of forming a film from the resist composition on a substrate, the step of exposing the film, and the development step can be performed by a generally known method.

The present invention also relates to a chemical amplification resist composition used for the negative pattern forming method. The chemical amplification resist composition of the present invention is preferably used for ion implantation.

Furthermore, the present invention relates to a resist pattern formed by the negative pattern forming method above.

It is also preferred to include, after film formation, a pre-baking step (PB) before entering the exposure step.

It is also preferred to include a post-exposure baking step (PEB) after the exposure step but before the development step.

As for the heating temperature, both PB and PEB are preferably performed at 70 to 130° C., more preferably at 80 to 120° C.

The heating time is preferably from 30 to 300 seconds, more preferably from 30 to 180 seconds, still more preferably from 30 to 90 seconds.

The heating can be performed using a device attached to an ordinary exposure/developing machine or may be performed using a hot plate or the like.

Thanks to baking, the reaction in the exposed area is accelerated, and the sensitivity and pattern profile are improved.

It is also preferred to include a heating step (Post Bake) after the rinsing step. The developer and rinsing solution remaining between patterns as well as in the inside of the pattern are removed by the baking. The heating step after the rinsing step is performed at usually from 40 to 160° C., preferably from 70 to 95° C., for usually from 10 seconds to 3 minutes, preferably from 30 to 90 seconds.

The light source employed in the exposure apparatus for use in the present invention is not limited in its wavelength, but examples of the radiation include infrared light, visible light, ultraviolet light, far ultraviolet light, X-ray and electron beam. The radiation is preferably far ultraviolet light at a wavelength of 250 nm or less, more preferably 220 nm or less, still more preferably from 1 to 200 nm. Specifically, the radiation is, for example, KrF excimer laser (248 nm), ArF excimer laser (193 nm), $F_2$ excimer laser (157 nm), X-ray, EUV (13 nm) or electron beam, preferably KrF excimer laser, ArF excimer laser, EUV or electron beam, more preferably ArF excimer laser.

In the present invention, the substrate on which the film is formed is not particularly limited, and an inorganic substrate such as silicon, SiN, $SiO_2$ and SiN, a coating-type inorganic substrate such as SOG, or a substrate generally used in the process of producing a semiconductor such as IC or producing a liquid crystal device or a circuit board such as thermal head or in the lithography of other photo-fabrication processes can be used. If desired, an organic bottom anti-reflection coating may be formed between the film and the substrate, but in the case of application to ion implantation, a bottom anti-reflection coating is preferably not formed, because a pattern suitable for ion implantation is obtained by a simpler and easier process.

Also, before applying the resist composition, the substrate is preferably treated with hexamethyldisilazane (HMDS) to increase the hydrophobicity of the substrate and enhance the coatability of the resist composition on the substrate.

As for the developer in the step of performing development by using an organic solvent-containing developer (hereinafter, sometimes referred to as an "organic developer"), a polar solvent such as ketone-based solvent, ester-based solvent, alcohol-based solvent, amide-based solvent and ether-based solvent, or a hydrocarbon-based solvent can be used.

Examples of the ketone-based solvent include 1-octanone, 2-octanone, 2-heptanone (methyl amyl ketone), 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetyl acetone, acetonyl acetone, ionone, diacetonyl alcohol, acetyl carbinol, acetophenone, methyl naphthyl ketone, isophorone and propylene carbonate.

Examples of the ester-based solvent include methyl acetate, butyl acetate, ethyl acetate, isopropyl acetate, amyl acetate, pentyl acetate, isopentyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate and propyl lactate.

Examples of the alcohol-based solvent include an alcohol such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol and n-decanol; a glycol-based solvent such as ethylene glycol, diethylene glycol and triethylene glycol; and a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethyl butanol.

Examples of the ether-based solvent include dioxane, tetrahydrofuran and anisole, in addition to the glycol ether-based solvents above.

Examples of the amide-based solvent which can be used include N-methyl-2-pyrrolidone, N,N-dimethylacetamide, N,N-dimethylformamide, hexamethylphosphoric triamide and 1,3-dimethyl-2-imidazolidinone.

Examples of the hydrocarbon-based solvent include an aromatic hydrocarbon-based solvent such as toluene and xylene, and an aliphatic hydrocarbon-based solvent such as pentane, hexane, octane and decane.

A plurality of these solvents may be mixed, or the solvent may be used by mixing it with a solvent other than those described above or with water. However, in order to sufficiently bring out the effects of the present invention, the water content ratio in the entire developer is preferably less than 10 mass %, and it is more preferred to contain substantially no water.

That is, the amount of the organic solvent used in the organic developer is preferably from 90 to 100 mass %, more preferably from 95 to 100 mass %, based on the entire amount of the developer.

In particular, the organic developer is preferably a developer containing at least one kind of an organic solvent selected from the group consisting of a ketone-based solvent, an ester-based solvent, an alcohol-based solvent, an amide-based solvent and an ether-based solvent.

The vapor pressure at 20° C. of the organic developer is preferably 5 kPa or less, more preferably 3 kPa or less, still more preferably 2 kPa or less. By setting the vapor pressure of the organic developer to 5 kPa or less, evaporation of the developer on a substrate or in a development cup is suppressed and the temperature uniformity in the wafer plane is enhanced, as a result, the dimensional uniformity in the wafer plane is improved.

Specific examples of the solvent having a vapor pressure of 5 kPa or less include a ketone-based solvent such as 1-octanone, 2-octanone, 1-nonanone, 2-nonanone, 4-heptanone, 2-hexanone, diisobutyl ketone, cyclohexanone, methylcyclohexanone, phenylacetone and methyl isobutyl ketone; an ester-based solvent such as butyl acetate, amyl acetate, pentyl acetate, isopentyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, butyl formate, propyl formate, ethyl lactate, butyl lactate and propyl lactate; an alcohol-based solvent such as n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol and n-decanol; a glycol-based solvent such as ethylene glycol, diethylene glycol and triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethylbutanol; an ether-based solvent such as tetrahydrofuran and anisole; an amide-based solvent such as N-methyl-2-pyrrolidone, N,N-dimethylacetamide and N,N-dimethylformamide; an aromatic hydrocarbon-based solvent such as toluene and xylene; and an aliphatic hydrocarbon-based solvent such as octane and decane.

Specific examples of the solvent having a vapor pressure of 2 kPa or less that is a particularly preferred range include a ketone-based solvent such as 1-octanone, 2-octanone, 1-nonanone, 2-nonanone, 4-heptanone, 2-hexanone, diisobutyl ketone, cyclohexanone, methylcyclohexanone and phenylacetone; an ester-based solvent such as butyl acetate, amyl acetate, pentyl acetate, isopentyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, ethyl lactate, butyl lactate and propyl lactate; an alcohol-based solvent such as n-butyl alcohol, sec-butyl alcohol, tert-butyl alcohol, isobutyl alcohol, n-hexyl alcohol, n-heptyl alcohol, n-octyl alcohol and n-decanol; a glycol-based solvent such as ethylene glycol, diethylene glycol and triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethylbutanol; an ether-based solvent such as anisole; an amide-based solvent such as N-methyl-2-pyrrolidone, N,N-dimethylacetamide and N,N-dimethylformamide; an aromatic hydrocarbon-based solvent such as xylene; and an aliphatic hydrocarbon-based solvent such as octane and decane.

In the organic developer, a surfactant may be added in an appropriate amount, if desired.

The surfactant is not particularly limited but, for example, ionic or nonionic fluorine-containing and/or silicon-containing surfactants can be used. Examples of such fluorine-containing and/or silicon-containing surfactants include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988 and U.S. Pat. Nos. 5,405,720, 5,360,692, 5,529,881, 5,296,330, 5,436,098, 5,576,143, 5,294,511 and 5,824,451. A nonionic surfactant is preferred. The nonionic surfactant is not particularly limited, but use of a fluorine-containing surfactant or a silicon-containing surfactant is more preferred.

The amount of the surfactant used is usually from 0.001 to 5 mass %, preferably from 0.005 to 2 mass %, more preferably from 0.01 to 0.5 mass %, based on the entire amount of the developer.

As regards the developing method, for example, a method of dipping the substrate in a bath filled with the developer for a fixed time (dipping method), a method of raising the developer on the substrate surface by the effect of a surface tension and keeping it still for a fixed time, thereby performing development (puddle method), a method of spraying the developer on the substrate surface (spraying method), and a method of continuously ejecting the developer on the substrate spinning at a constant speed while scanning the developer ejecting nozzle at a constant rate (dynamic dispense method) may be applied.

In the case where the above-described various developing methods include a step of ejecting the developer toward the resist film from a development nozzle of a developing apparatus, the ejection pressure of the developer ejected (the flow velocity per unit area of the developer ejected) is preferably 2 mL/sec/mm$^2$ or less, more preferably 1.5 mL/sec/mm$^2$ or less, still more preferably 1 mL/sec/mm$^2$ or less. The flow velocity has no particular lower limit but in view of throughput, is preferably 0.2 mL/sec/mm$^2$ or more.

By setting the ejection pressure of the ejected developer to the range above, pattern defects attributable to the resist scum after development can be greatly reduced.

Details of this mechanism are not clearly known, but it is considered that thanks to the ejection pressure in the above-described range, the pressure imposed on the resist film by the developer becomes small and the resist film or resist pattern is kept from inadvertent chipping or collapse.

Here, the ejection pressure (mL/sec/mm$^2$) of the developer is a value at the outlet of a development nozzle in a developing apparatus.

Examples of the method for adjusting the ejection pressure of the developer include a method of adjusting the ejection pressure by a pump or the like, and a method of supplying the developer from a pressurized tank and adjusting the pressure to change the ejection pressure.

After the step of performing development by using an organic solvent-containing developer, a step of stopping the development by replacing the solvent with another solvent may be practiced.

A step of rinsing the film with a rinsing solution is preferably provided after the step of performing development by using an organic solvent-containing developer.

The rinsing solution used in the rinsing step after the step of performing development by using an organic solvent-containing developer is not particularly limited as long as it does not dissolve the resist pattern, and a solution containing a general organic solvent may be used. As for the rinsing solution, a rinsing solution containing at least one kind of an organic solvent selected from the group consisting of a hydrocarbon-based solvent, a ketone-based solvent, an ester-based solvent, an alcohol-based solvent, an amide-based solvent and an ether-based solvent is preferably used.

Specific examples of the hydrocarbon-based solvent, ketone-based solvent, ester-based solvent, alcohol-based solvent, amide-based solvent and ether-based solvent are the same as those described above for the organic solvent-containing developer.

After the step of performing development by using an organic solvent-containing developer, more preferably, a step of rinsing the film by using a rinsing solution containing at least one kind of an organic solvent selected from the group consisting of a ketone-based solvent, an ester-based solvent, an alcohol-based solvent and an amide-based solvent is preformed; still more preferably, a step of rinsing the film by using a rinsing solution containing an alcohol-based solvent or an ester-based solvent is performed; yet still more preferably, a step of rinsing the film by using a rinsing solution containing a monohydric alcohol is performed; and most preferably, a step of rinsing the film by using a rinsing solution containing a monohydric alcohol having a carbon number of 5 or more is performed.

The monohydric alcohol used in the rinsing step includes a linear, branched or cyclic monohydric alcohol, and specific examples of the monohydric alcohol which can be used include 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol and 4-octanol. As for the particularly preferred monohydric alcohol having a carbon number of 5 or more, 1-hexanol, 2-hexanol, 4-methyl-2-pentanol, 1-pentanol, 3-methyl-1-butanol and the like can be used.

A plurality of these components may be mixed, or the solvent may be used by mixing it with an organic solvent other than those described above.

The water content ratio in the rinsing solution is preferably 10 mass % or less, more preferably 5 mass % or less, still more preferably 3 mass % or less. By setting the water content ratio to 10 mass % or less, good development characteristics can be obtained.

The vapor pressure at 20° C. of the rinsing solution used after the step of performing development by using an organic solvent-containing developer is preferably from 0.05 to 5 kPa, more preferably from 0.1 to 5 kPa, and most preferably from 0.12 to 3 kPa. By setting the vapor pressure of the rinsing solution to the range from 0.05 to 5 kPa, the temperature uniformity in the wafer plane is enhanced and moreover, swelling due to permeation of the rinsing solution is suppressed, as a result, the dimensional uniformity in the wafer plane is improved.

The rinsing solution may be also used after adding thereto an appropriate amount of a surfactant.

In the rinsing step, the wafer after development using an organic solvent-containing developer is rinsed using the above-described organic solvent-containing rinsing solution. The method for rinsing treatment is not particularly limited, but examples of the method which can be applied include a method of continuously ejecting the rinsing solution on the substrate spinning at a constant speed (spin coating method), a method of dipping the substrate in a bath filled with the rinsing solution for a fixed time (dipping method), and a method of spraying the rinsing solution on the substrate surface (spraying method). Above all, it is preferred to perform the rinsing treatment by the spin coating method and after the rinsing, remove the rinsing solution from the substrate surface by spinning the substrate at a rotational speed of 2,000 to 4,000 rpm. It is also preferred to include a heating step (Post Bake) after the rinsing step. The developer and rinsing solution remaining between patterns as well as in the inside of the pattern are removed by the baking. The heating step after the rinsing step is performed at usually from 40 to 160° C., preferably from 70 to 95° C., for usually from 10 seconds to 3 minutes, preferably from 30 to 90 seconds.

The present invention also relates to a manufacturing method of an electronic device comprising the negative pattern forming method of the present invention set forth above and an electronic device manufactured by the manufacturing method.

The electronic device of the present invention is suitably equipped with electrical and electronics instruments (such as home electric appliances, OA and media-related instruments, optical instruments and communication instruments).

EXAMPLES

The present invention is described below by referring to Examples, but the present invention should not be construed as being limited thereto.

Synthesis Example 1

Synthesis of Resin (A)

Synthesis of Resin (A-1):

In a nitrogen stream, a three-neck flask was charged with 40 g of cyclohexanone and heated at 80° C. (Solvent 1). Monomers corresponding to the following repeating units were dissolved in cyclohexanone in a molar ratio of 30/10/50/10 to prepare a 22 mass % monomer solution (400 g), and polymerization initiator V-601 (produced by Wako Pure Chemical Industries, Ltd.) in a concentration of 7.2 mol % based on the monomers was added thereto and dissolved. The resulting solution was added dropwise to Solvent 1 over 6 hours. After the completion of dropwise addition, the reaction was further allowed to proceed at 80° C. for 2 hours. The reaction solution was left standing to cool and then poured in 3,600 ml of heptane/400 ml of ethyl acetate, and the precipitated powder was collected by filtration and dried, as a result, 74 g of Resin (A-1) was obtained. The compositional ratio of the polymer determined from NMR was 30/10/50/10. Also, the weight average molecular weight of the obtained Resin (A-1) was 10,200 and the polydispersity (Mw/Mn) was 1.7.

Resins (A-2) to (A-12) were synthesized in the same manner as in Synthesis Example 1 except for using monomers corresponding to respective repeating units to give a desired compositional ratio (molar ratio).

Structures of Resins (A-1) to (A-12) are shown below. Also, the compositional ratio (molar ratio), weight average molecular weight and polydispersity of each of Resins (A-1) to (A-12) are shown in Table 1. Furthermore, with respect to Resins (A-1) to (A-12), the dissolution rate measured as follows is also shown together.

(Measurement of Dissolution Rate)

A composition obtained by dissolving only each of Resins (A-1) to (A-12) in butyl acetate to have a total solid content concentration of 3.5 mass % was applied on a quartz substrate and baked at 100° C. for 60 seconds to form a resin film, and the resulting resin film having a film thickness of 300 nm was dipped in butyl acetate for 100 seconds. The average dissolution rate (nm/sec) was calculated from the time until the film was completely dissolved. The measurement was performed at room temperature (25° C.) by using QCM.

(A-1)

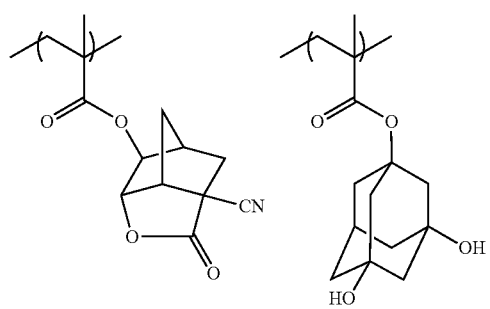

(A-2)

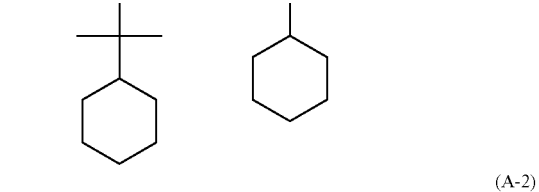

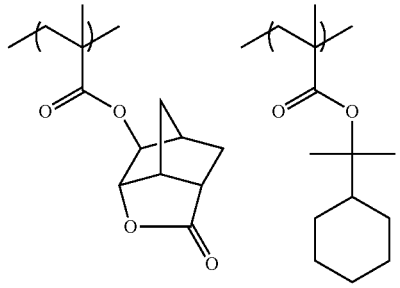

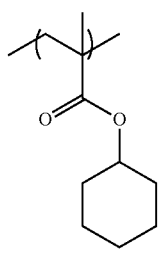

(A-3)

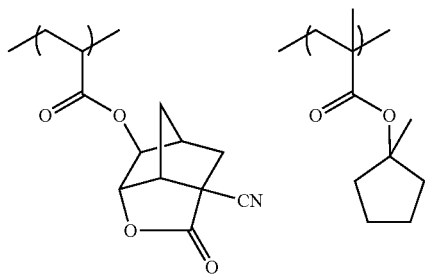

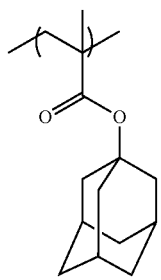

(A-4)

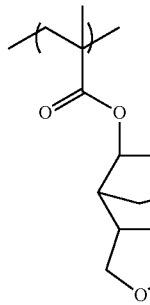

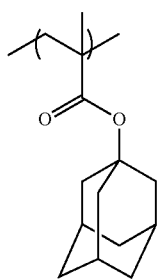
(A-5)
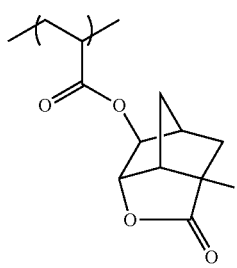
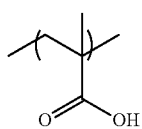
(A-6)
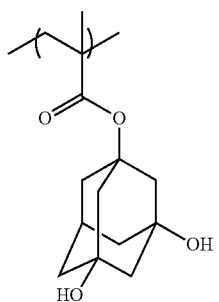
(A-7)
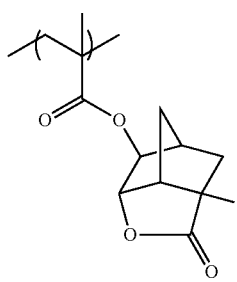
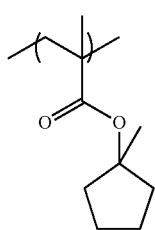
(A-8)
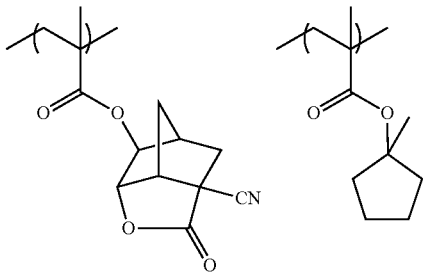
(A-9)
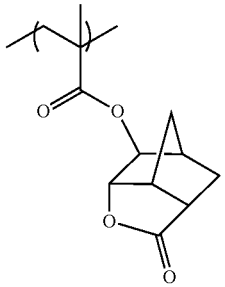
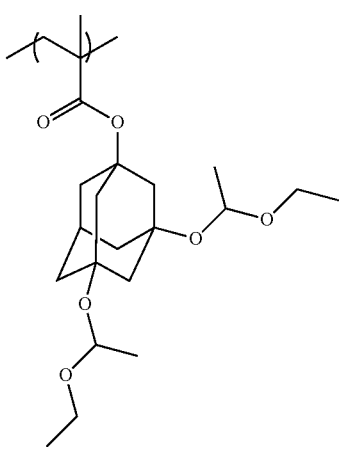
(A-10)
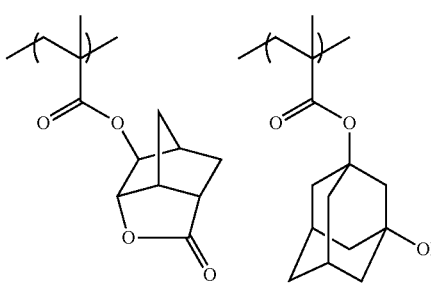
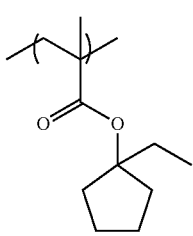

-continued

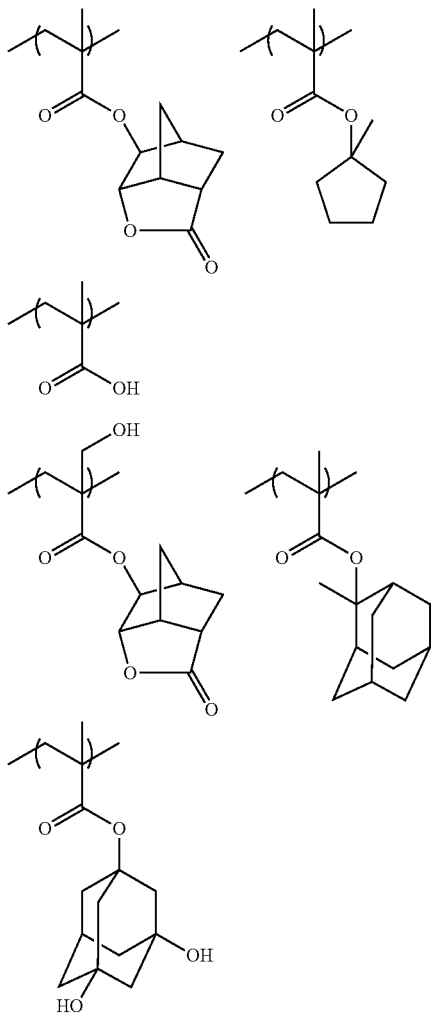

TABLE 1

| Resin (A) | Composition | Weight Average Molecular Weight Mw | Polydispersity Mw/Mn | Dissolution Rate [nm/s] |
|---|---|---|---|---|
| (A-1) | 30/10/50/10 | 10200 | 1.7 | 35 |
| (A-2) | 30/60/10 | 9800 | 1.6 | 154 |
| (A-3) | 40/40/20 | 10500 | 1.6 | 243 |
| (A-4) | 40/50/10 | 7600 | 1.7 | 72 |
| (A-5) | 20/70/10 | 11400 | 1.6 | 316 |
| (A-6) | 10/90 | 8700 | 1.8 | 51 |
| (A-7) | 40/20/40 | 9600 | 1.6 | 41 |
| (A-8) | 60/40 | 10300 | 1.7 | 45 |
| (A-9) | 40/60 | 11500 | 1.7 | 54 |
| (A-10) | 45/10/45 | 13200 | 1.6 | 21 |
| (A-11) | 40/40/20 | 16200 | 1.7 | 18 |
| (A-12) | 40/30/30 | 12400 | 1.6 | 9 |

Synthesis Example 2

Synthesis of Acid Generator (PAG-2)

Acid Generator (PAG-2) was synthesized in accordance with the description in paragraphs [0382] to [0385] of WO2008/153110A1.

Photoacid Generators (PAG-1) and (PAG-3) to (PAG-5) having the following structures were synthesized in the same manner.

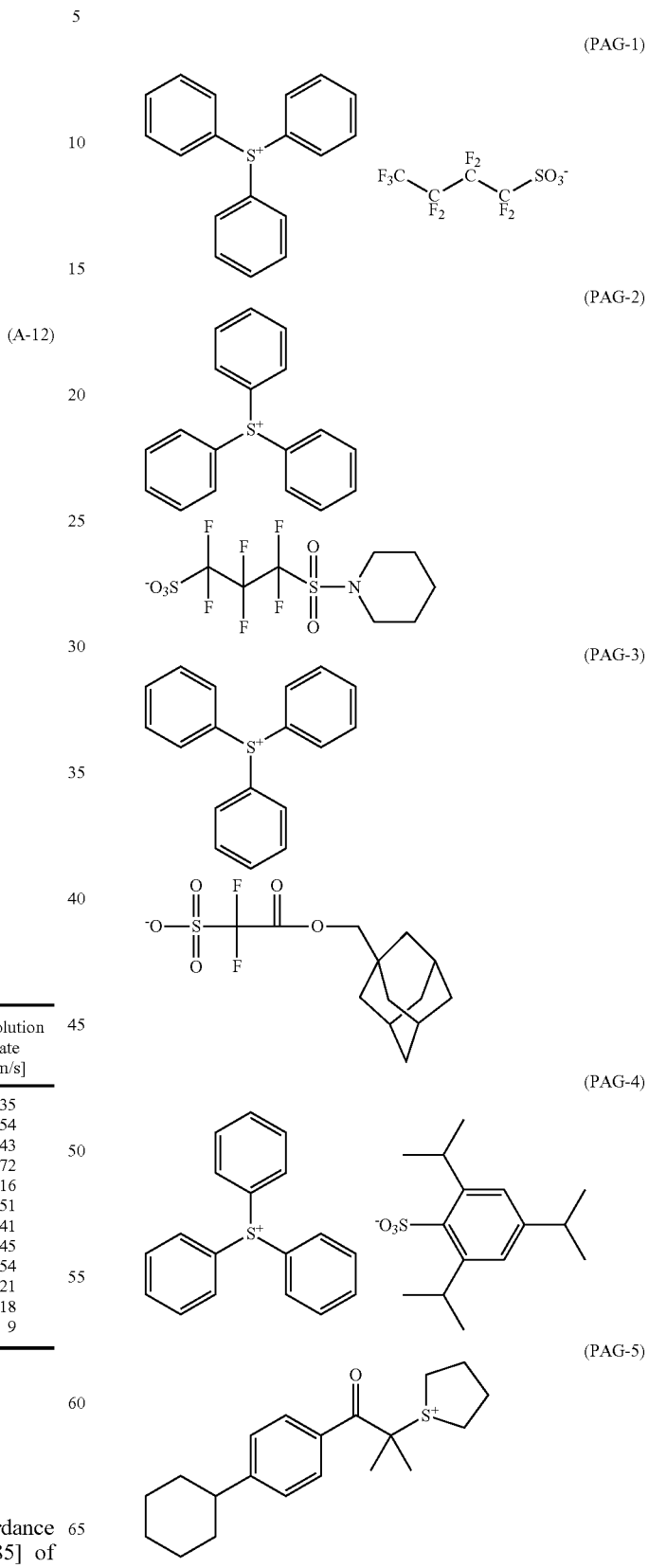

-continued

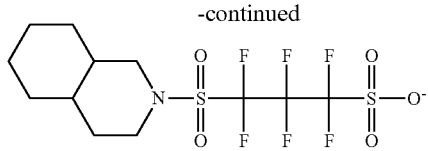

<Preparation of Resist Composition>

The components shown in Table 2 below were dissolved in the solvent shown in Table 2, and the resulting solution was filtered through a polyethylene filter having a pore size of 0.03 μm to prepare Resist Compositions Ar-1 to Ar-13. In Table 2, the amount added is mass % based on the entire mass of the composition.

The obtained resist film was patternwise exposed through an exposure mask (a binary mask with line/space=500 nm/100 nm) by using an ArF excimer laser scanner (PAS5500/1100, manufactured by ASML, NA: 0.75, Dipole, outer sigma: 0.89, inner sigma: 0.65). Thereafter, the film was baked (Post-Exposure Baking; PEB) under the temperature condition shown in Table 3 below for 60 seconds, developed with the developer shown in Tale 3 for 30 seconds, rinsed with the rinsing solution shown in Table 3 for 30 seconds, and after spinning the substrate at a rotational speed of 4,000 rpm for 30 seconds, baked at 90° C. for 60 seconds to obtain a resist pattern with a space width of 100 nm and a line width of 500 nm.

In the obtained resist pattern, the degree of the scum on the substrate in the space part (the resist film remaining undis-

TABLE 2

| Composition | Resin (A) Kind | Resin (A) Amount Added (mass %) | Acid Generator (B) Kind | Acid Generator (B) Amount Added (mass %) | Basic Compound (D) Kind | Basic Compound (D) Amount Added (mass %) | Surfactant (E) Kind | Surfactant (E) Amount Added (mass %) | Solvent (C) Kind | Solvent (C) Mass Ratio |
|---|---|---|---|---|---|---|---|---|---|---|
| Ar-1 | (A-1) | 8.3 | (PAG-1) | 0.5 | TPI | 0.1 | W-4 | 0.05 | A1/B1 | 60/40 |
| Ar-2 | (A-2) | 8.6 | (PAG-2) | 0.5 | DPA/TPI | 0.05/0.05 | W-1 | 0.05 | A1 | 100 |
| Ar-3 | (A-3) | 8.0 | (PAG-5) | 1.3 | PEA | 0.1 | W-3 | 0.05 | A1/A2 | 90/10 |
| Ar-4 | (A-4)/(A-6) | 5.2/3.3 | (PAG-1) | 0.4 | — | — | W-4 | 0.05 | A1/B1 | 70/30 |
| Ar-5 | (A-5) | 8.1 | (PAG-3) | 0.6 | N-1 | 0.1 | W-2 | 0.05 | A1/A3 | 80/20 |
| Ar-6 | (A-6) | 8.5 | (PAG-3) | 0.5 | TPI | 0.1 | W-4 | 0.05 | A1/B2 | 80/20 |
| Ar-7 | (A-4) | 8.0 | (PAG-2)/(PAG-1) | 0.3/0.3 | DPA | 0.1 | — | — | A1/A2 | 90/10 |
| Ar-8 | (A-7) | 8.3 | (PAG-1) | 0.5 | PBI | 0.1 | W-1 | 0.05 | A1/A2 | 80/20 |
| Ar-9 | (A-8) | 8.0 | (PAG-1) | 0.5 | PBI | 0.1 | W-1 | 0.05 | A1/A2 | 80/20 |
| Ar-10 | (A-9) | 8.3 | (PAG-4) | 0.6 | DPA | 0.1 | W-4 | 0.05 | A1/B1 | 70/30 |
| Ar-11 | (A-10) | 8.3 | (PAG-1) | 0.5 | N-1 | 0.1 | W-2 | 0.05 | A1/A2 | 80/20 |
| Ar-12 | (A-11) | 8.6 | (PAG-3) | 0.6 | PBI | 0.1 | W-1 | 0.05 | A1/A2 | 90/10 |
| Ar-13 | (A-12) | 8.5 | (PAG-4) | 0.7 | N-1 | 0.1 | W-2 | 0.05 | A1/B1 | 70/30 |

Abbreviations in Table 2 are as follows.
<Basic Compound>
TPI: 2,4,5-Triphenylimidazole
PEA: N-Phenyldiethanolamine
DPA: 2,6-Diisopropylaniline
PBI: 2-Phenylbenzimidazole
N-1: 1,5-Diazabicyclo[4,3,0]non-5-ene
<Surfactant>
W-1: Megaface F176 (produced by DIC Corporation) (fluorine-containing)
W-2: Megaface R08 (produced by DIC Corporation) (fluorine- and silicon-containing)
W-3: Polysiloxane Polymer KP-341 (produced by Shin-Etsu Chemical Co., Ltd.) (silicon-containing)
W-4: PolyFox ™ PF6320 (produced by OMNOVA solution inc.) (fluorine-containing) (compound having the structure shown below)

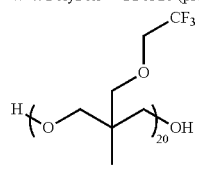

<Solvent>
A1: Propylene glycol monomethyl ether acetate (PGMEA)
A2: γ-Butyrolactone
A3: Cyclohexanone
B1: Propylene glycol monomethyl ether (PGME)
B2: Ethyl lactate Using the resist composition prepared, a resist pattern was formed by the following method and evaluated.

Examples 1 to 13 and Comparative Example 1

<Evaluation Method>
[Removability]

The prepared resist composition was applied on a hexamethyldisilazane (HMDS)-treated silicon substrate by using a spin coater and baked (Pre-Baking; PB) under the temperature condition shown in Table 3 below for 60 seconds to form a resist film having a film thickness of 300 nm.

solved in the space part) was measured by taking 50 shots of critical-dimension photography at a magnification of 150 k by using a Critical Dimension SEM apparatus, S-9380II (manufactured by Hitachi High Technologies), and the total number of scums in 50 shots of the critical-dimension photography taken was rated on the following 4-grade scale, thereby evaluating the removability of the resist film. In practice, rating of B or higher is demanded.

AA: from 0 to 5
A: from 6 to 10
B: from 11 to 15
C: 16 or more

[Scum Defect]

The prepared resist composition was applied on a hexamethyldisilazane (HMDS)-treated silicon substrate by using a spin coater and baked (Pre-Baking; PB) under the temperature condition shown in Table 3 below for 60 seconds to form a resist film having a film thickness of 300 nm.

The obtained resist film was patternwise exposed through an exposure mask (a binary mask with line/space=140 nm/140 nm) by using an ArF excimer laser scanner (PAS5500/1100, manufactured by ASML, NA: 0.75, Dipole, outer sigma: 0.89, inner sigma: 0.65). Thereafter, the film was baked (Post-Exposure Baking; PEB) under the temperature condition shown in Table 3 below for 60 seconds, developed with the developer shown in Tale 3 for 30 seconds, rinsed with the rinsing solution shown in Table 3 for 30 seconds, and after spinning the substrate at a rotational speed of 4,000 rpm for 30 seconds, baked at 90° C. for 60 seconds to obtain a 1:1 line-and-space resist pattern with a line width of 140 nm.

Incidentally, as for the exposure dose and the focus, the exposure was performed with an optimal exposure dose and an optimal focus to form a 1:1 line-and-space resist pattern having a line width of 140 nm. Also, in Comparative Examples 1 to 4, a 1:1 line-and-space resist pattern with a line width of 140 nm could not be formed and therefore, the scum defect was evaluated on the line-and-space resist pattern in [Resolution] later.

In the obtained line-and-space pattern, the scum defect was detected using a defect inspector, UVision (trade name), manufactured by Applied Materials under the conditions of a pixel size of 120 nm, a polarization of light source of Horizontal, and an inspection mode of Gray Field. The number of scum defects per unit area (defects/cm$^2$) was calculated and rated on the following 4-grade scale. In practice, rating of B or higher is demanded.

AA: from 0 to 50
A: from 51 to 100
B: from 101 to 200
C: 201 or more

[Resolution]

The minimum line width of the line-and-space pattern (1:1) resolved with the optimal exposure dose above (the minimum line width when the line and the space were separated and resolved) was taken as the resolution. A smaller value indicates higher performance. In Comparative Examples 1 to 4, a 1:1 line-and-space resist pattern having a line width of 140 nm could not be formed and therefore, the minimum line width when the line and space were separated and resolved (minimum line width of the line-and-space pattern (1:1)) was taken as the resolution.

TABLE 3

| Film Thickness 300 nm | Composition Resist | Process | | | | | Results | | |
| --- | --- | --- | --- | --- | --- | --- | --- | --- | --- |
| | | Developer | Rinsing Solution | PB (° C.) | PEB (° C.) | Removability | Scum Defect | Resolution (nm) | |
| Example 1 | Ar-1 | butyl acetate | 4-methyl-2-pentanol | 100 | 105 | B | B | 140 | |
| Example 2 | Ar-2 | isopentyl acetate | decane | 110 | 110 | AA | AA | 120 | |
| Example 3 | Ar-3 | butyl acetate | — | 95 | 100 | AA | AA | 120 | |
| Example 4 | Ar-4 | pentyl acetate | 1-octanol | 80 | 100 | AA | A | 130 | |
| Example 5 | Ar-5 | butyl acetate | 1-octanol | 105 | 105 | AA | AA | 120 | |
| Example 6 | Ar-6 | isopentyl acetate | 4-methyl-2-pentanol | 100 | 110 | A | A | 130 | |
| Example 7 | Ar-7 | anisole | 4-methyl-2-pentanol | 120 | 100 | A | A | 120 | |
| Example 8 | Ar-8 | pentyl acetate | 4-methyl-2-pentanol | 100 | 110 | A | A | 130 | |
| Example 9 | Ar-9 | butyl acetate | 4-methyl-2-pentanol | 90 | 105 | A | A | 130 | |
| Example 10 | Ar-10 | butyl acetate | — | 100 | 120 | B | A | 120 | |
| Example 11 | Ar-11 | butyl acetate | — | 100 | 110 | B | B | 130 | |
| Example 12 | Ar-12 | pentyl acetate | 4-methyl-2-pentanol | 95 | 100 | B | B | 120 | |
| Example 13 | Ar-13 | butyl acetate | 4-methyl-2-pentanol | 100 | 120 | B | B | 140 | |
| Comparative Example 1 | Ar-1 | TMAH | pure water | 95 | 100 | C | C | 150 | |

TMAH: An aqueous 2.38 mass % tetramethylammonium hydroxide solution

Also, all of the resist patterns obtained in Examples 1 to 13 had a good pattern profile.

As seen from Table 3, in Examples where a resist film having a film thickness of 200 nm or more (specifically, a resist film having a film thickness of 300 nm) was developed with an organic solvent-containing developer, the removability and resolution of the resist film were excellent and good results were obtained in terms of the scum defect, compared with Comparative Example 1 where the resist film was developed with an aqueous alkali developer of 2.38 mass % TMAH (aqueous tetramethylammonium hydroxide solution).

Examples 14 to 26 and Comparative Example 2

Using the prepared resist compositions, resist patterns were formed in the same manner as in Examples 1 to 13 and Comparative Example 1 except for changing the film thickness of the resist film to 200 nm and employing the process conditions shown in Table 4 below, and evaluated for removability, scum defect and resolution. The results are shown in Table 4.

TABLE 4

| Film Thickness 200 nm | Composition Resist | Process | | | | | Results | | |
| --- | --- | --- | --- | --- | --- | --- | --- | --- | --- |
| | | Developer | Rinsing Solution | PB (° C.) | PEB (° C.) | Removability | Scum Defect | Resolution (nm) | |
| Example 14 | Ar-1 | butyl acetate | 4-methyl-2-pentanol | 90 | 110 | AA | AA | 120 | |
| Example 15 | Ar-2 | isopentyl acetate | — | 100 | 105 | AA | AA | 120 | |

TABLE 4-continued

| Film Thickness 200 nm | Composition Resist | Developer | Rinsing Solution | PB (° C.) | PEB (° C.) | Removability | Scum Defect | Resolution (nm) |
|---|---|---|---|---|---|---|---|---|
| Example 16 | Ar-3 | butyl acetate | — | 95 | 100 | AA | AA | 110 |
| Example 17 | Ar-4 | pentyl acetate | — | 90 | 110 | AA | AA | 130 |
| Example 18 | Ar-5 | butyl acetate | 1-octanol | 100 | 115 | AA | AA | 110 |
| Example 19 | Ar-6 | isopentyl acetate | 4-methyl-2-pentanol | 95 | 120 | AA | AA | 120 |
| Example 20 | Ar-7 | butyl acetate | — | 105 | 105 | AA | AA | 110 |
| Example 21 | Ar-8 | pentyl acetate | 4-methyl-2-pentanol | 110 | 100 | AA | AA | 130 |
| Example 22 | Ar-9 | isopentyl acetate | 4-methyl-2-pentanol | 95 | 100 | AA | AA | 120 |
| Example 23 | Ar-10 | butyl acetate | 4-methyl-2-pentanol | 100 | 115 | AA | AA | 120 |
| Example 24 | Ar-11 | butyl acetate | decane | 110 | 115 | AA | AA | 120 |
| Example 25 | Ar-12 | Anisole | 4-methyl-2-pentanol | 100 | 110 | AA | AA | 120 |
| Example 26 | Ar-13 | isopentyl acetate | — | 95 | 100 | A | A | 130 |
| Comparative Example 2 | Ar-1 | TMAH | pure water | 95 | 105 | C | C | 150 |

TMAH: An aqueous 2.38 mass % tetramethylammonium hydroxide solution

Also, all of the resist patterns obtained in Examples 14 to 26 had a good pattern profile.

As seen from Table 4, also in Examples where a resist film having a film thickness of 200 nm was developed with an organic solvent-containing developer, the removability and resolution of the resist film were excellent and good results were obtained in terms of the scum defect, compared with Comparative Example 2 where the resist film was developed with an aqueous alkali developer of 2.38 mass % TMAH (aqueous tetramethylammonium hydroxide solution).

Furthermore, when developing a resist film having a film thickness of 200 nm with an organic solvent-containing developer, the resist film was excellent in terms of removability, scum defect and resolution particularly in Examples 14 to 25 using Resist Compositions Ar-1 to Ar-12 containing any one of Resins (A-1) to (A-11) having a property that the dissolution rate of the film formed of the resin (A) for butyl acetate at 25° C. is 18 nm/sec or more.

Examples 27 to 35 and Comparative Example 3

Formation and Evaluation of Resist Pattern on Stepped Substrate

Using the prepared resist compositions, resist patterns were formed in the same manner as in Examples 1 to 13 and Comparative Example 1 except for applying the resist composition on a substrate having steps where a space of 100 nm, a pitch of 500 nm and a height of 100 nm are repeated at regular intervals (manufactured by Advanced Materials Technology), thereby forming a film having a film thickness of 300 nm, and employing the process conditions shown in Table 5 below, and evaluated for removability, scum defect and resolution. The results are shown in Table 5. Incidentally, the film thickness of the formed film is the height from the bottom of the step (that is, the bottom on the stepped substrate) to the resist film surface (that is, the top of the film).

TABLE 5

| Film Thickness 300 nm | Composition Resist | Developer | Rinsing Solution | PB (° C.) | PEB (° C.) | Removability | Scum Defect | Resolution (nm) |
|---|---|---|---|---|---|---|---|---|
| Example 27 | Ar-1 | isopentyl acetate | — | 100 | 105 | AA | AA | 140 |
| Example 28 | Ar-2 | isopentyl acetate | decane | 110 | 110 | AA | AA | 130 |
| Example 29 | Ar-3 | butyl acetate | — | 95 | 100 | AA | AA | 130 |
| Example 30 | Ar-4 | pentyl acetate | 1-octanol | 80 | 100 | AA | AA | 130 |
| Example 31 | Ar-5 | butyl acetate | 1-octanol | 105 | 105 | AA | AA | 120 |
| Example 32 | Ar-6 | butyl acetate | 4-methyl-2-pentanol | 100 | 110 | AA | AA | 130 |
| Example 33 | Ar-11 | isopentyl acetate | — | 100 | 110 | A | A | 130 |
| Example 34 | Ar-12 | butyl acetate | 4-methyl-2-pentanol | 95 | 100 | A | B | 140 |
| Example 35 | Ar-13 | butyl acetate | 4-methyl-2-pentanol | 110 | 110 | A | B | 140 |
| Comparative Example 3 | Ar-1 | TMAH | pure water | 100 | 95 | C | C | 160 |

TMAH: An aqueous 2.38 mass % tetramethylammonium hydroxide solution

Also, all of the resist patterns obtained in Examples 27 to 35 had a good pattern profile.

As seen from Table 5, in Examples where a resist film having a film thickness of 200 nm or more (specifically, a resist film having a film thickness of 300 nm) on a stepped substrate was developed with an organic solvent-containing developer, the removability and resolution of the resist film were excellent and good results were obtained in terms of the scum defect, compared with Comparative Example 3 where the resist film was developed with an aqueous alkali developer of 2.38 mass % TMAH (aqueous tetramethylammonium hydroxide solution).

Furthermore, when developing a resist film having a film thickness of 300 nm with an organic solvent-containing developer, the resist film was excellent in terms of removability, scum defect and resolution particularly in Examples 27 to 32 using Resist Compositions Ar-1 to Ar-6 containing any one of Resins (A-1) to (A-6) having a property that the dissolution rate of the film formed of the resin (A) for butyl acetate at 25° C. is 30 nm/sec or more.

Examples 36 to 44 and Comparative Example 4

Formation and Evaluation of Resist Pattern on Stepped Substrate

Using the prepared resist compositions, resist patterns were formed in the same manner as in Examples 1 to 13 and Comparative Example 1 except for applying the resist composition on a substrate having steps where a space of 100 nm, a pitch of 500 nm and a height of 100 nm are repeated at regular intervals (manufactured by Advanced Materials Technology), thereby forming a film having a film thickness of 200 nm, and employing the process conditions shown in Table 6 below, and evaluated for removability, scum defect and resolution. The results are shown in Table 6. Incidentally, the film thickness of the formed film is the height from the bottom of the step (that is, the bottom on the stepped substrate) to the resist film surface (that is, the top of the film).

TABLE 6

| Film Thickness 200 nm | Composition Resist | Process | | PB (° C.) | PEB (° C.) | Results | | |
|---|---|---|---|---|---|---|---|---|
| | | Developer | Rinsing Solution | | | Removability | Scum Defect | Resolution (nm) |
| Example 36 | Ar-1 | butyl acetate | 4-methyl-2-pentanol | 90 | 110 | AA | AA | 120 |
| Example 37 | Ar-2 | isopentyl acetate | — | 100 | 105 | AA | AA | 110 |
| Example 38 | Ar-3 | butyl acetate | 4-methyl-2-pentanol | 95 | 100 | AA | AA | 120 |
| Example 39 | Ar-4 | pentyl acetate | — | 90 | 110 | AA | AA | 120 |
| Example 40 | Ar-5 | butyl acetate | 1-octanol | 100 | 115 | AA | AA | 110 |
| Example 41 | Ar-6 | isopentyl acetate | 4-methyl-2-pentanol | 95 | 120 | AA | AA | 110 |
| Example 42 | Ar-11 | butyl acetate | decane | 110 | 115 | AA | AA | 120 |
| Example 43 | Ar-12 | anisole | 4-methyl-2-pentanol | 100 | 110 | AA | AA | 120 |
| Example 44 | Ar-13 | isopentyl acetate | — | 100 | 115 | A | A | 130 |
| Comparative Example 4 | Ar-1 | TMAH | pure water | 95 | 100 | C | C | 150 |

TMAH: An aqueous 2.38 mass % tetramethylammonium hydroxide solution

Also, all of the resist patterns obtained in Examples 36 to 44 had a good pattern profile.

As seen from Table 6, also in Examples where a resist film having a film thickness of 200 nm formed on a stepped substrate was developed with an organic solvent-containing developer, the removability and resolution of the resist film were excellent and good results were obtained in terms of the scum defect, compared with Comparative Example 4 where the resist film was developed with an aqueous alkali developer of 2.38 mass % TMAH (aqueous tetramethylammonium hydroxide solution).

Furthermore, when developing a resist film having a film thickness of 200 nm with an organic solvent-containing developer, the resist film was excellent in terms of removability, scum defect and resolution particularly in Examples 36 to 43 using Resist Compositions Ar-1 to Ar-6, Ar-11 and Ar-12 containing any one of Resins (A-1) to (A-6), (A-10) and (A-11) having a property that the dissolution rate of the film formed of the resin (A) for butyl acetate at 25° C. is 18 nm/sec or more.

INDUSTRIAL APPLICABILITY

According to the present invention, a negative pattern forming method comprising forming a film with a film thickness of 200 nm or more from a chemical amplification resist composition, and exposing and developing the film, wherein the removability of the film is improved to reduce scum generated on the substrate after development and at the same time, an excellent performance is exhibited in terms of scum defect reduction and resolution; and a resist pattern formed by the negative pattern forming method, can be provided.

This application is based on Japanese patent application Nos. JP 2010-267888 filed on Nov. 30, 2010 and JP 2011-243961 filed on Nov. 7, 2011, the entire contents of which are hereby incorporated by reference, the same as if set forth at length.

The invention claimed is:

1. A negative pattern forming method, comprising:
   (i) forming a film having a film thickness of 200 nm or more from a chemical amplification resist composition containing (A) a resin capable of increasing a polarity of the resin (A) by an action of an acid to decrease a solubility of the resin (A) for a developer containing one or more organic solvents, (B) a compound capable of generating an acid upon irradiation with an actinic ray or radiation, and (C) a solvent;
   (ii) exposing the film, so as to form an exposed film; and
   (iii) developing the exposed film with a developer containing one or more organic solvents,
   wherein:
   the film formed from the chemical amplification resist composition is formed on a substrate not coated with a bottom anti-reflection coating;
   the substrate not coated with a bottom anti-reflection coating is a stepped substrate having a step of 10 nm or more in height;
   a step in the stepped substrate has a space of 20 nm to 200 nm; and
   the dissolution rate of the film formed of the resin (A) for butyl acetate at 25° C. is 25 nm/sec or more.

2. The negative pattern forming method according to claim 1, wherein the resin (A) contains a repeating unit having a group capable of decomposing by an action of an acid to produce a polar group, in an amount of 40 mol% or more based on all repeating units in the resin (A).

3. The negative pattern forming method according to claim 1, wherein the resin (A) has a weight average molecular weight of 5,000 or more.

4. The negative pattern forming method according to claim 1, wherein the developer containing one or more organic solvents contains at least one kind of an organic solvent selected from the group consisting of a ketone-based solvent, an ester-based solvent, an alcohol-based solvent, an amide-based solvent and an ether-based solvent.

5. The negative pattern forming method according to claim 1, further comprising: (iv) performing rinsing by using a rinsing solution containing one or more organic solvents.

6. The negative pattern forming method according to claim 1, wherein the
exposing of the film in the step (ii) is exposure to an ArF excimer laser.

7. The negative pattern forming method according to claim 1,
wherein the film thickness of the film formed from the chemical amplification resist composition is 600 nm or less.

8. The negative pattern forming method according to claim 1, wherein the film thickness is 250 nm or more.

9. A manufacturing method of an electronic device, comprising: the negative pattern forming method claimed in claim 1.

* * * * *